(12) United States Patent
Chun et al.

(10) Patent No.: US 9,496,515 B2
(45) Date of Patent: Nov. 15, 2016

(54) ORGANIC LIGHT EMITTING DIODE

(71) Applicant: Samsung Display Co., Ltd., Yongin, Gyeonggi-Do (KR)

(72) Inventors: Byung-Hoon Chun, Yongin (KR); Ja-Hyun Im, Yongin (KR); Sung-Jun Bae, Yongin (KR); Seong-Jong Kang, Yongin (KR); Kwan-Hee Lee, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 502 days.

(21) Appl. No.: 14/134,490

(22) Filed: Dec. 19, 2013

(65) Prior Publication Data
US 2014/0209874 A1 Jul. 31, 2014

(30) Foreign Application Priority Data

Jan. 30, 2013 (KR) ........................ 10-2013-0010715

(51) Int. Cl.
*H01L 51/50* (2006.01)
*H01L 51/00* (2006.01)
*H01L 27/32* (2006.01)

(52) U.S. Cl.
CPC ......... *H01L 51/5072* (2013.01); *H01L 51/006* (2013.01); *H01L 51/0052* (2013.01); *H01L 51/0055* (2013.01); *H01L 51/0058* (2013.01); *H01L 51/0059* (2013.01); *H01L 51/0061* (2013.01); *H01L 51/0067* (2013.01); *H01L 51/0069* (2013.01); *H01L 51/0072* (2013.01); *H01L 27/3211* (2013.01); *H01L 51/5056* (2013.01)

(58) Field of Classification Search
CPC .................................................. H01L 51/0071
USPC ........................................................ 428/690
See application file for complete search history.

(56) References Cited

U.S. PATENT DOCUMENTS

| 7,547,462 | B2 * | 6/2009 | Kim ................... H01L 27/3211 313/504 |
| 7,994,712 | B2 * | 8/2011 | Sung .................. H01L 27/3213 313/504 |
| 2010/0301312 | A1 | 12/2010 | Jinde et al. |
| 2011/0084259 | A1 | 4/2011 | Lee et al. |
| 2011/0156013 | A1 | 6/2011 | Kim et al. |
| 2012/0091438 | A1 | 4/2012 | Yabunouchi et al. |

FOREIGN PATENT DOCUMENTS

| KR | 10-2010-0106415 A | 10/2010 |
| KR | 10-2011-0040735 A | 4/2011 |
| KR | 10-2011-0076488 A | 7/2011 |
| KR | 10-2012-0022861 A | 3/2012 |

* cited by examiner

*Primary Examiner* — Doris Lee
(74) *Attorney, Agent, or Firm* — Robert E. Bushnell, Esq.

(57) ABSTRACT

Provided is an organic light emitting diode that is highly efficient and has a long lifespan. The organic light emitting diode includes a carbazole-based compound for improving light emission efficiency. In certain embodiments an electron transport layer can include an anthraces-based compound. The organic light emitting diode may be included in a flat display diode including a thin film transistor (TFT).

20 Claims, 2 Drawing Sheets

ORGANIC LIGHT EMITTING DIODE

CLAIM OF PRIORITY

This application makes reference to, incorporates the same herein, and claims all benefits accruing under 35 U.S.C. §119 from an application for ORGANIC LIGHT EMITTING DIODE, earlier filed in the Korean Intellectual Property Office on Jan. 30, 2013 and there duly assigned Serial No. 10-2013-0010715.

BACKGROUND OF THE INVENTION

Field of the Invention

One or more embodiments of the present invention relates to an organic light emitting diode and a method of preparing the same.

Description of the Related Art

Organic light-emitting diodes (OLEDs), which are self-emitting diodes, have advantages such as wide viewing angles, excellent contrast, quick response, high brightness, excellent driving voltage properties, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure is referred to herein.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

SUMMARY OF THE INVENTION

One or more embodiments include a high-performance organic light emitting diode having a long lifespan.

One or more embodiments include an organic light emitting diode including a substrate including a first subpixel, a second subpixel, and a third subpixel;

a plurality of first electrodes separately formed in the first subpixel, the second subpixel, and the third subpixel;

a second electrode disposed opposite to the first electrode;

an emission layer disposed between the first electrodes and the second electrode and comprising a first emission layer disposed between the first electrode in the first subpixel and the second electrode and emitting a first colored light, a second emission layer disposed between the first electrode in the second subpixel and the second electrode and emitting a second colored light, and a third emission layer disposed between the first electrode in the third subpixel and the second electrode and emitting a third colored light;

a hole transport layer disposed between the first electrode and the emission layer;

an electron transport layer disposed between the emission layer and the second electrode; and a layer for improving third colored light efficiency disposed between the third emission layer and the hole transport layer;

wherein, the first colored light is a red light, the second colored light is a green light, and the third colored light is a blue light, wherein the layer for improving third colored light efficiency includes a carbazole-based compound represented by Formula 1 below;

wherein, the electron transport layer includes an electron transport material represented by one of Formulas 10A, 10B, 10C, and 20A:

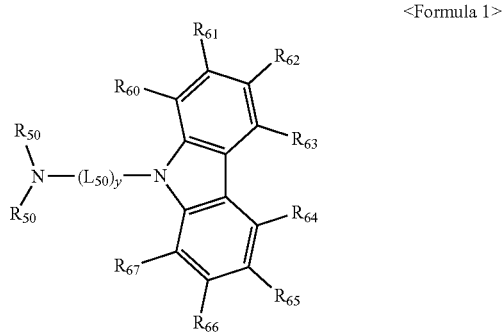
<Formula 1>

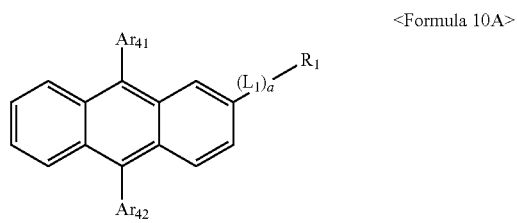
<Formula 10A>

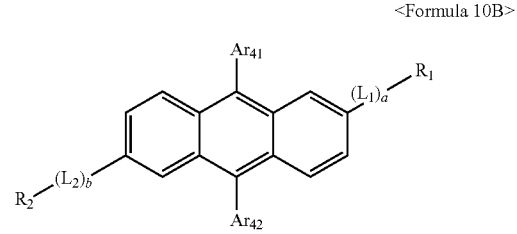
<Formula 10B>

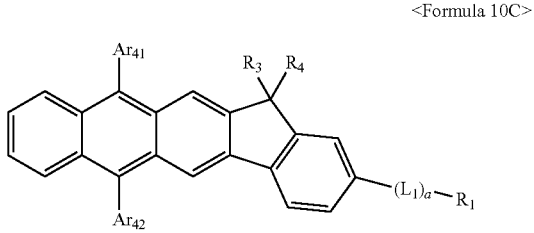
<Formula 10C>

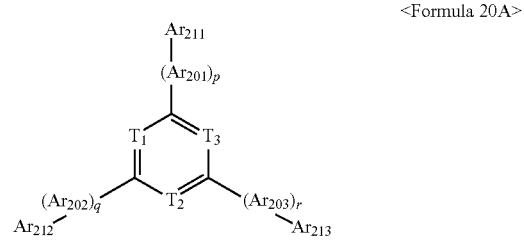
<Formula 20A> wherein, in Formula 1, $L_{50}$ may be a substituted or unsubstituted $C_6$-$C_{60}$ arylene group or a substituted or unsubstituted $C_2$-$C_{60}$ heteroarylene group;

y may be an integer of 1 to 5;

$R_{50}$ and $R_{51}$ may be each independently, a substituted or unsubstituted $C_6$-$C_{60}$ aryl group, or a substituted or unsubstituted $C_2$-$C_{60}$ heteroaryl group;

$R_{60}$ to $R_{67}$ may be each independently, a hydrogen atom, a deuterium atom, a halogen atom, a hydroxyl group, a cyano group, a nitro group, an amino group, an amidino group, hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group;

in Formulae 10A to 10C, $Ar_{41}$ and $Ar_{42}$ may be each independently, a substituted or unsubstituted $C_6$-$C_{60}$ aryl group or a substituted or unsubstituted $C_2$-$C_{60}$ heteroaryl group;

$L_1$ and $L_2$ may be each independently, a substituted or unsubstituted $C_6$-$C_{60}$ arylene group or a substituted or unsubstituted $C_2$-$C_{60}$ heteroarylene group;

a and b may be each independently, 0, 1 or 2;

$R_1$ and $R_2$ may be each independently, a substituted or unsubstituted benzimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group or a substituted or unsubstituted phenanthrenyl group;

$R_3$ and $R_4$ may be each independently, a $C_1$-$C_{20}$ alkyl group and a $C_6$-$C_{20}$ aryl group; and $C_1$-$C_{20}$ alkyl group and $C_2$-$C_{20}$ aryl group, substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof, and a phosphoric acid group or a salt thereof;

and in Formula 20A, $T_1$ to $T_3$ may be each independently, N or $C(R_{100})$, wherein $R_{100}$ is a hydrogen atom, a deuterium atom, —F, —Cl, —Br, —I, —CN, a hydroxyl group, —$NO_2$, an amino group, an amidino group, a hydrazine group, a hydrazone, a carboxyl group or a salt thereof, a sulfonic acid group or a salt thereof, a phosphoric acid group or a salt thereof, a $C_1$-$C_{60}$ alkyl group and a $C_1$-$C_{60}$ alkoxy group; and a $C_1$-$C_{60}$ alkyl group and a $C_1$-$C_{60}$ alkoxy group, substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof, and a phosphoric acid group or a salt thereof;

$Ar_{201}$ to $Ar_{203}$ may be each independently, a substituted or unsubstituted $C_6$-$C_{60}$ arylene group or a substituted or unsubstituted $C_2$-$C_{60}$ heteroarylene group;

p, q and r may be each independently, 0, 1 or 2;

$Ar_{211}$ to $Ar_{213}$ may be each independently, a substituted or unsubstituted $C_6$-$C_{60}$ aryl group or a substituted or unsubstituted $C_2$-$C_{60}$ heteroaryl group.

The organic light emitting diode may have high-performance and a long lifespan.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

As used herein, the term "and/or" includes any and all combinations of one or more of the associated listed items. Expressions such as "at least one of," when preceding a list of elements, modify the entire list of elements and do not modify the individual elements of the list.

Figure 1:
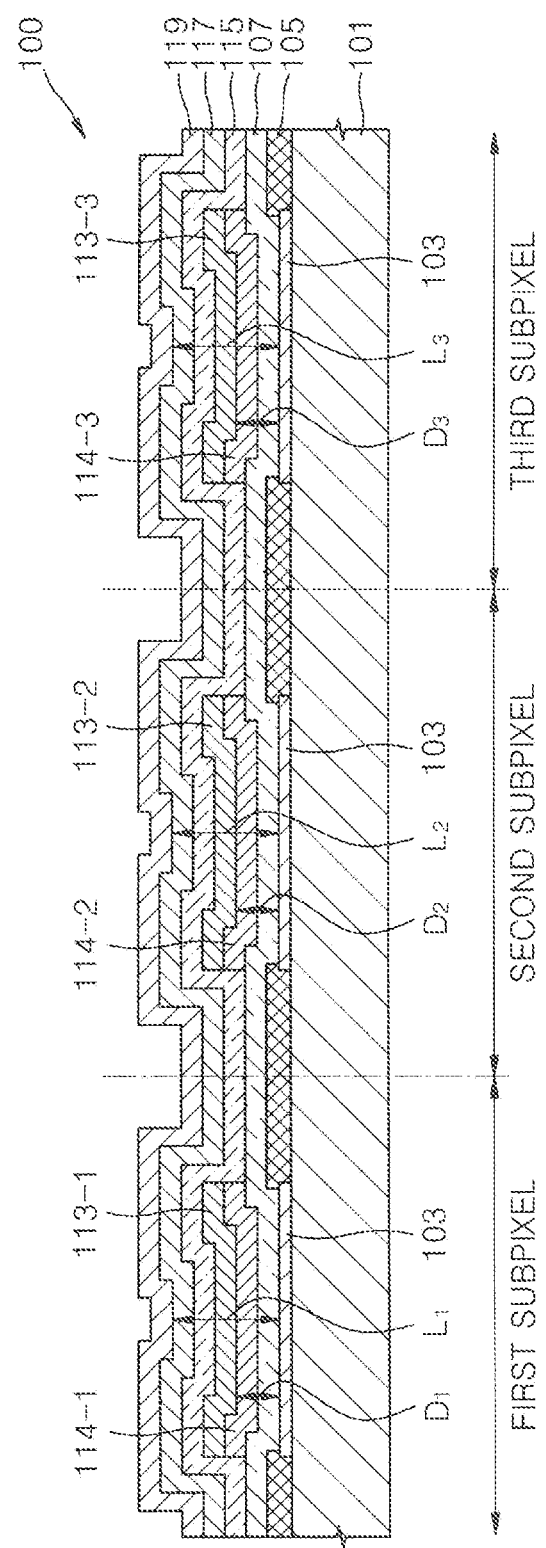
FIG. 1 schematically illustrates an organic light emitting diode according to an embodiment.

FIG. 1 schematically illustrates an organic light emitting diode according to an embodiment. Hereinafter, a structure and a method of manufacturing the organic light emitting diode according to an embodiment of the present invention will be described with reference to FIG. 1.

A substrate 101 of an organic light emitting diode 100 of FIG. 1 includes a first subpixel, a second subpixel, and a third subpixel.

A plurality of first electrodes 103 are disposed as separate patterns in the first subpixel, the second subpixel, and the third subpixel. A hole transport layer 107 as a common layer is formed on the first electrodes 103.

An emission layer including a first emission layer 113-1, a second emission layer 113-2, and a third emission layer 113-3 is formed on the hole transport layer 107. The first emission layer 113-1 emitting a first light is patterned to be formed in the first subpixel, the second emission layer 113-2 emitting a second light is patterned to be formed in the second subpixel, and the third emission layer 113-3 emitting a third colored light is patterned to be formed in the third subpixel.

A first auxiliary layer 114-1 patterned to be formed only in the first subpixel is disposed between the first emission layer 113-1 and the hole transport layer 107, a second auxiliary layer 114-2 patterned to be formed only in the second subpixel is disposed between the second emission layer 113-2 and the hole transport layer 107, and a layer for improving third colored light efficiency 114-3 patterned to be formed only in the third subpixel is disposed between the third emission layer 113-3 and the hole transport layer 107.

On the emission layer, an electron transport layer 115, an electron injecting layer 117, and the second electrode 119, each being a common layer are formed sequentially.

The term "common layer" as used herein refers to a layer that is not a separate pattern for each of the first subpixel, the second subpixel, and the third subpixel, but rather is formed over all of the first subpixel, the second subpixel, the third subpixel.

The first colored light, the second colored light, and the third colored light may be, for example, a red colored light, a green colored light, and a blue colored light, respectively. Accordingly, the organic light emitting diode may emit a full color spectrum. The first colored light, the second colored light, and the third colored light may be in any of a variety of colors, and are not limited to the red light, the green light, and the blue light, provided that a mixed light thereof may be a white light.

As the substrate 101, a substrate generally used in the organic light emitting diode may be used such as a glass substrate or a transparent plastic substrate having excellent mechanical strength, thermal stability, transparency, surface finish, handleability, and waterproofness may be used.

A plurality of the first electrodes 103 are disposed as separate patterns in the first subpixel, the second subpixel, and the third subpixel, which are formed on the substrate 101. The first electrode 103 may be a reflective electrode, a transmissive electrode, or a semi-transmissive electrode.

The first electrode 103 may be formed by providing a first electrode material on the substrate 101 by deposition or sputtering. When the first electrode 103 is an anode, a first electrode material having a high work function may be selected for easy hole injection into the first emission layer 113-1, the second emission layer 113-2, and a hole transport-third emission layer 110.

The first electrode 103 may include at least one metal selected from among magnesium (Mg), aluminum (Al), aluminum-lithium (Al—Li), calcium (Ca), magnesium-indium (Mg—In), magnesium-silver (Mg—Ag), and the like to form a reflective electrode. Also, the first electrode 103 may further include indium tin oxide (ITO), indium zinc oxide (IZO), tin oxide ($SnO_2$), zinc oxide (ZnO), and the like.

Pixel defining layers 105 are formed on edges of the plurality of the first electrodes 103. The pixel defining layers 105 define pixel domains and may include various known organic insulating materials (for example, silicon-based materials), inorganic insulating materials, or organic/inorganic composite insulating materials.

The hole transport layer 107 is formed as common layers on the plurality of the first electrodes 103.

The hole transport layer 107 may be formed on the plurality of the first electrodes 103 by using vacuum deposition, spin coating, casting, Langmuir-Blodget (LB) technique, inkjet printing, laser printing, laser induced thermal imaging (LITI), or the like.

When the hole transport layer 107 is formed using vacuum deposition, vacuum deposition conditions may vary according to the material that is used to form the target hole transport layer 107, and the desired structure and thermal properties of the hole transport layer 107. For example, vacuum deposition may be performed at a temperature of about 100° C. to about 500° C., a pressure of about $10^{-8}$ torr to about $10^{-3}$ torr, and a deposition rate of about 0.01 Å/sec to about 100 Å/sec. However, the conditions are not limited thereto.

When the hole transport layer 107 is formed by using spin coating, coating conditions may vary according to the compound that is used to form the target hole transport layer 107, and the desired structure and thermal properties of the hole transport layer 107. For example, the coating rate may be about 2000 rpm to about 5000 rpm, and a temperature at which heat treatment is performed to remove a solvent after coating may be about 80° C. to about 200° C. However, the conditions are not limited thereto.

Non-limiting examples of the material that may be used to form the transport layer 107 are N,N'-diphenyl-N,N'-bis-[4-(phenyl-m-tolyl-amino)-phenyl]-biphenyl-4,4'-diamine (DNTPD), a phthalocyanine compound such as copper phthalocyanine, m-MTDATA [4,4',4"-tris(3-methylphenyl-phenylamino)triphenylamine], Pani/DBSA (Polyaniline/Dodecylbenzenesulfonic acid), PEDOT/PSS (Poly(3,4-ethylenedioxythiophene)/Poly(4-styrenesulfonate), Pani/CSA (Polyaniline/Camphor sulfonic acid), and PANI/PSS (Polyaniline)/Poly(4-styrenesulfonate), but are not limited thereto.

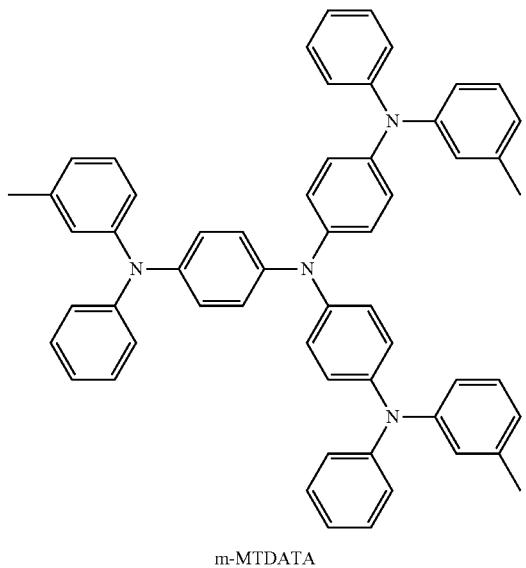

m-MTDATA

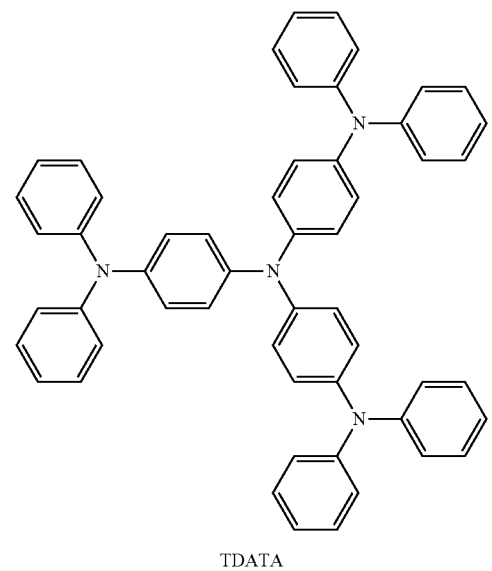

TDATA

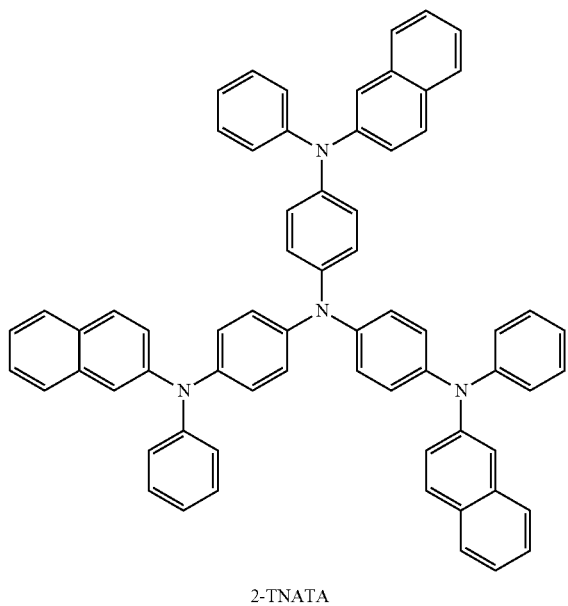

2-TNATA

In some embodiments, the hole transport layer 107 may include at least one of a first hole transporting material represented by Formula 300 and a second hole transporting material represented by Formula 301:

<Formula 300>

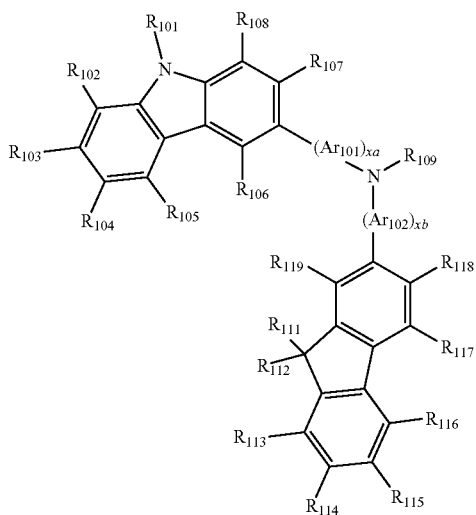

<Formula 301>

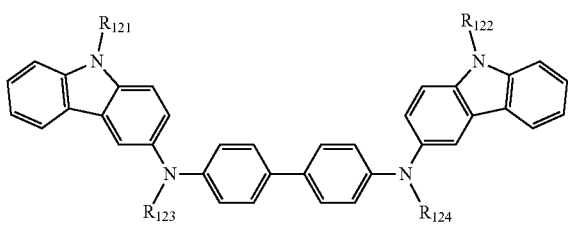

In Formula 300, $Ar_{101}$ and $Ar_{102}$ may be each independently, a substituted or unsubstituted $C_6$-$C_{60}$ arylene group.

For example, $Ar_{101}$ and $Ar_{102}$ may be each independently, a phenylene group, a pentalenylene group, an indenylene group, a naphthylene group, an azulenylene group, a heptalenylene group, acenaphthylene group, a fluolenylene group, a phenalenylene group, a phenanthrenyl group, an anthrylene group, a fluorantenylene group, a triphenylenylene group, a pyrenylene group, a chrysenylenylene group, a naphthasenylene group, a picenylene group, a perylenylene group and a pentacenylene group; and a phenylene group, a pentalenylene group, an indenylene group, a naphthylene group, an azulenylene group, a heptalenylene, acenaphthylene group, a fluolenylene group, a phenalenylene group, a phenanthrenyl group, an anthrylene group, a fluorantenylene group, a triphenylenylene group, a pyrenylene group, a chrysenylenylene group, a naphthasenylene group, a picenylene group, a perylenylene group and a pentacenylene group, substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkinyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group and a $C_2$-$C_{60}$ heteroaryl group.

In Formula 300, xa and xb may be each independently an integer of 0 to 5, or 0, 1 or 2. For example, xa may be 1 and xb may be 0, but are not limited thereto.

In Formulae 300 and 301, $R_{101}$ to $R_{108}$, $R_{111}$ to $R_{119}$ and $R_{121}$ to $R_{124}$ may be each independently, a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group.

For example, $R_{101}$ to $R_{108}$, $R_{111}$ to $R_{119}$ and $R_{121}$ to $R_{124}$ may be each independently, a hydrogen atom, a deuterium atom, a halogen atom, a hydroxyl group, a cyano group, a nitro group, and an amino group, an amidino group, a hydrazine group, a hydrazone, a carboxyl group or a salt thereof, a sulfonic acid group or a salt thereof, a phosphoric acid group or a salt thereof, $C_1$-$C_{10}$ alkyl group (for example, a methyl group, an ethyl group, a propyl group, a butyl group, a pentyl group, a hexyl group, and the like) and a $C_1$-$C_{10}$ alkoxy group (for example, a methoxy group, an ethoxy group, a propoxy group, a butoxy group, a pentoxy group, and the like);

a $C_1$-$C_{10}$ alkyl group and a $C_1$-$C_{10}$ alkoxy group, substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof and a phosphoric acid group or a salt thereof;

a phenyl group, a naphthyl group, an anthryl group, a fluorenyl group and a pyrenyl group; and a phenyl group, a naphthyl group, an anthryl group, a fluorenyl group and a pyrenyl group, substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, and a $C_1$-$C_{10}$ alkyl group and a $C_1$-$C_{10}$ alkoxy group, but are not limited thereto.

In Formula 300, $R_{109}$ may be, a phenyl group, a naphthyl group, an anthryl group, biphenyl group and a pyridyl group; and a phenyl group, a naphthyl group, an anthryl group, a biphenyl group and a pyridyl group, substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In some embodiments, the first hole transport material represented by Formula 300 may be represented as Formula 300A, but is not limited thereto:

<Formula 300A>

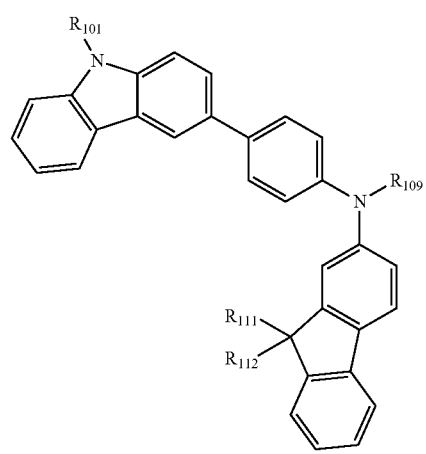

In Formula 300A, detailed descriptions of $R_{101}$, $R_{111}$, $R_{111}$ and $R_{109}$ have already been given above.

For example, the hole transport layer 107 may include at least one of Compounds 301 to Compound 320 but are not limited thereto:

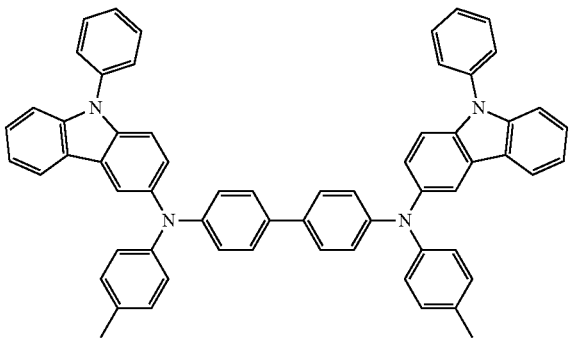

302

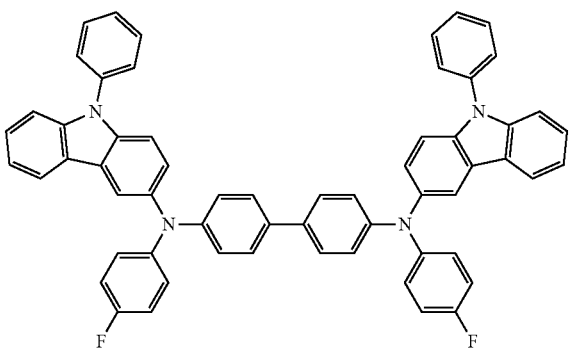

303

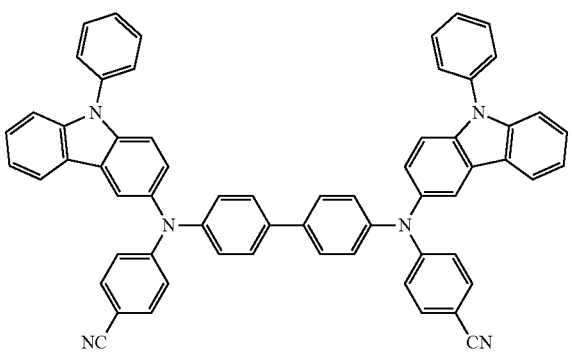

304

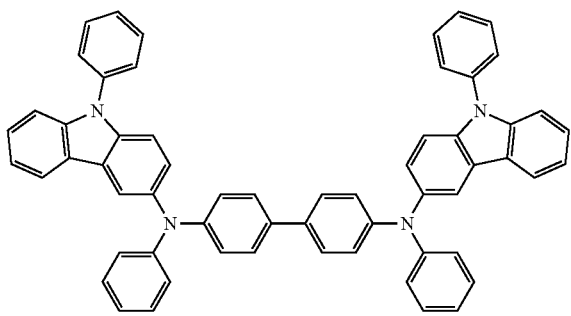

301

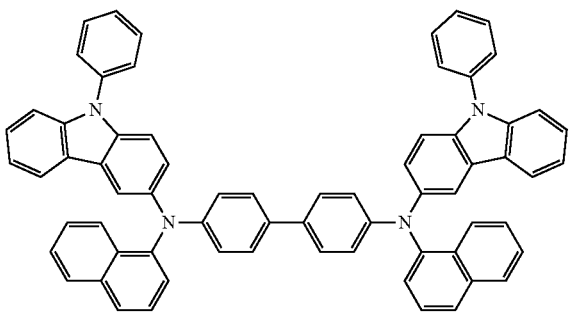

305

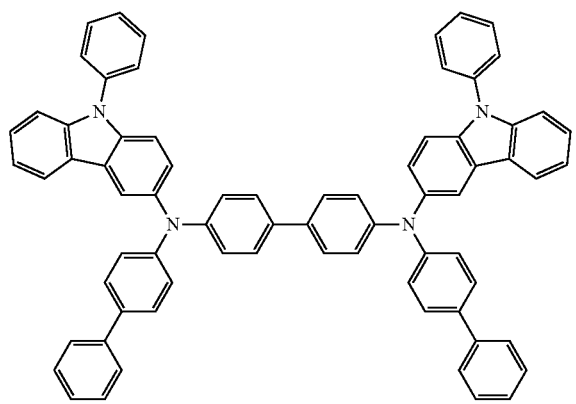
306
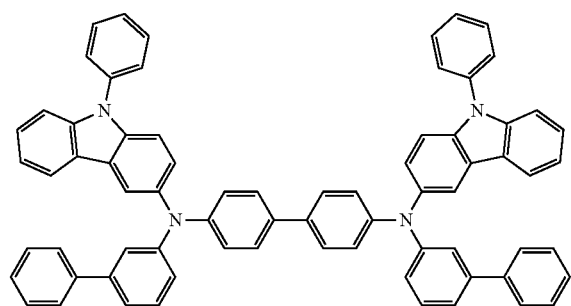
307
308
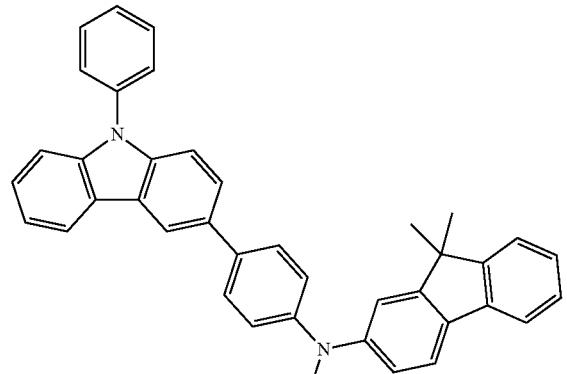
310
309
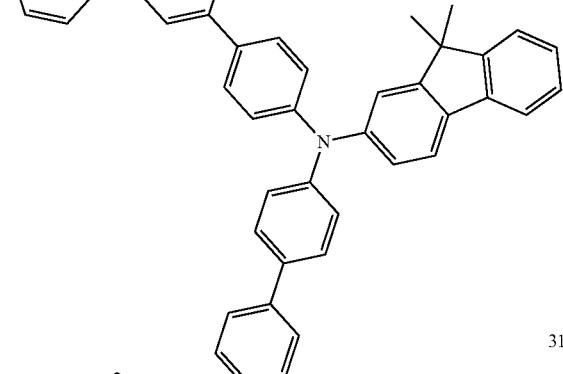
311
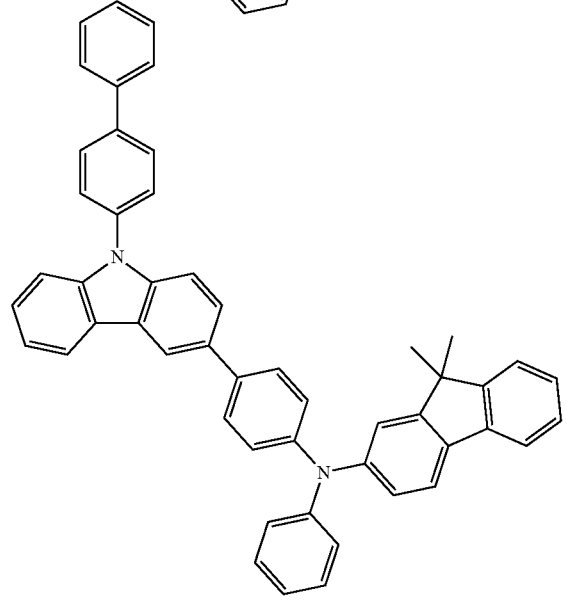
312

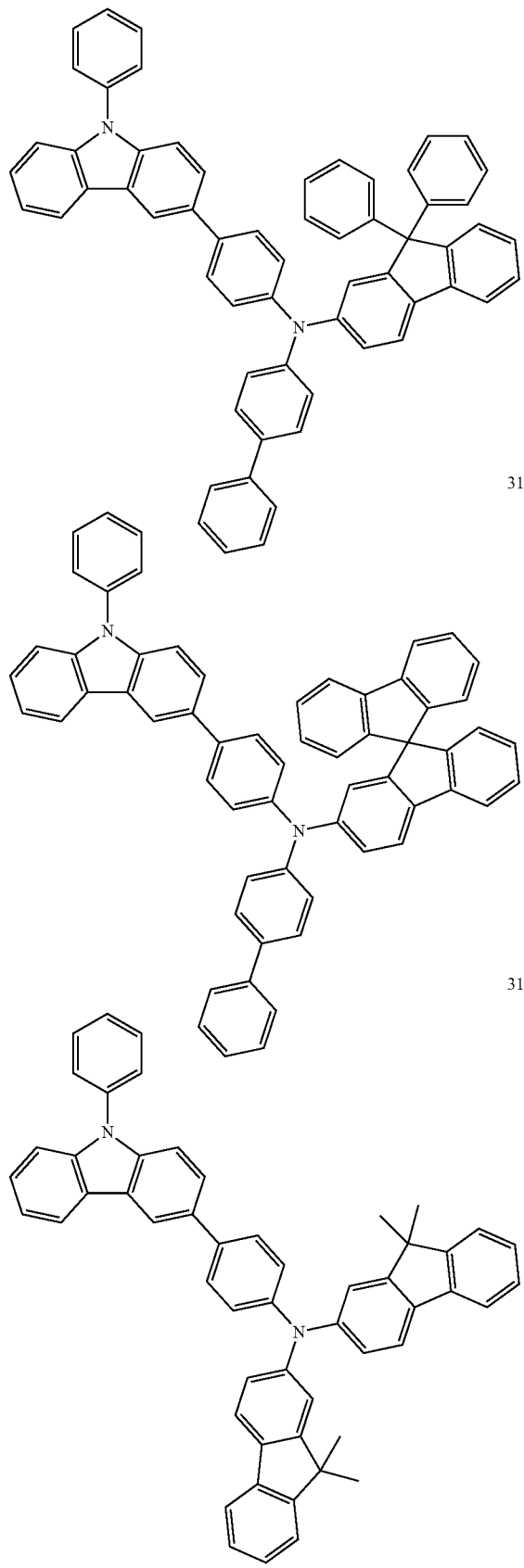
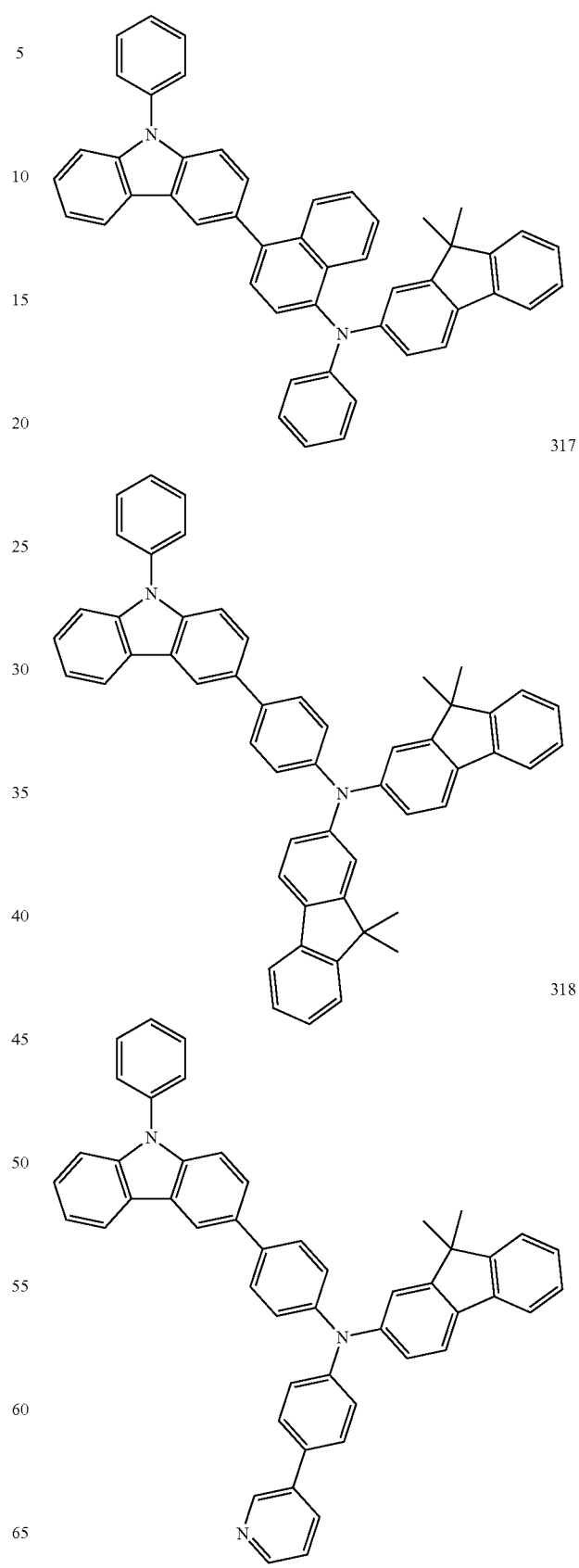

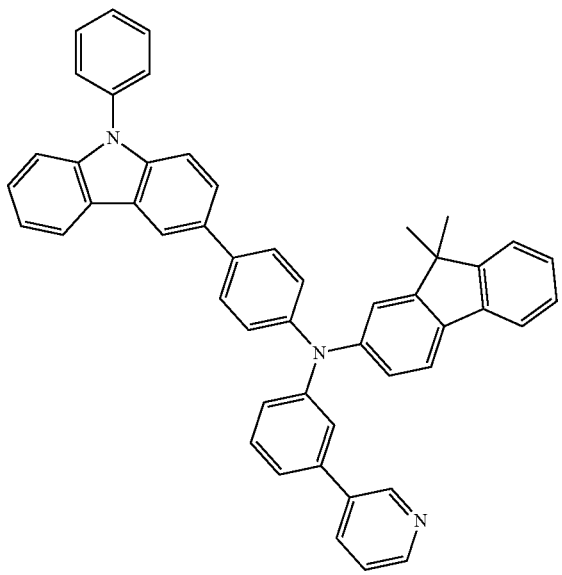

319

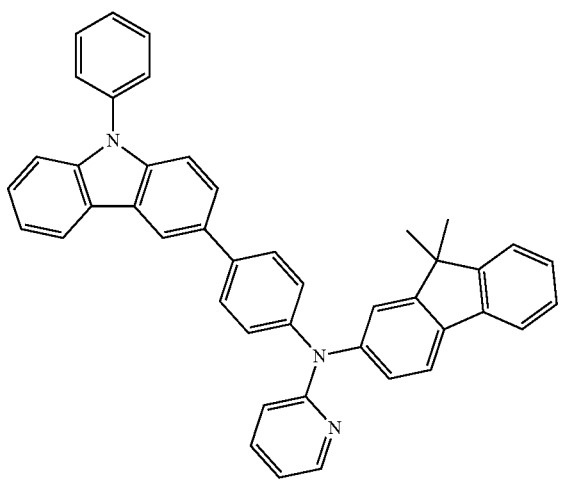

320

The thicknesses of the hole transport layer 107 may be from about 100 Å to about 10000 Å, and in some embodiments, may be from about 100 Å to about 1500 Å. When the thickness of the hole injection layer 107 is within these ranges, an organic light emitting diode without a substantial increase in driving voltage may be manufactured.

The first auxiliary layer 114-1 and the first emission layer 113-1 are formed on the hole transport layer 107 in the first subpixel, the second auxiliary layer 114-2 and the second emission layer 113-2 are formed on the hole transport layer 107 in the second subpixel, and the layer for improving third colored light efficiency 114-3 and the third emission layer 113-3 are formed on the hole transport layer 107 in the third subpixel.

The layer for improving third colored light efficiency 114-3 includes a carbazole-based compound represented by Formula 1:

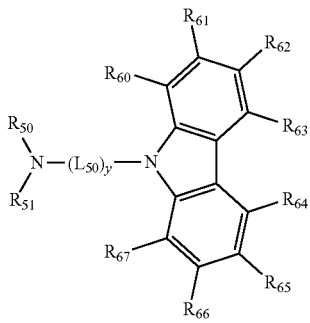

<Formula 1>

In Formula 1, $L_{50}$ is a substituted or unsubstituted $C_6$-$C_{60}$ arylene group or a substituted or unsubstituted $C_2$-$C_{60}$ heteroarylene group.

For example, $L_{50}$ may be a phenylene group, a pentalenylene group, an indenylene group, a naphthylene group, an azulenylene group, a heptalenylene, acenaphthylene group, a fluolenylene group, a phenalenylene group, a phenanthrenyl group, an anthrylene group, a fluorantenylene group, a triphenylenylene group, a pyrenylene group, a chrysenylenylene group, a naphthasenylene group, a picenylene group, a perylenylene group and a pentacenylene group; and a phenylene group, a pentalenylene group, an indenylene group, a naphthylene group, an azulenylene group, a heptalenylene, acenaphthylene group, a fluolenylene group, a phenalenylene group, a phenanthrenyl group, an anthrylene group, a fluorantenylene group, a triphenylenylene group, a pyrenylene group, a chrysenylenylene group, a naphthasenylene group, a picenylene group, a perylenylene group and a pentacenylene group, substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{60}$alkyl group, a $C_2$-$C_{60}$ alkenyl group, a $C_2$-$C_{60}$ alkinyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, arylthio group, a $C_6$-$C_{60}$ aryloxy group, a $C_6$-$C_{60}$ arylthio group and a $C_2$-$C_{60}$ heteroaryl group.

In greater detail, $L_{50}$ may be a phenylene group, a naphthylene group and a fluolenylene group; and a phenylene group, a naphthylene group and a fluolenylene group, substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, an anthryl group and a pyridinyl group, but are not limited thereto.

In Formula 1, y may be an integer of 1 to 5. For example, in Formula 1 when y is at least 2, y number of $L_{50}$ may be the same or different.

In Formula 1, $R_{50}$ and $R_{51}$ may be each independently, a substituted or unsubstituted $C_6$-$C_{60}$ aryl group, or a substituted or unsubstituted $C_2$-$C_{60}$ heteroaryl group.

For example, $R_{50}$ and $R_{51}$ may be each independently, a phenyl group, a naphthyl group, an anthryl group and a pyridyl group; and a phenyl group, a naphthyl group, an anthryl group and a pyridyl group, substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group and a pyridinyl group, but are not limited thereto.

In Formula 1, $R_{60}$ to $R_{67}$ may be each independently, a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group.

For example, $R_{60}$ to $R_{67}$ may be each independently, a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, an anthryl group and a pyridyl group; and a phenyl group, a naphthyl group, an anthryl group and a pyridyl group, substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group and a pyridinyl group, but are not limited thereto.

In greater detail, $R_{60}$ to $R_{67}$ may be each independently at least one of a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, $C_1$-$C_{10}$ alkyl group, $C_1$-$C_{10}$ alkoxy group, a phenyl group, a naphthyl group, an anthryl group and a pyridyl group, but are not limited thereto.

The carbazole-based compound represented by Formula 1 may be represented as one of Formulae 1A to 1N, but is not limited thereto:

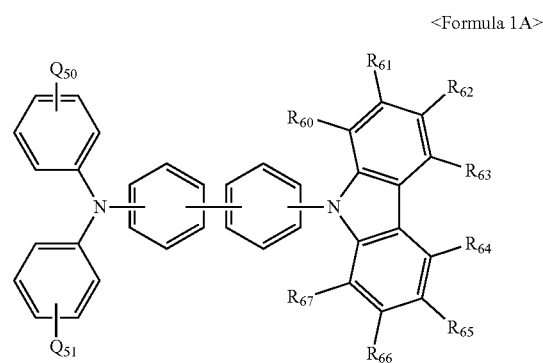

<Formula 1A>

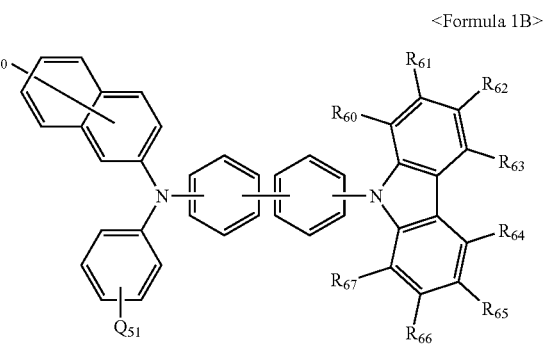

<Formula 1B>

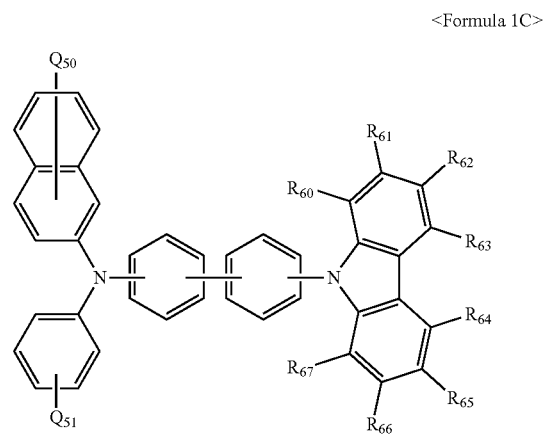

<Formula 1C>

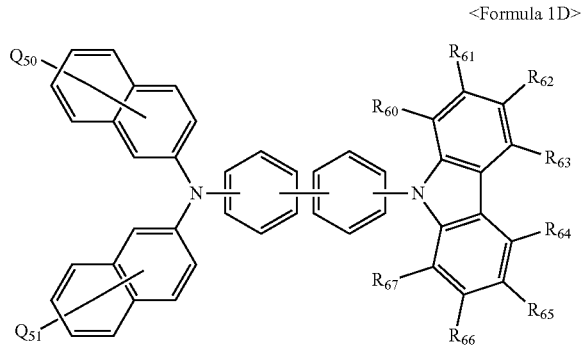

<Formula 1D>

<Formula 1E>
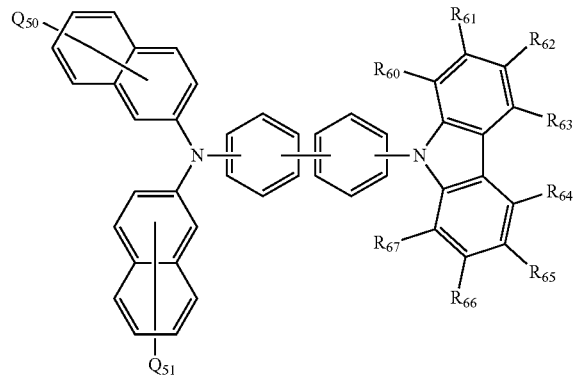
<Formula 1F>
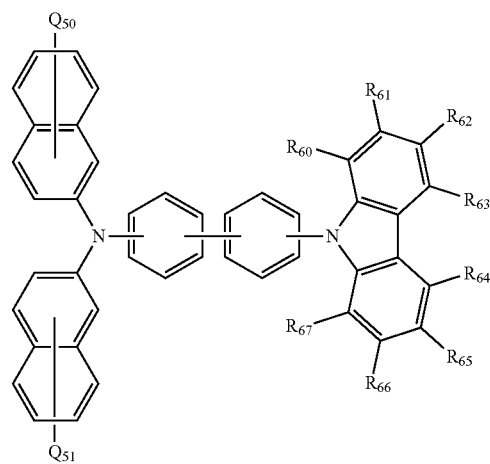
<Formula 1G>
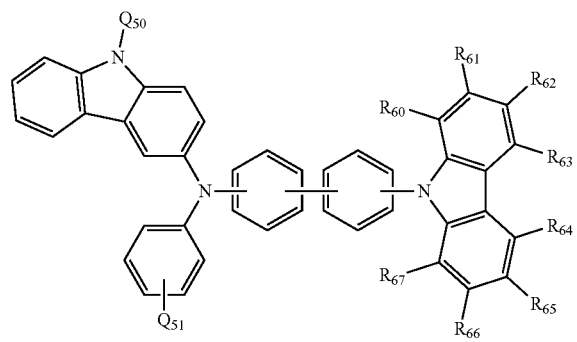
<Formula 1H>
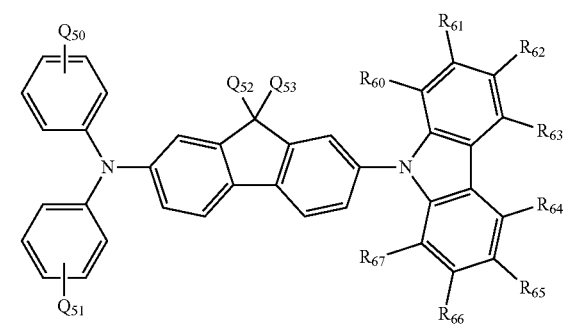
<Formula 1I>
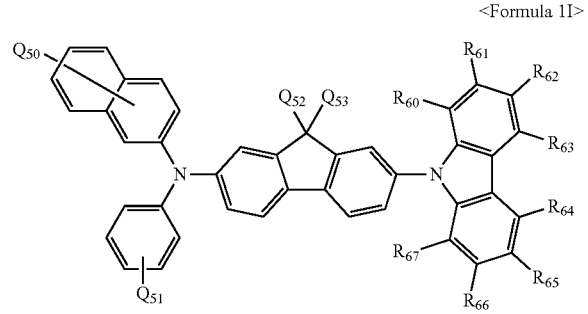
<Formula 1J>
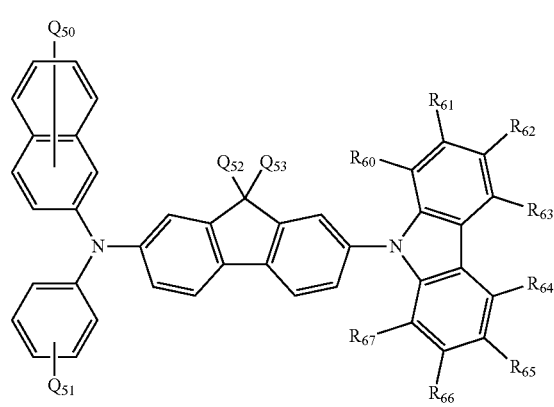
<Formula 1K>
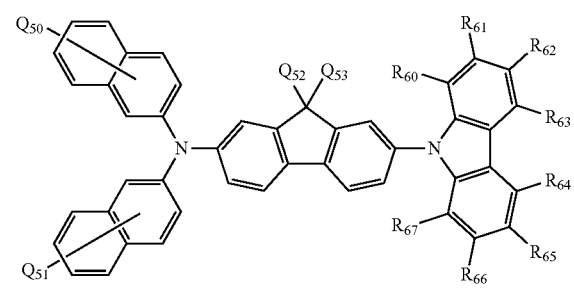
<Formula 1L>
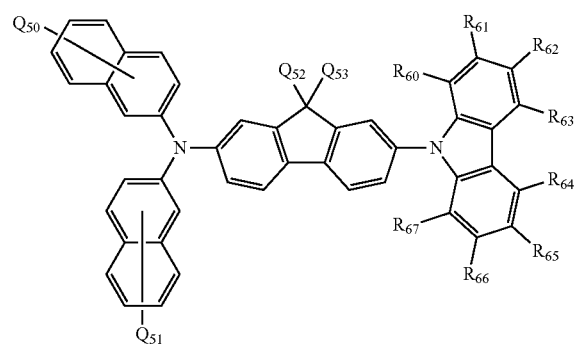

<Formula 1M>

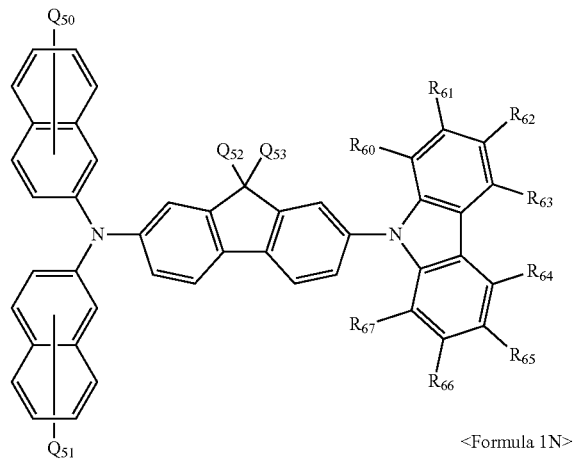

<Formula 1N>

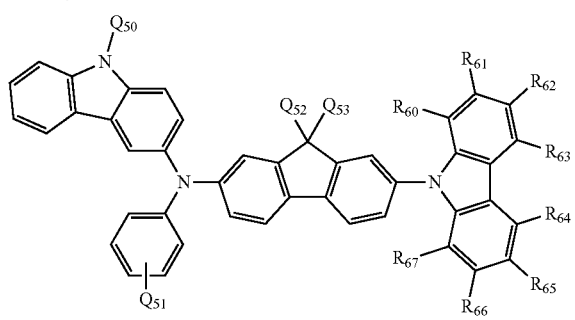

In Formulae 1A to 1N, $Q_{50}$ to $Q_{53}$ and $R_{60}$ to $R_{67}$ may be each independently selected from a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{10}$ alkyl group, a phenyl group, a naphthyl group, an anthryl group and a pyridyl group.

The carbazole-based compound represented by Formula 1 may be Compound 1 below, but is not limited thereto:

<Compound 1>

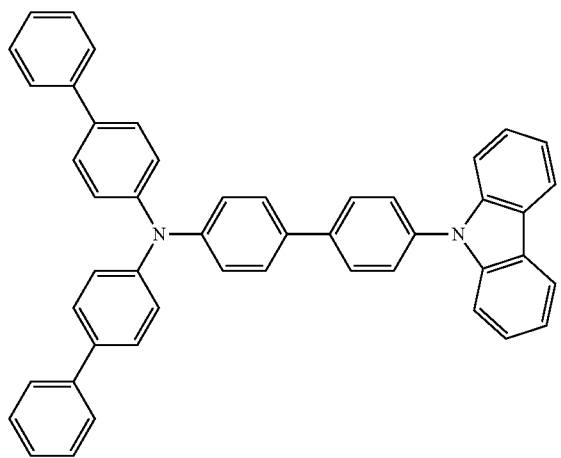

As the layer for improving third colored light efficiency 114-3 includes the carbazole-based compound represented by Formula 1, light emitting efficiency of the third color from the third emission layer 113-3 of the third subpixel may improve. Without being limited by a specific theory, the carbazole-based compound may prevent a polaron from extinguishing an exciton by increasing an injection barrier from the hole transport layer 107 to the third emission layer 113-3. Accordingly, light emitting efficiency of the organic light emitting diode may increase.

The first emission layer 113-1, the second emission layer 113-2 and the third emission layer 113-3 may include a host and a dopant.

Non-limiting examples of the known host are $Alq_3$, CBP (4,4'-N,N'-dicarbazole-biphenyl), 9,10-di(naphthalene-2-yl) anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), dmCBP (see Formulas below), and Compounds 501 to 509 below, but are not limited thereto.

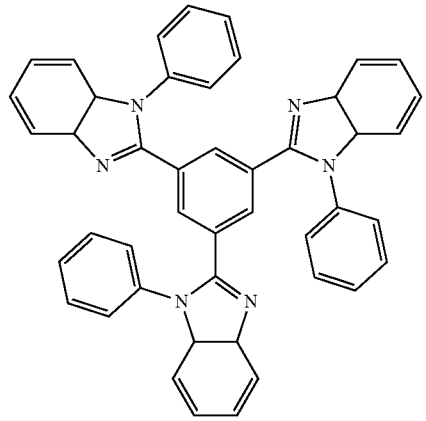

TPBI

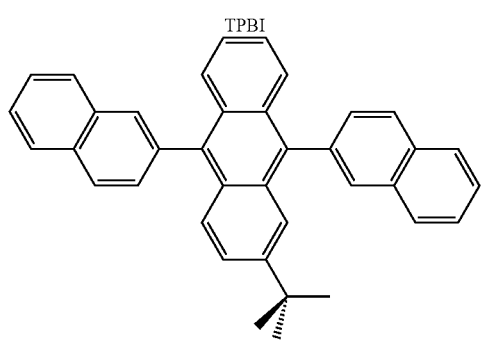

TBADN

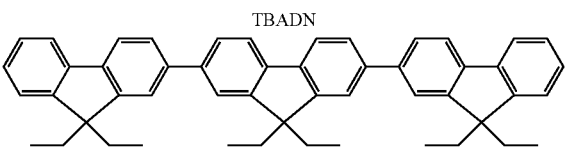

E3

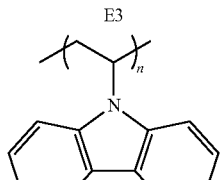

PVK

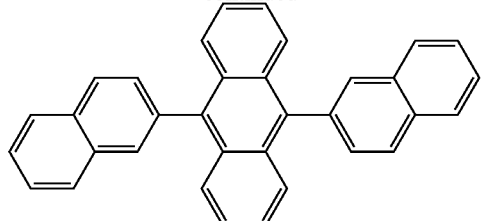
ADN
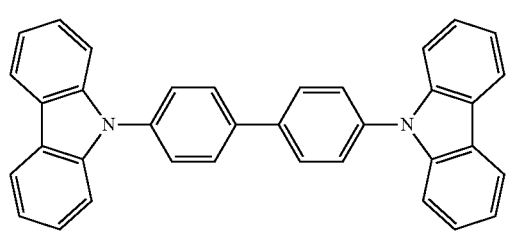
CBP
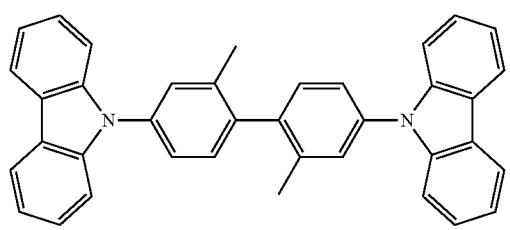
dmCBP
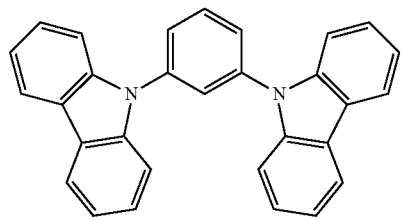
501
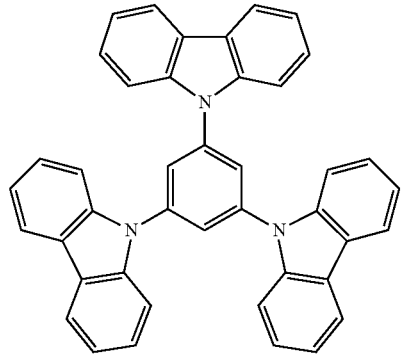
502
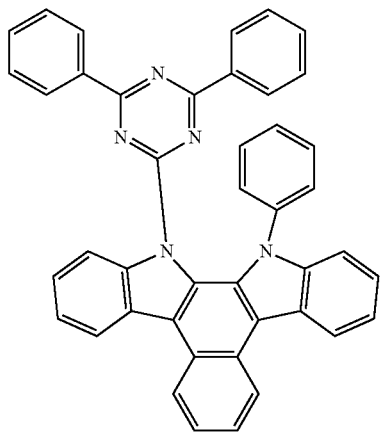
503
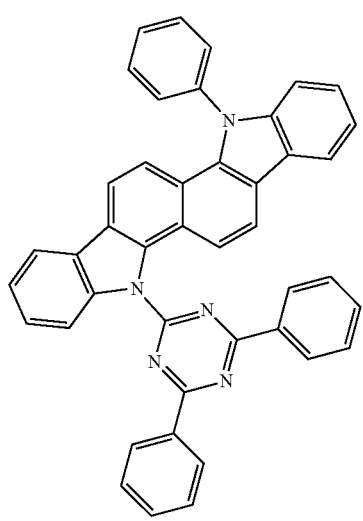
504
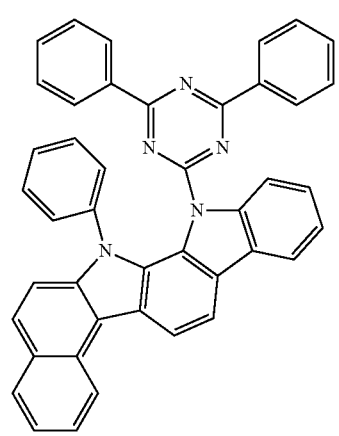
505

-continued

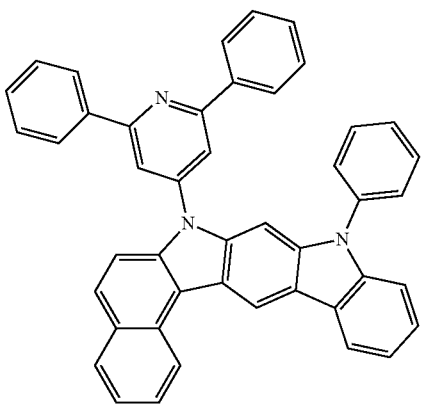

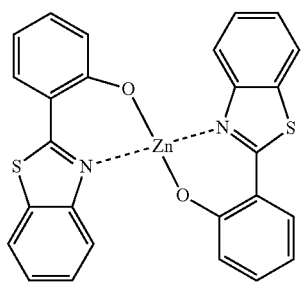

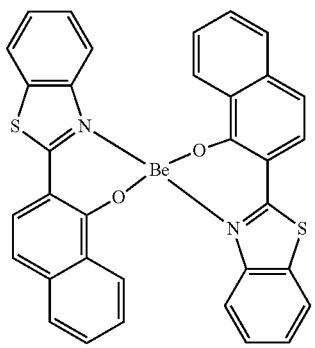

In other embodiments, an anthracene-based compound represented by Formula 400 may be used as the host:

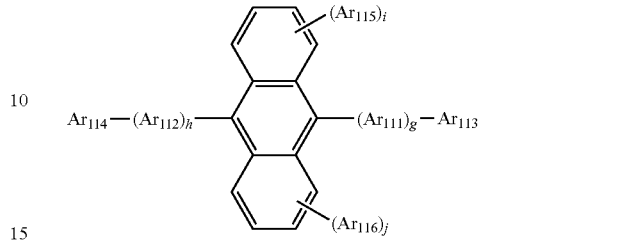

<Formula 400>

In Formula 400, $Ar_{111}$ and $Ar_{112}$ may be each independently, a substituted or unsubstituted $C_6$-$C_{60}$ arylene group; $Ar_{113}$ to $Ar_{116}$ may be each independently, a substituted or unsubstituted $C_1$-$C_{10}$ alkyl group or a substituted or unsubstituted $C_6$-$C_{60}$ aryl group; g, h, i and j may be each independently an integer of 0 to 4.

For example, in Formula 400, $Ar_{111}$ and $Ar_{112}$ may be each independently selected from a phenylene group, a naphthylene group, a phenanthrenyl group, a fluorenyl group, and a pyrenylene group; and a phenylene group, a naphthylene group, a phenanthrenyl group, a fluorenyl group, and a pyrenylene group, substituted with at least one of a phenyl group, a naphthyl group and anthryl group, but are not limited thereto.

In Formula 400, g, h, i and j may be each independently, 0, 1 or 2.

In Formula 400, $Ar_{113}$ to $Ar_{116}$ may be each independently, a $C_1$-$C_{10}$ alkyl group substituted with at least one of a phenyl group, a naphthyl group and an anthryl group;

a phenyl group, a naphthyl group, an anthryl group, a pyrenyl group, a phenanthrenyl group and a fluorenyl group; a phenyl group, a naphthyl group, an anthryl group, a pyrenyl group, a phenanthrenyl group and a fluorenyl group, substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkinyl group, a $C_1$-$C_{60}$ alkoxy group, a phenyl group, a naphthyl group, an anthryl group, a pyrenyl group, a phenanthrenyl group and a fluorenyl group; and

but are not limited thereto.

For example, the anthracene-based compound represented by Formula 400 may be one of Compounds below, but is not limited thereto:

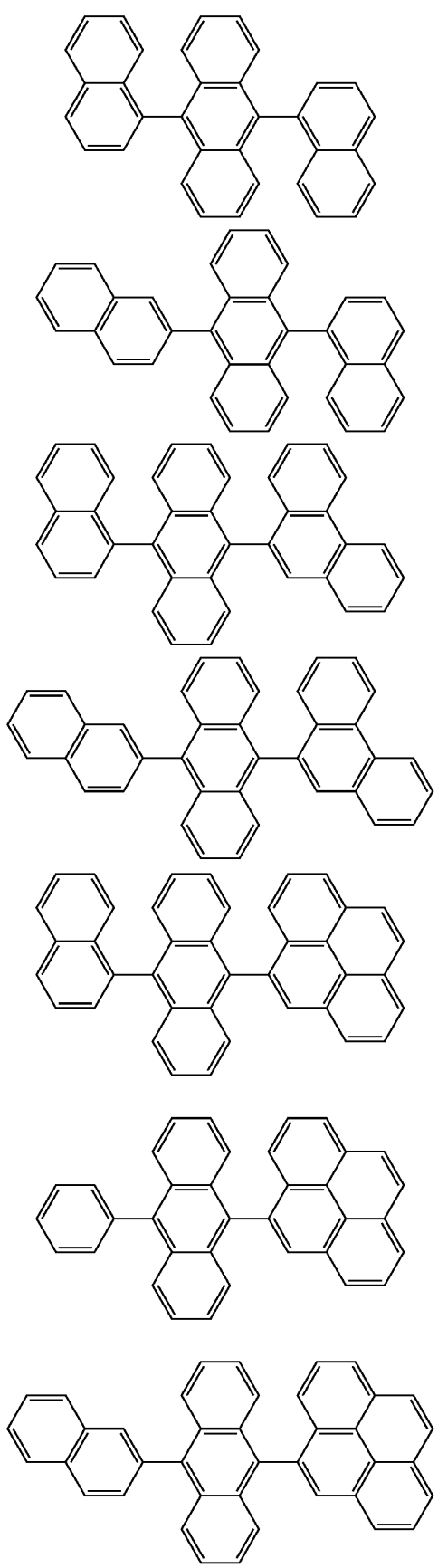
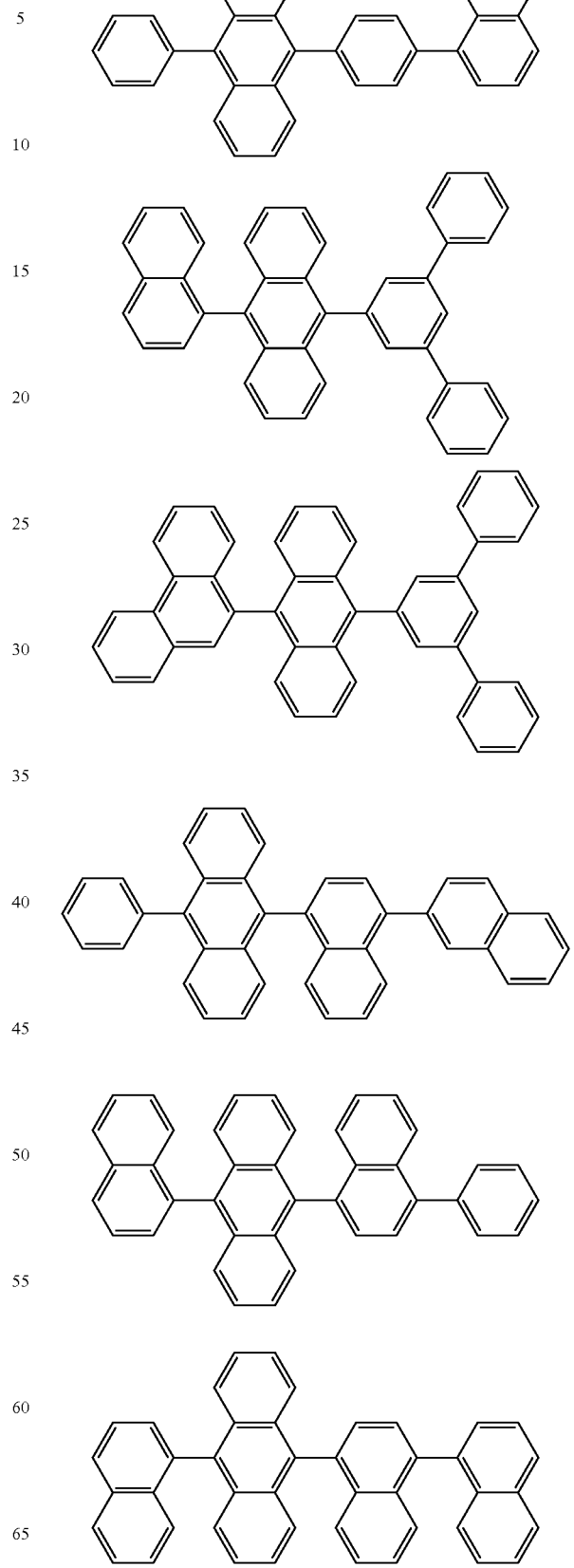

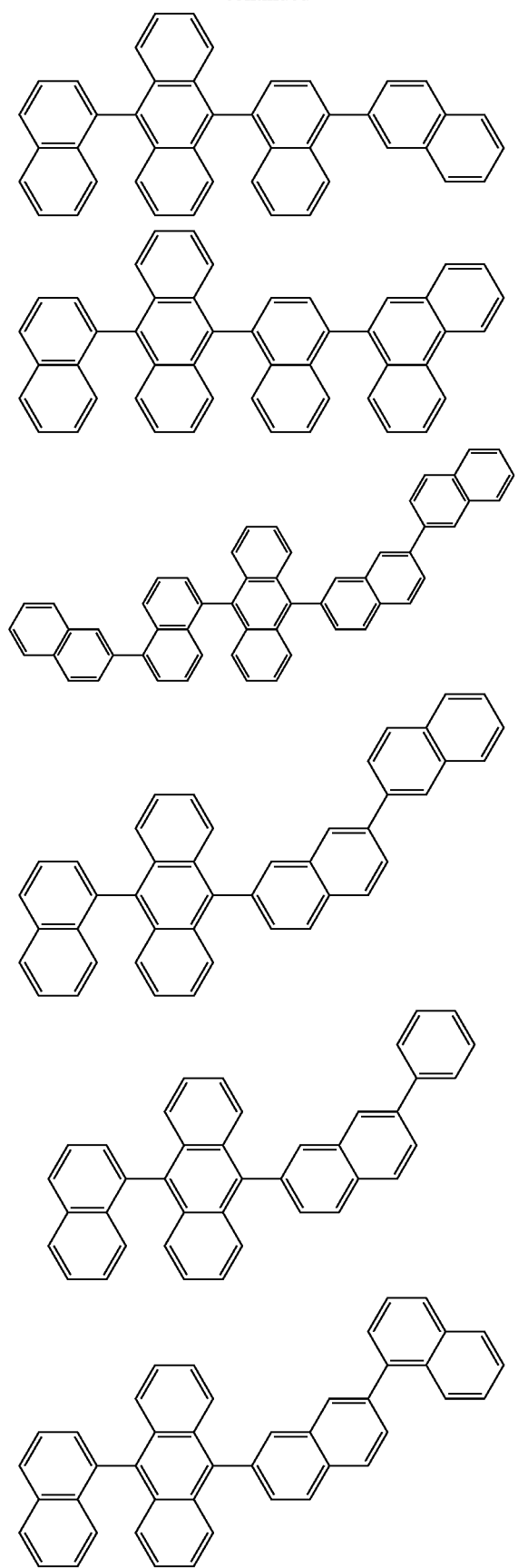
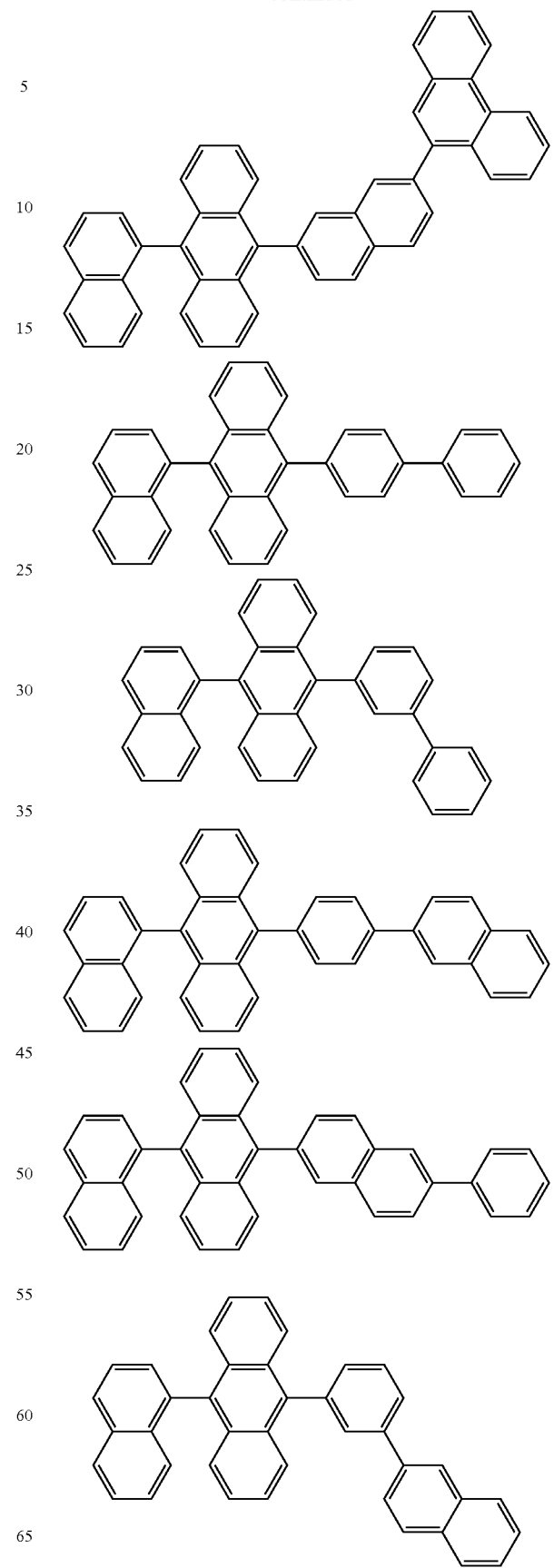

31
-continued
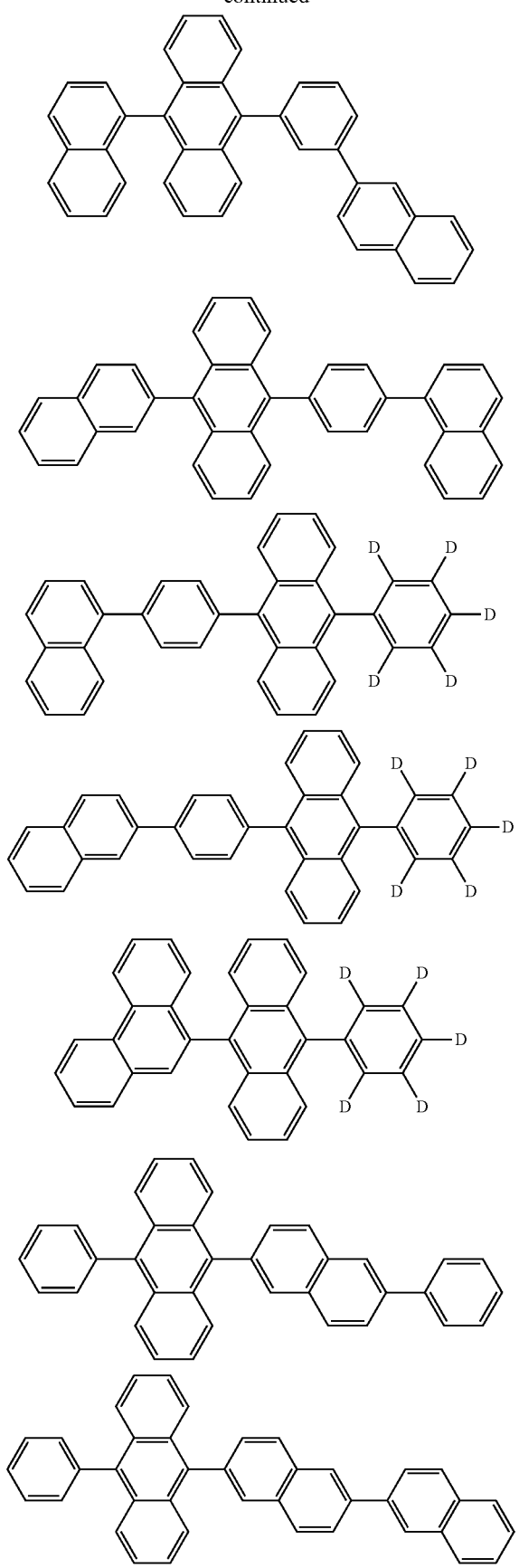
32
-continued
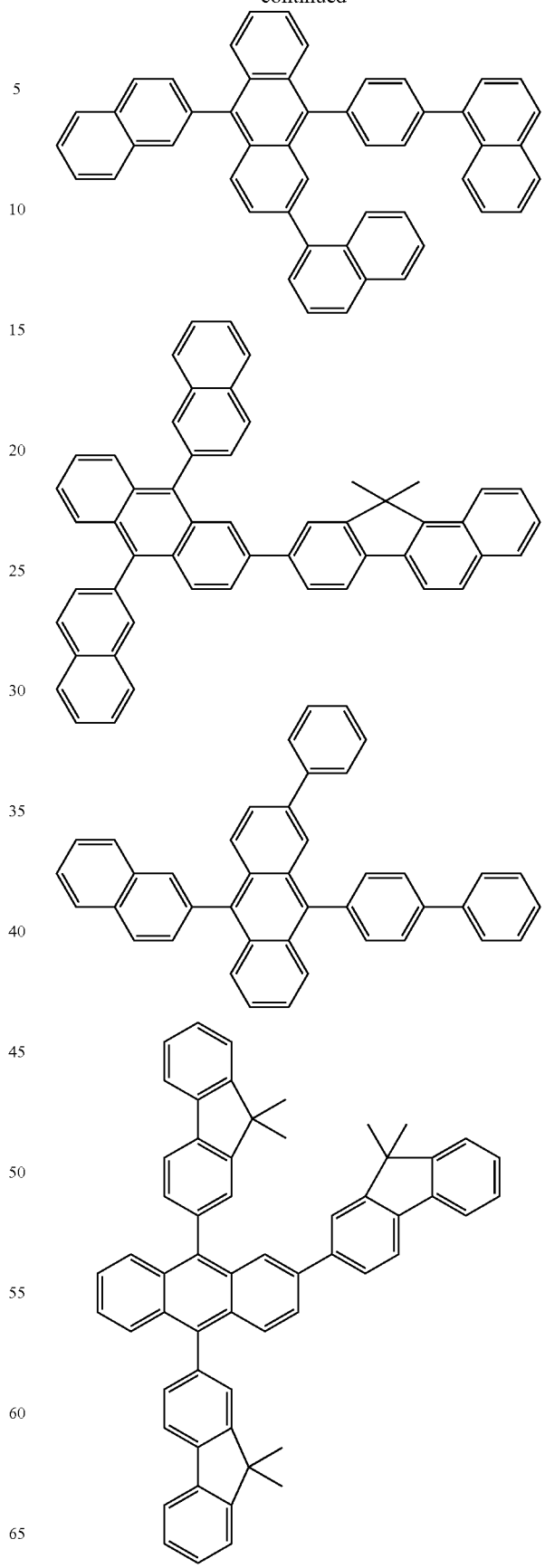

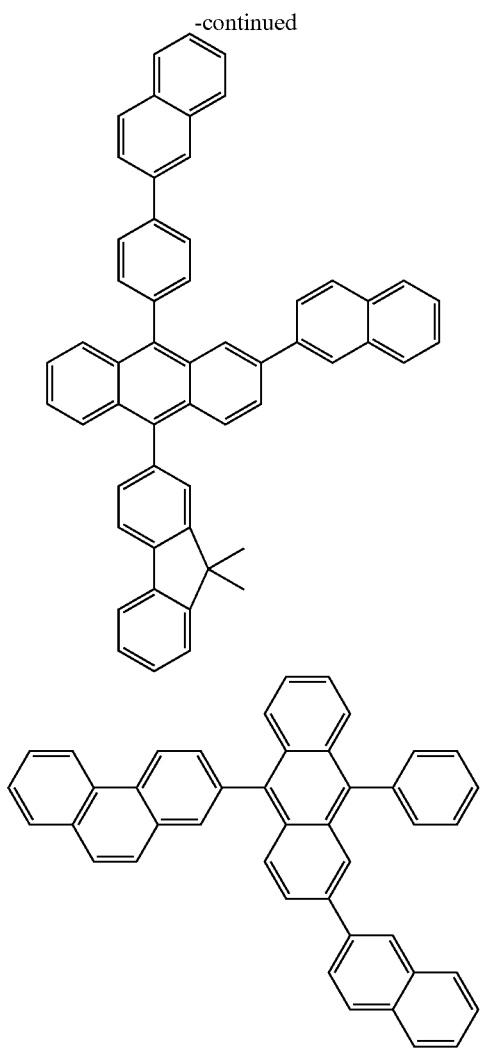

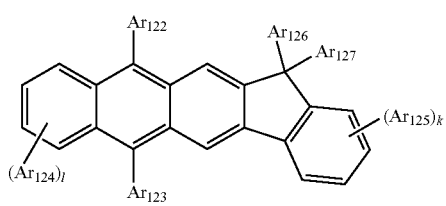

In other embodiments, an anthracene-based compound represented by Formula 401 may be used as the host:

<Formula 401>

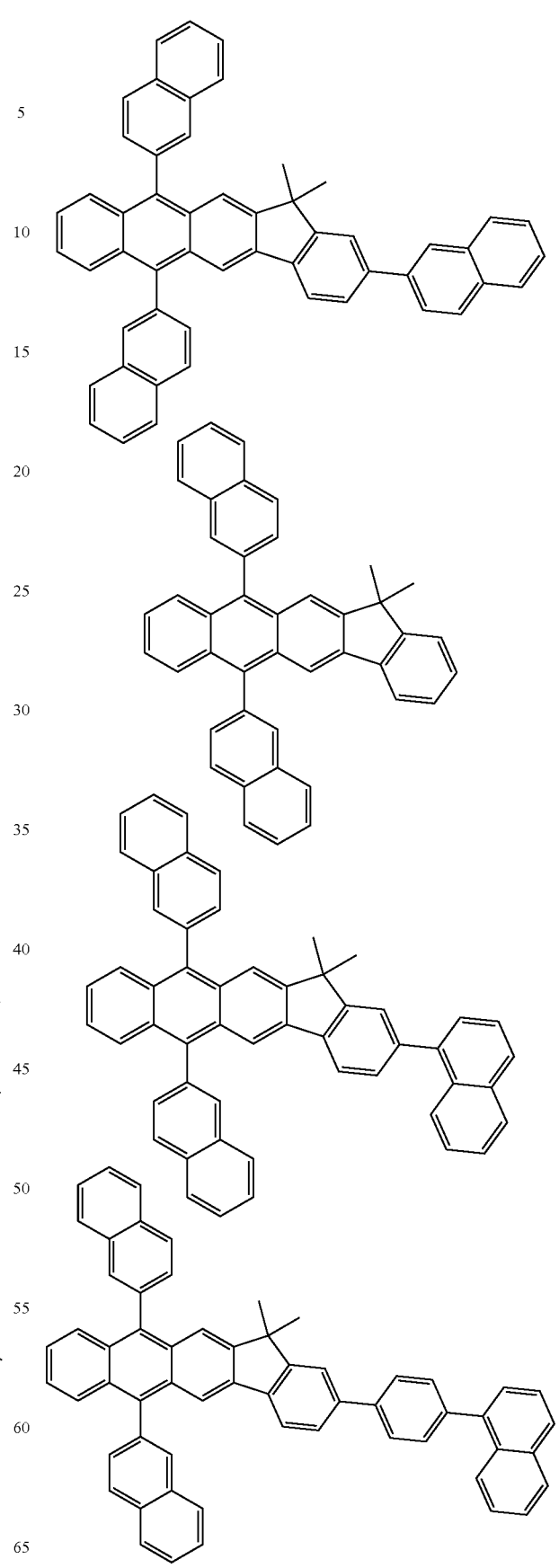

In Formula 401, detailed descriptions of $Ar_{122}$ to $Ar_{125}$ have already been given above in the description of $Ar_{113}$ of Formula 400.

In Formula 401, $Ar_{126}$ and $Ar_{127}$ may be each independently, a $C_1$-$C_{10}$ alkyl group (for example, a methyl group, an ethyl group or a propyl group).

In Formula 401, k and l may be each independently an integer of 0 to 4. For example, k and l may be 0, 1 or 2.

For example, the anthracene-based compound represented by Formula 401 may be one of Compounds below, but is not limited thereto:

Compounds below may be used as a blue dopant of the third emission layer (113-3), but is not limited thereto.
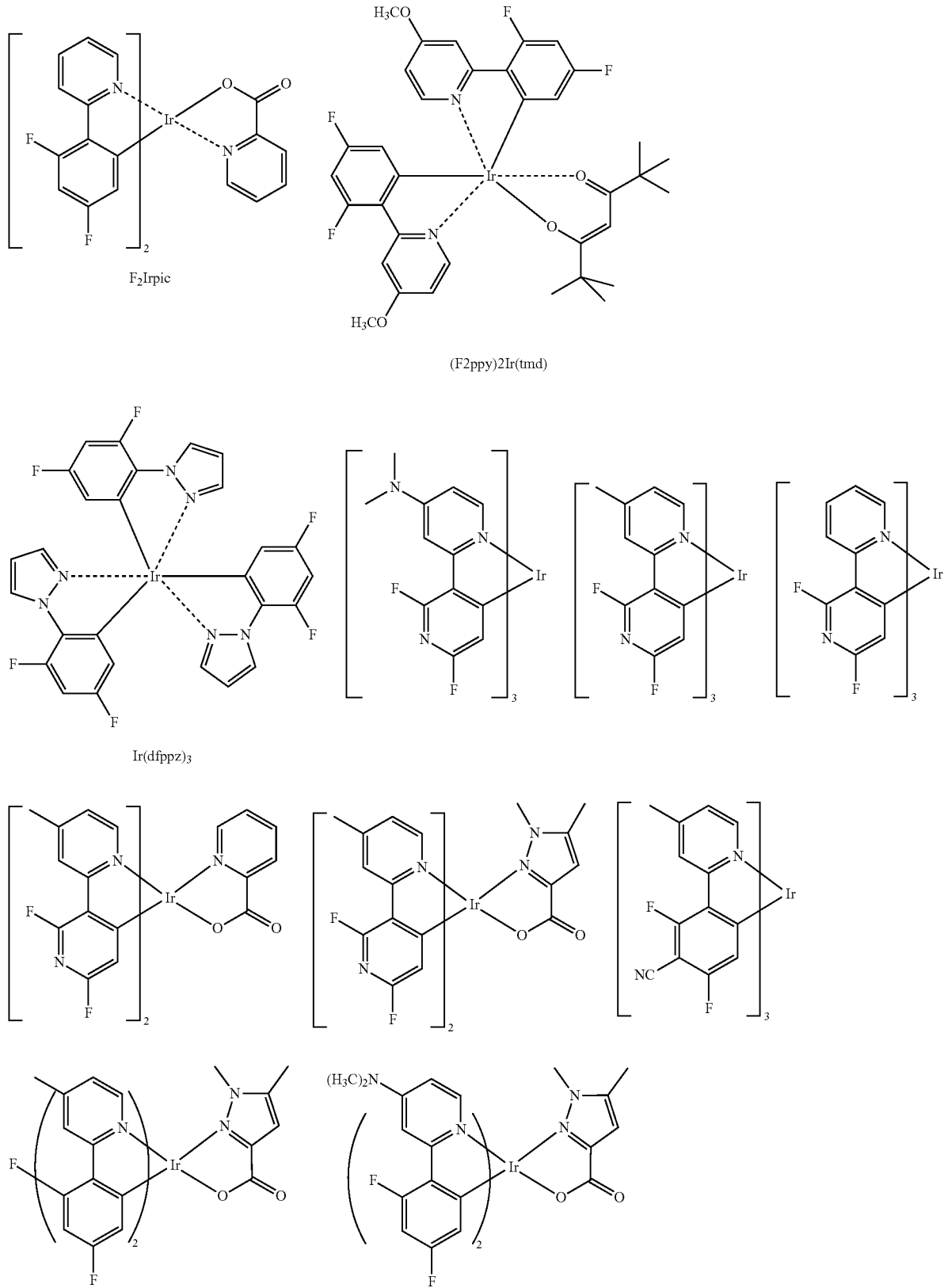

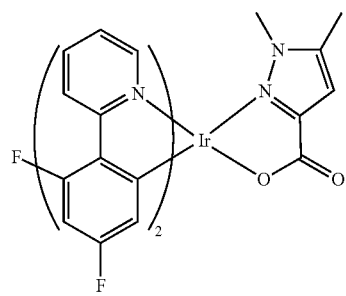
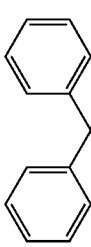
DPVBi
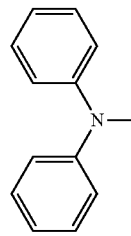
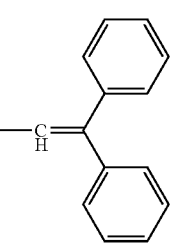
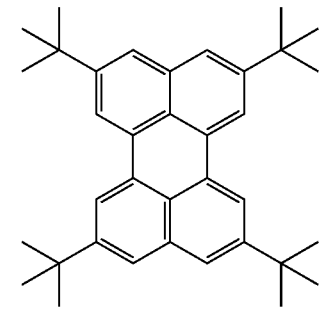
DPAVBi
TBPe
Compounds below may be used as a red dopant of the first emission layer (113-1), but is not limited thereto.
-continued
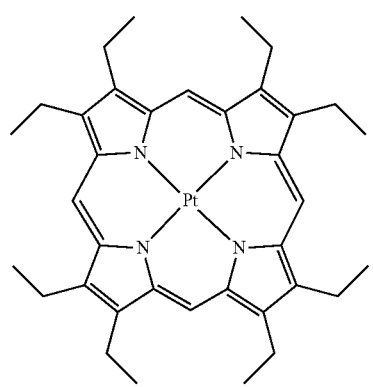
PtOEP
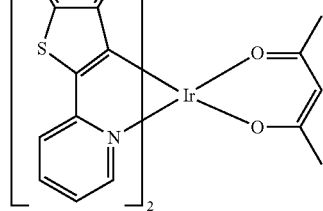
Btp₂Ir(acac)
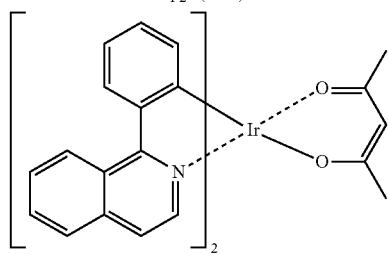
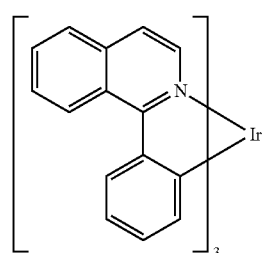
Ir(piq)₃
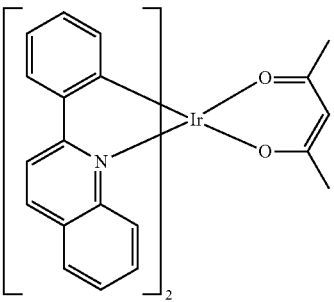
Ir(pq)₂(acac)

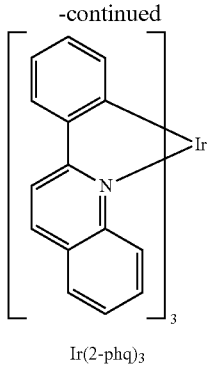
Ir(2-phq)₃
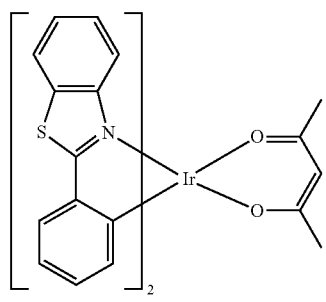
Ir(BT)₂(acac)
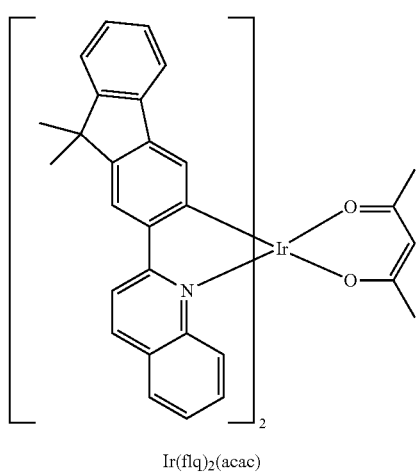
Ir(flq)₂(acac)
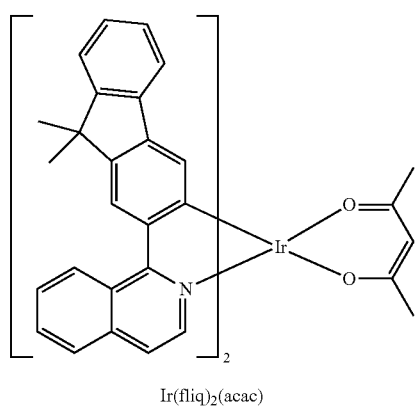
Ir(fliq)₂(acac)
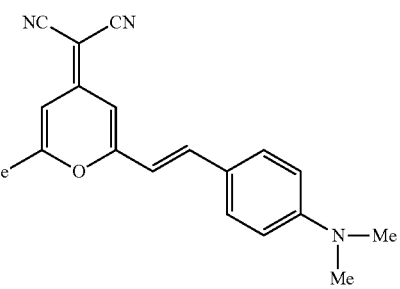
DCM
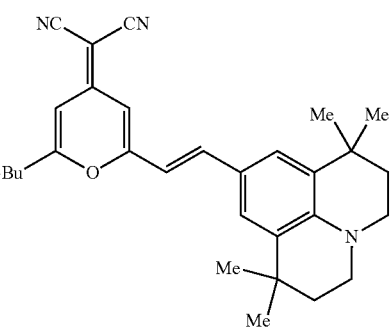
DCJTB
Compounds below may be used as a green dopant of the second emission layer (113-2), but is not limited thereto.
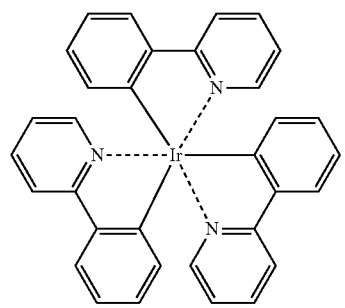
Ir(ppy)₃
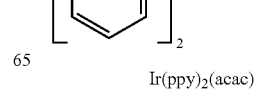
Ir(ppy)₂(acac)
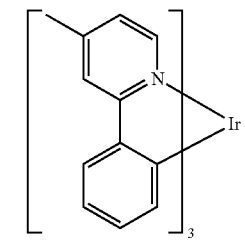
Ir(mpyp)₃

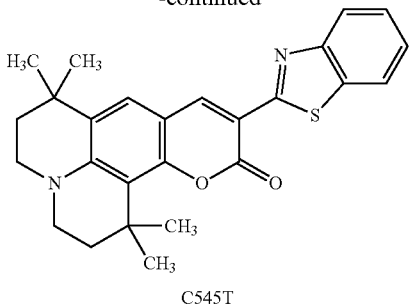

C545T

The first auxiliary layer 114-1 is patterned in the first subpixel, and is disposed between the first emission layer 113-1 and the hole transport layer 107. The second auxiliary layer is patterned in the second subpixel, and is disposed between the second emission layer 113-2 and the hole transport layer 107.

The first auxiliary layer 114-1 and the second auxiliary layer 114-2 may provide a resonance pathway for maximally efficiently extracting the first light emitted from the first emission layer 113-1 and the second light emitted from the second emission layer 113-2 to outside of the organic light emitting diode 100 by constructive interference. The first auxiliary layer 114-1 and the second auxiliary layer 114-2 may include a material included in the hole transport layer 107, but are not limited thereto. The first auxiliary layer 114-1 and the second auxiliary layer 114-2 may be each independently a single layer, or a multi-layer, each layer including a different material, but are not limited thereto.

The methods of forming the first auxiliary layer 114-1, the first emission layer 113-1, the second auxiliary layer 114-2, the second emission layer 113-2, and the layer for improving third colored light efficiency 114-3, and the third emission layer have already been described above in relation to the method of forming the hole transport layer 107.

The first auxiliary layer 114-1 and the first emission layer 113-1 may be simultaneously formed by using thermal imaging (for example, LITI (Laser Induced Thermal Imaging)), the second auxiliary layer 114-2 and the second emission layer 113-2 are simultaneously formed by using thermal imaging, and the layer for improving third colored light efficiency 114-3 and the third emission layer 113-3 are formed simultaneously by using thermal imaging, but are not limited thereto.

At least one of the hole transport layer 107, the first auxiliary layer 114-1, the second auxiliary layer 114-2 and the layer for improving third colored light efficiency 114-3 may further include a charge-generating material for improving conductivity and the like. For example, the hole transport layer 107 may further include the charge-generating material.

The charge-generating material may be, for example, a p-dopant. The hole transport layer 107 may further include the p-dopant.

The p-dopant may be one of quinone derivatives, metal oxides, and compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 700 below, but are not limited thereto.

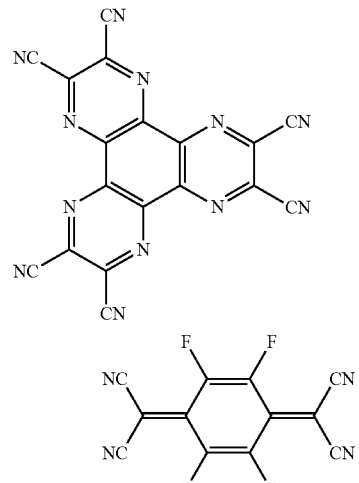

<Compound 700>

<F4-TCNQ>

When at least one of the hole transport layer 107, the first auxiliary layer 114-1, the second auxiliary layer 114-2, and the layer for improving third colored light efficiency 114-3 further includes the charge-generating material, the charge-generating material may be homogeneously dispersed or inhomogeneously distributed in the hole transport layer 107, the first auxiliary layer 114-1, the second auxiliary layer 114-2 and/or the layer for improving the third colored light 114-3.

The electron transport layer 115 may include an electron transport material represented by Formula 10A, 10B, 10C, and 20A:

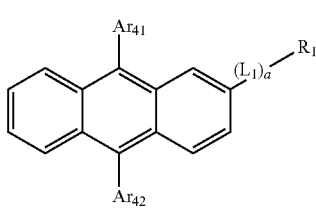

<Formula 10A>

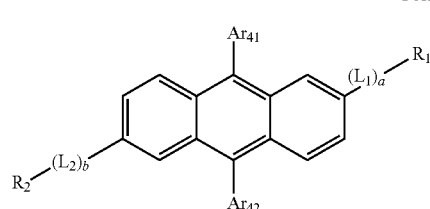

<Formula 10B>

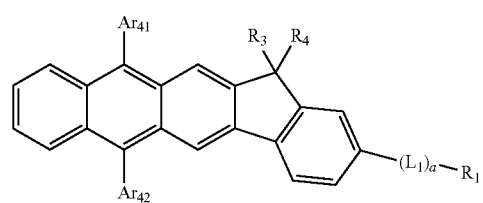

<Formula 10C>

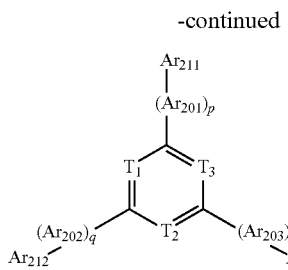

<Formula 20A>

In Formulas 10A to 10C, $Ar_{41}$ and $Ar_{42}$ may be each independently a substituted or unsubstituted $C_6$-$C_{60}$ aryl group or a substituted or unsubstituted $C_2$-$C_{60}$ heteroaryl group.

For example, $Ar_{41}$ and $Ar_{42}$ may be each independently,
a $C_6$-$C_{60}$ aryl group and a $C_2$-$C_{60}$ heteroaryl group; and
a $C_6$-$C_{60}$ aryl group and a $C_2$-$C_{60}$ heteroaryl group, substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkinyl group, a $C_6$-$C_{60}$ aryl group and a $C_2$-$C_{60}$ heteroaryl group.

For example, $Ar_{41}$ and $Ar_{42}$ may be each independently,
a phenyl group, a naphthyl group, an anthryl group, a pyrenyl group, a fluorenyl group, a pyridinyl group, a pyrazinyl group and a pyrimidinyl group; and
a phenyl group, a naphthyl group, an anthryl group, a pyrenyl group, a fluorenyl group, a pyridinyl group, a pyrazinyl group and a pyrimidinyl group, substituted with at least one of a phenyl group, a naphthyl group, an anthryl group, a pyrenyl group, a fluorenyl group, a pyridinyl group, a pyrazinyl group and a pyrimidinyl group.

$Ar_{41}$ and $Ar_{42}$ may be the same, but are not limited thereto.

In Formulae 10A to 10C, $L_1$ and $L_2$ may be each independently, a substituted or unsubstituted $C_6$-$C_{60}$ arylene group or a substituted or unsubstituted $C_2$-$C_{60}$ heteroarylene group.

For example, $L_1$ and $L_2$ may be each independently
a $C_6$-$C_{60}$ arylene group and a $C_2$-$C_{60}$ heteroarylene group; and
a $C_6$-$C_{60}$ arylene group and a $C_2$-$C_{60}$ heteroarylene group, substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkinyl group, a $C_6$-$C_{60}$ aryl group and a $C_2$-$C_{60}$ heteroaryl group.

For example, $L_1$ and $L_2$ may be each independently,
a phenylene group, a naphthylene group, an anthrylene group, a pyrenylene group, a fluolenylene group, a pyridinylene group, a pyrazinylene group and a pyrimidinyl group; and
a phenylene group, a naphthylene group, an anthrylene group, a pyrenylene group, a fluolenylene group, a pyridinylene group, a pyrazinylene group and a pyrimidinyl group, substituted with at least one of a phenyl group, a naphthyl group, an anthryl group, a pyrenyl group, a fluorenyl group, a pyridinyl group, a pyrazinyl group and a pyrimidinyl group.

In Formulae 10A to 10C, a and b may be each independently, 0, 1 or 2. For example, in Formulae 10A to 10C, a and b may be each independently 0 or 1.

In Formulae 10A to 10C, $R_1$ and $R_2$ may be each independently, a substituted or unsubstituted benzimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group or a substituted or unsubstituted phenanthrenyl group.

For example, in Formulae 10A to 10C, $R_1$ and $R_2$ may be, each independently,
a benzimidazolyl group, a benzoxazolyl group, a benzothiazolyl group, a benzopyrimidinyl group, an imidazopyridinyl group, a quinolinyl group, an isoquinolinyl group, a quinazolyl group, a pyridinyl group, a pyrimidinyl group, a pyrazinyl group, a phenyl group, a naphthyl group, a pyrenyl group, a chrysenyl group, a fluorenyl group and a phenanthrenyl group; and
a benzimidazolyl group, a benzoxazolyl group, a benzothiazolyl group, a benzopyrimidinyl group, an imidazopyridinyl group, a quinolinyl group, an isoquinolinyl group, a quinazolyl group, a pyridinyl group, a pyrimidinyl group, a pyrazinyl group, a phenyl group, a naphthyl group, a pyrenyl group, a chrysenyl group, a fluorenyl group and a phenanthrenyl group, substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_2$-$C_{60}$ alkenyl group, a $C_2$-$C_{60}$ alkinyl group, a $C_6$-$C_{60}$ aryl group and a $C_2$-$C_{60}$ heteroaryl group.

In Formula 10C, $R_3$ and $R_4$ may be each independently,
a $C_1$-$C_{20}$ alkyl group and a $C_6$-$C_{20}$ aryl group; and
a $C_1$-$C_{20}$ alkyl group and a $C_2$-$C_{20}$ aryl group, substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof and a phosphoric acid group or a salt thereof. For example, $R_3$ and $R_4$ may be each independently, a methyl group, an ethyl group, a propyl group, a butyl group, a pentyl group, a hexyl group, a phenyl group or a naphthyl group, but are not limited thereto.

For example, $R_1$ and $R_2$ may be each independently, at least one of Formulae 11(1) to 11(24), but are not limited thereto:

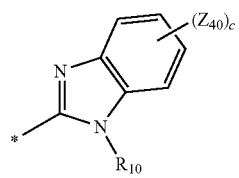

Formula 11 (1)

-continued
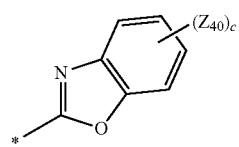
Formula 11 (2)
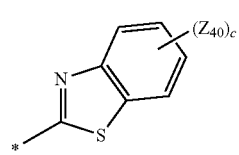
Formula 11 (3)
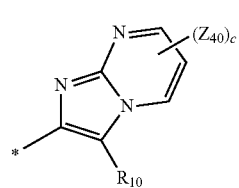
Formula 11 (4)
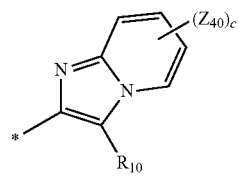
Formula 11 (5)
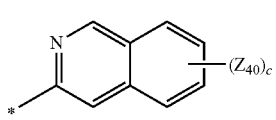
Formula 11 (6)
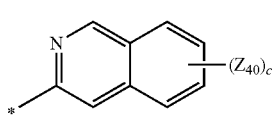
Formula 11 (7)
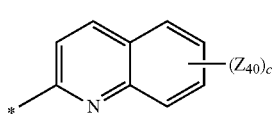
Formula 11 (8)
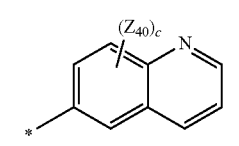
Formula 11 (9)
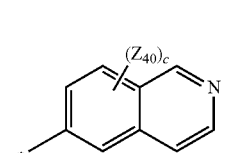
Formula 11 (10)
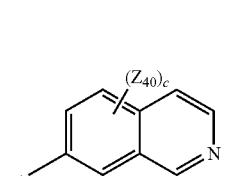
Formula 11 (11)
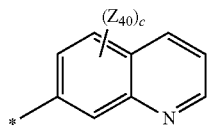
Formula 11 (12)
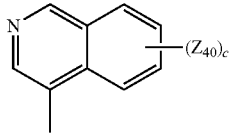
Formula 11 (13)
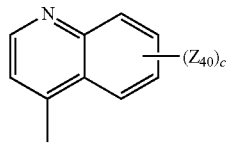
Formula 11 (14)
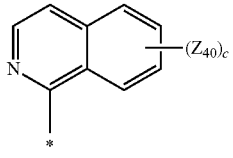
Formula 11 (15)
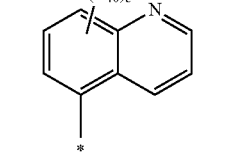
Formula 11 (16)
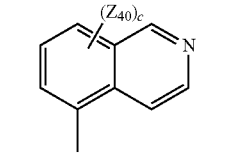
Formula 11 (17)
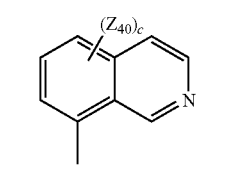
Formula 11 (18)
Formula 11 (19)
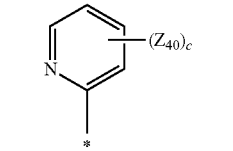
Formula 11 (20)

-continued

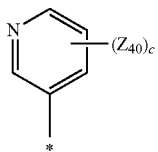
Formula 11 (21)

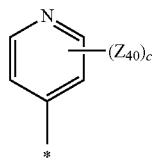
Formula 11 (22)

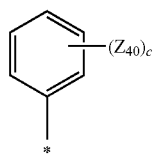
Formula 11 (23)

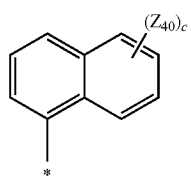
Formula 11 (24)

In Formulae 11(1) to 11(24), $R_{10}$ is a substituted or unsubstituted $C_1$-$C_{60}$ alkyl group or a substituted or unsubstituted $C_6$-$C_{60}$ aryl group;

$Z_{40}$ is a hydrogen atom, a deuterium atom, —F, —Cl, —Br, —I, —CN, a hydroxyl group, —NO$_2$, an amino group, an amidino group, a hydrazine group, a hydrazone, a carboxyl group or a salt thereof, a sulfonic acid group or a salt thereof, a phosphoric acid group or a salt thereof, a $C_1$-$C_{60}$ alkyl group, a $C_1$-$C_{60}$ alkoxy group, a $C_6$-$C_{60}$ aryl group and a $C_2$-$C_{60}$ heteroaryl group; and a $C_1$-$C_{60}$ alkyl group, a $C_1$-$C_{60}$ alkoxy group, a $C_6$-$C_{60}$ aryl group and a $C_2$-$C_{60}$ heteroaryl group, substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof and a phosphoric acid group or a salt thereof;

c is an integer of 1 to 5.

For example, $R_{10}$ is a methyl group, an ethyl group, a propyl group, a butyl group, a pentyl group, a hexyl group, a heptyl group, an octyl group, a phenyl group, a naphthyl group, an anthryl group, a fluorenyl group and a phenanthrenyl group; and a methyl group, an ethyl group, a propyl group, a butyl group, a pentyl group, a hexyl group, a heptyl group, an octyl group, a phenyl group, a naphthyl group, an anthryl group, a fluorenyl group and a phenanthrenyl group, substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof and a phosphoric acid group or a salt thereof.

The electron transport material may be an anthracene-based compound represented by Formulae 10A(1) to 10A(12), 10B(1) to 10B(12), and 10C(1) to 10C(6), but is not limited thereto:

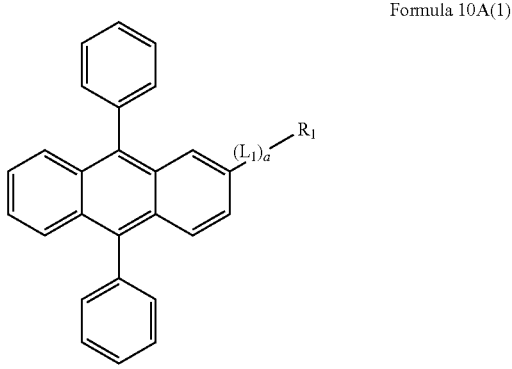
Formula 10A(1)

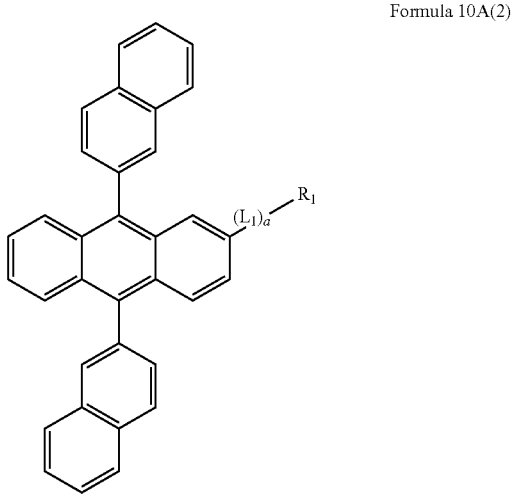
Formula 10A(2)

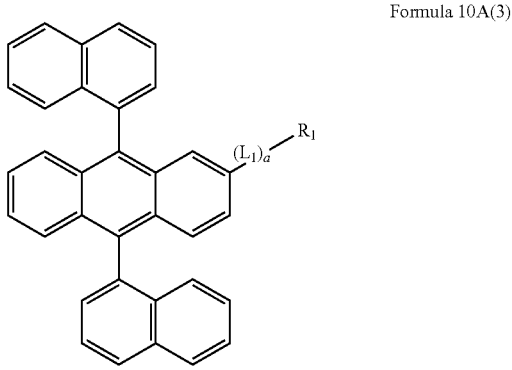
Formula 10A(3)

Formula 10A(4)
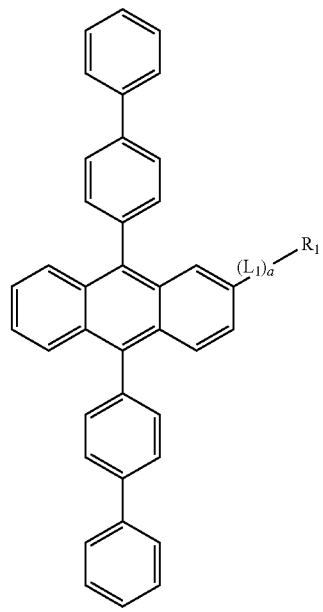
Formula 10A(5)
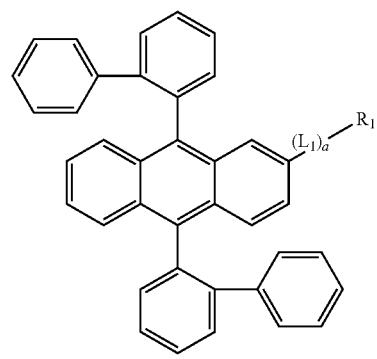
Formula 10A(6)
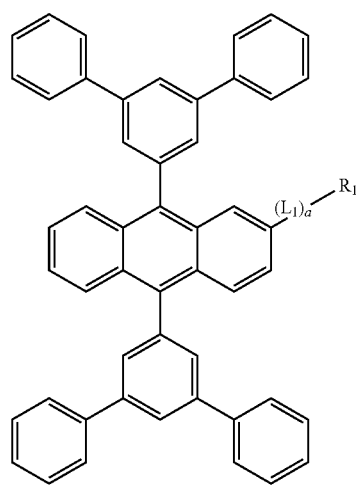
Formula 10A(7)
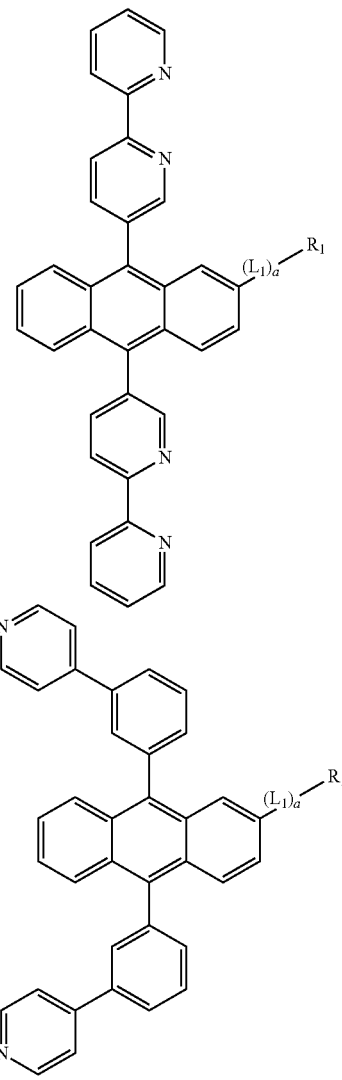
Formula 10A(8)
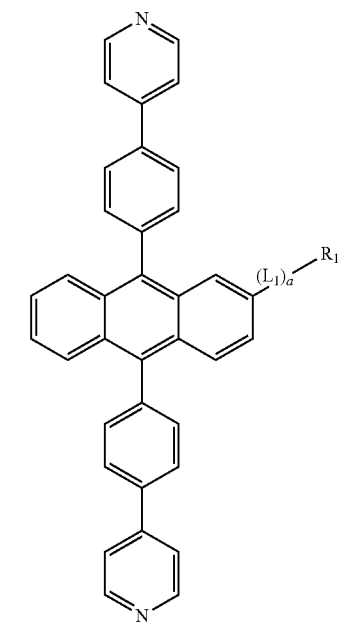
Formula 10A(9)

-continued
Formula 10A(10)
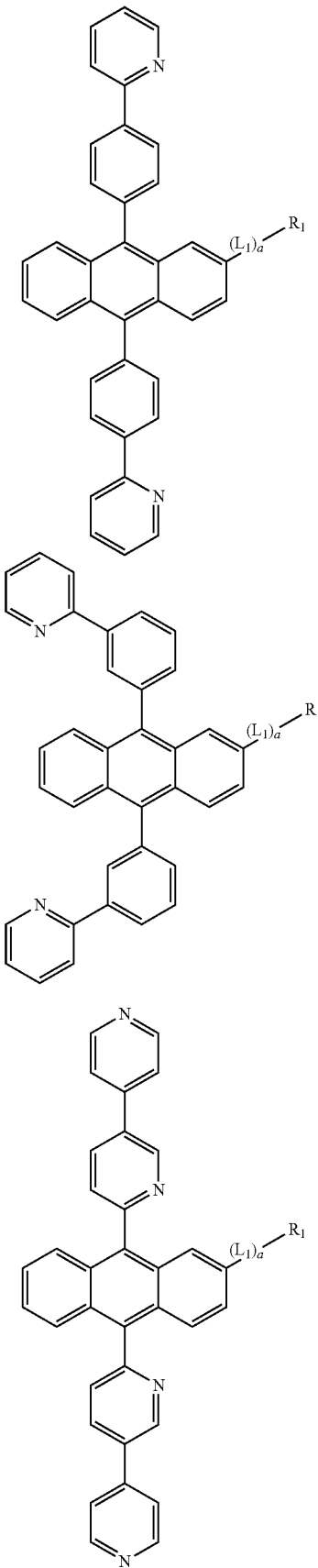
Formula 10A(11)
Formula 10A(12)
-continued
Formula 10B(1)
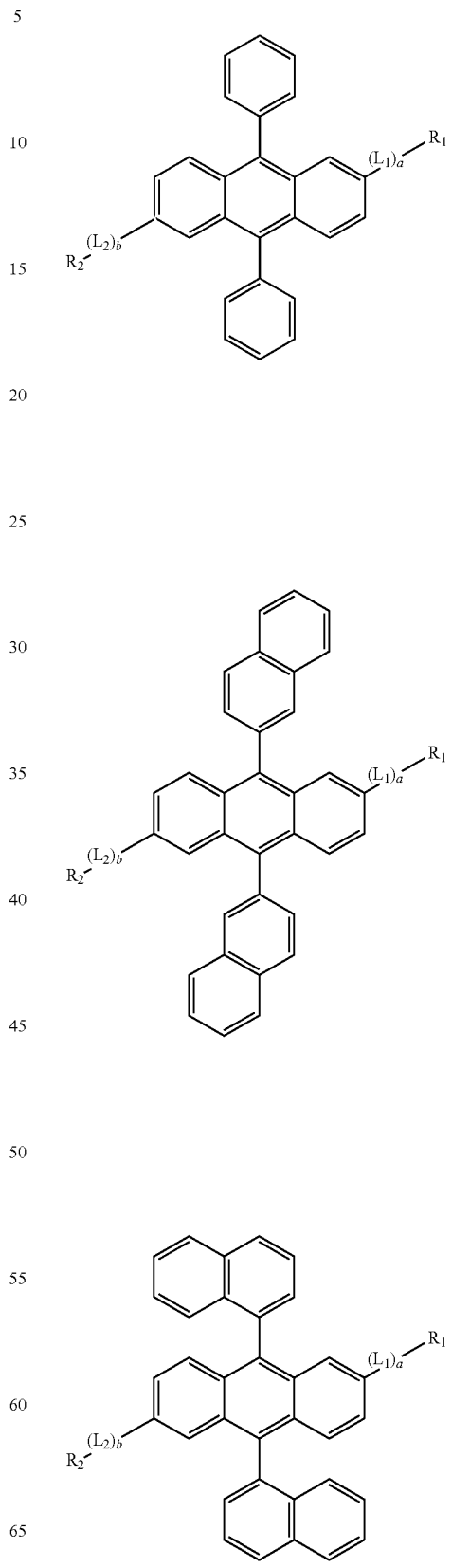
Formula 10B(2)
Formula 10B(3)

Formula 10B(4)
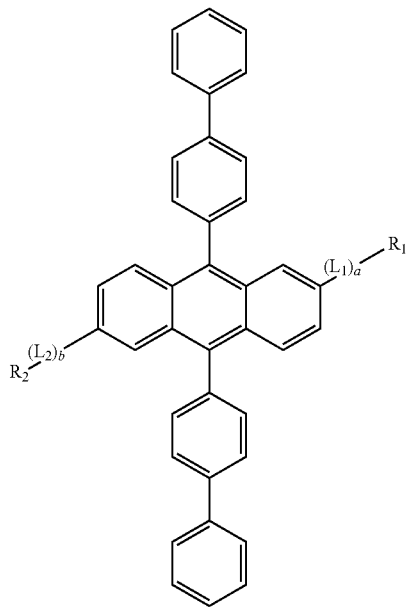
Formula 10B(5)
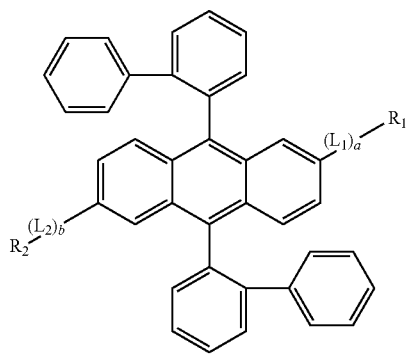
Formula 10B(6)
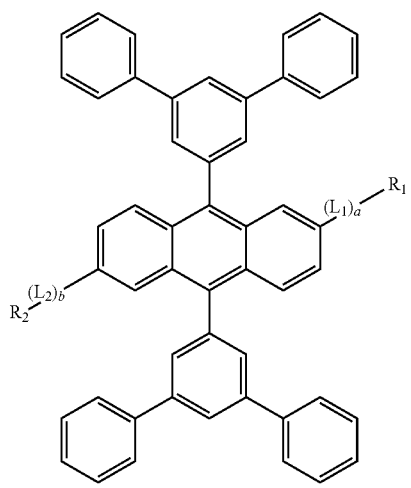
Formula 10B(7)
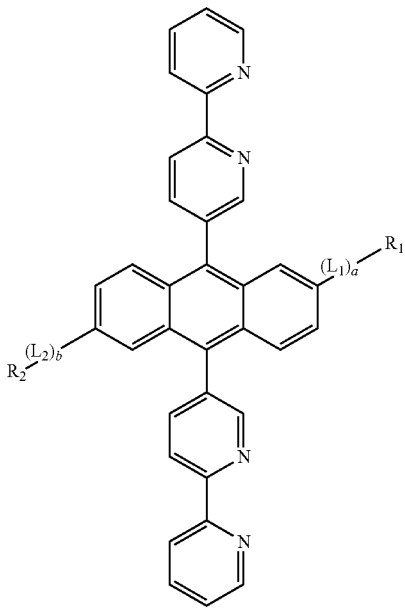
Formula 10B(8)
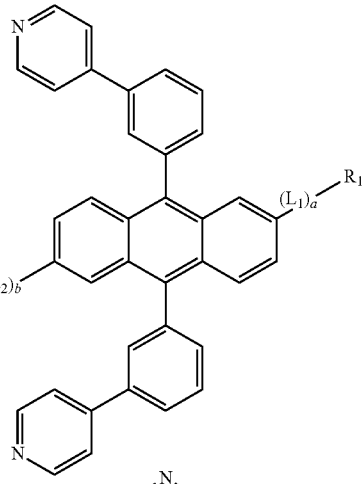
Formula 10B(9)
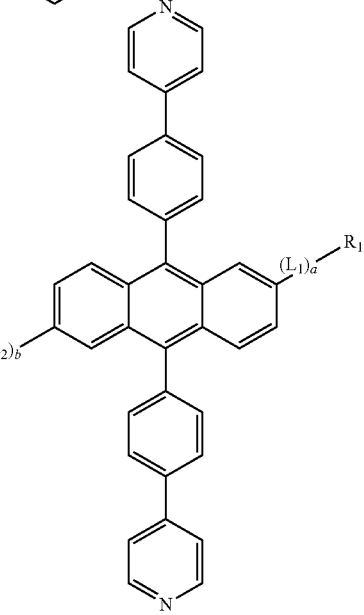

Formula 10B(10)
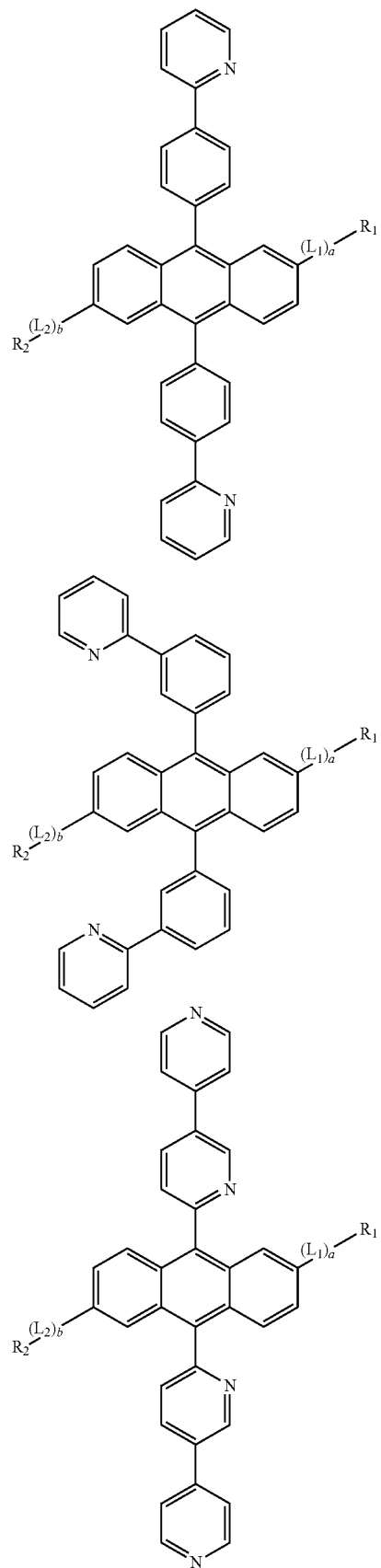
Formula 10B(11)
Formula 10B(12)
Formula 10C(1)
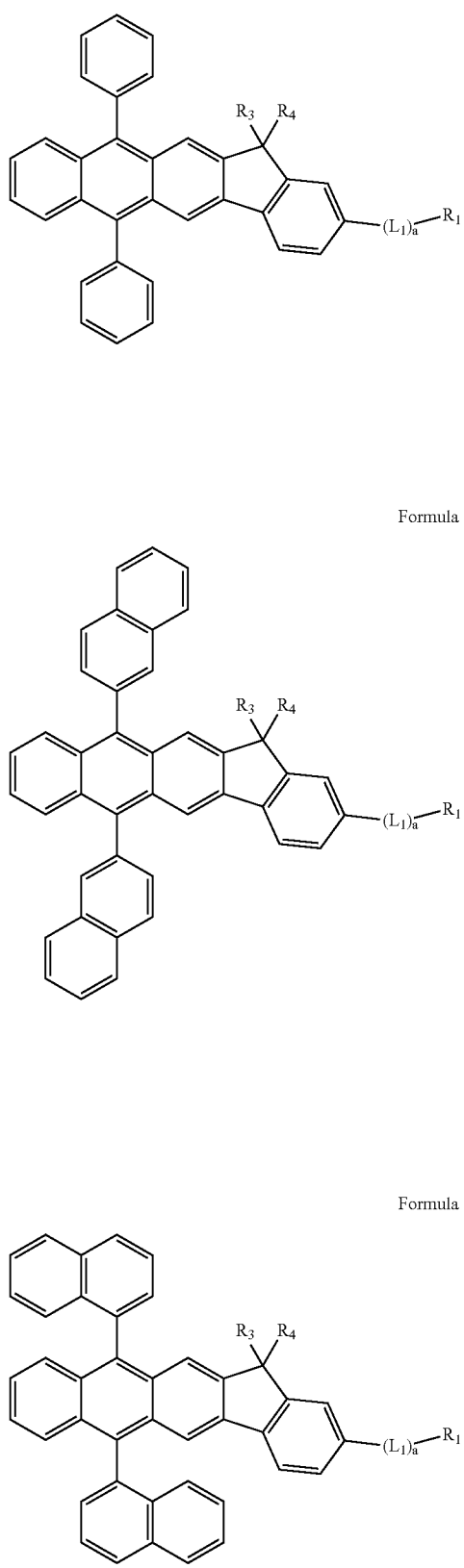
Formula 10C(2)
Formula 10C(3)

-continued

Formula 10C(4)

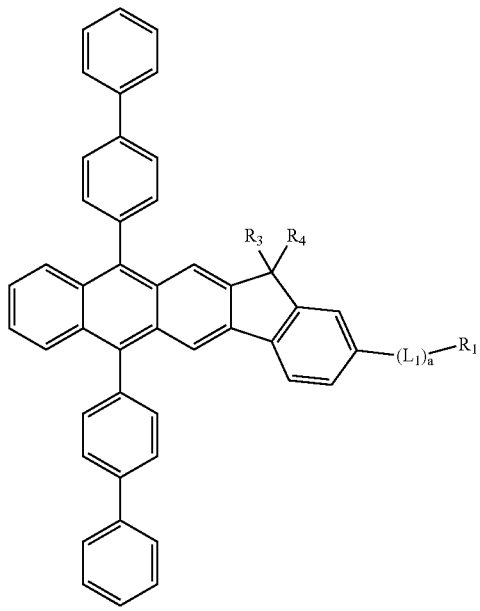

Formula 10C(5)

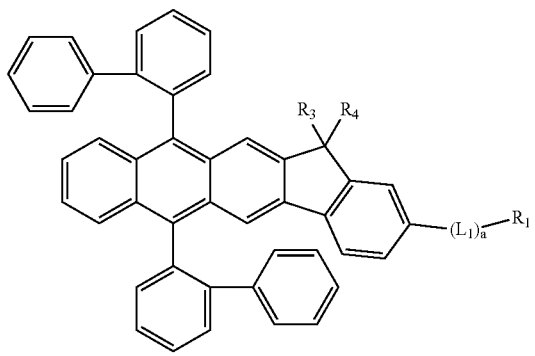

Formula 10C(6)

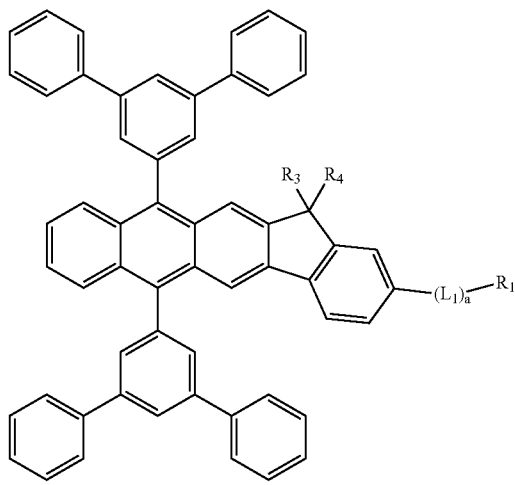

Descriptions of $L_1$, $L_2$, a, b and $R_1$ to $R_4$ of Formulae 10A(1) to 10A(12), 10B(1) to 10B(12) and 10C(1) to 10C(6) have already been given above.

In some embodiments, the electron transport material may include an anthracene-based compound represented by Formulae 10A(1) to 10A(6), 10B(1) to 10B(6) and 10C(1) to 10C(6), and $R_1$ and $R_2$ of Formulae 10A(1) to 10A(6), 10B(1) to 10B(6) and 10C(1) to 10C(6) may be each independently, a substituted or unsubstituted benzimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolyl group, a substituted or unsubstituted pyridinyl group, a substituted or unsubstituted pyrimidinyl group, or a substituted or unsubstituted pyrazinyl group (for example, one of Formulae 11(1) to 11(22)).

In other embodiments, the electron transport material includes an anthracene-based compound represented by one of Formulae 10A(1) to 10A(6), 10B(1) to 10B(6) and 10C(1) to 10C(6), and $R_1$ and $R_2$ of Formulae 10A(1) to 10A(6), 10B(1) to 10B(6) and 10C(1) to 10C(6) may be each independently, a substituted or unsubstituted benzimidazolyl group, a substituted or unsubstituted benzoxazolyl group, or a substituted or unsubstituted benzothiazolyl group (for example, one of Formulae 11(1) to 11(3)).

In other embodiments, the electron transport material may include an anthracene-based compound represented by one of Formulae 10A(7) to 10A(12) and 10B(7) to 10B(12), and $R_1$ and $R_2$ of Formulae 10A(7) to 10A(12) and 10B(7) to 10B(12) may be each independently, a substituted or unsubstituted phenyl group or a substituted or unsubstituted naphthyl group (for example, Formula 11(23) or 11(24)), but are not limited thereto.

The electron transport material may be one of Compounds 200 to 210, but is not limited thereto:

<Compound 200>

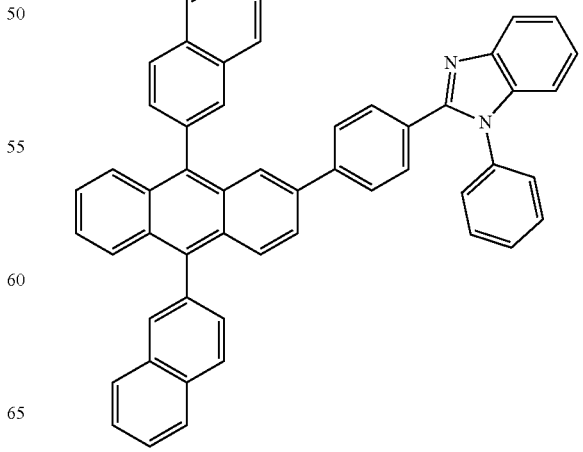

<Compound 201>
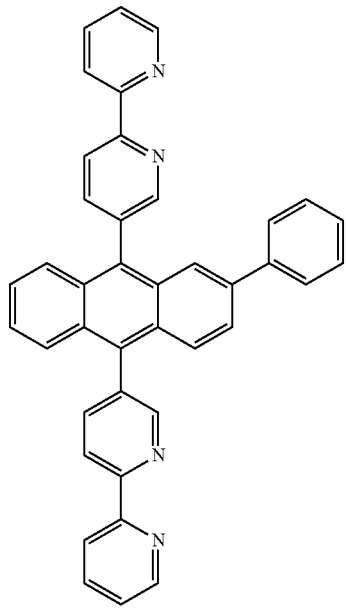
<Compound 204>
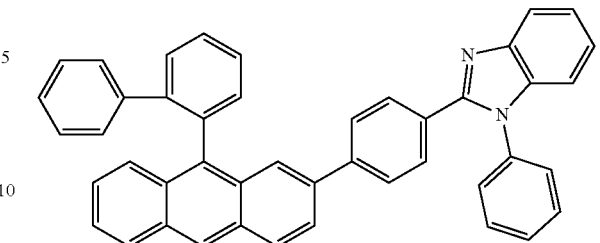
<Compound 205>
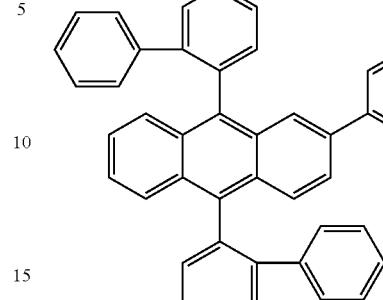
<Compound 202>
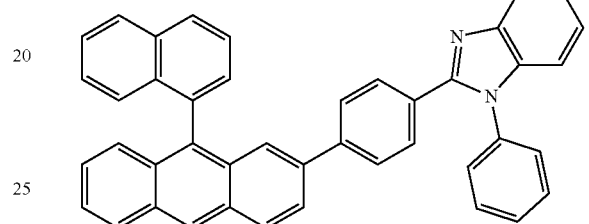
<Compound 206>
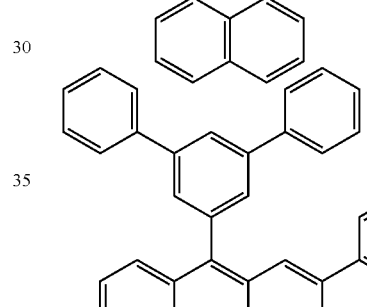
<Compound 203>
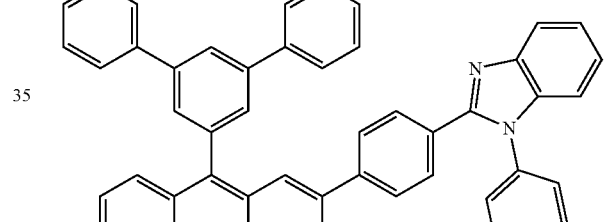
<Compound 207>
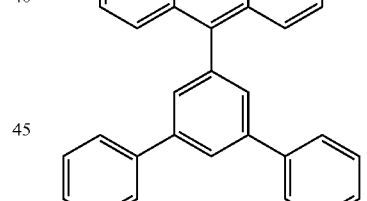
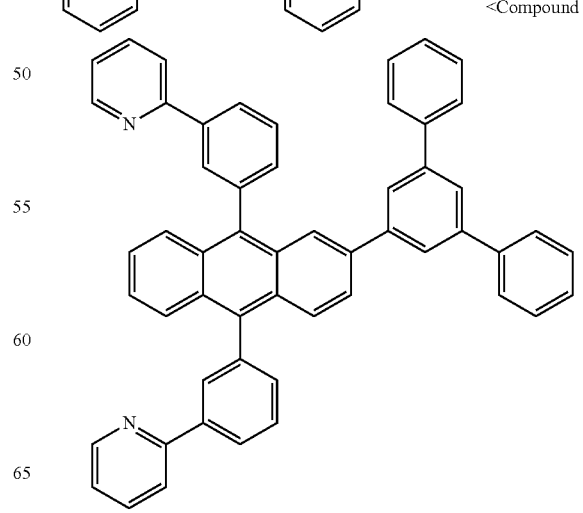

-continued

<Compound 208>

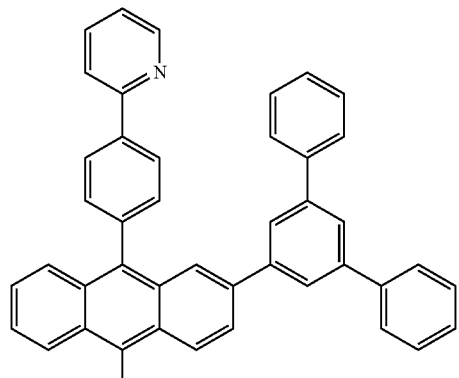

<Compound 209>

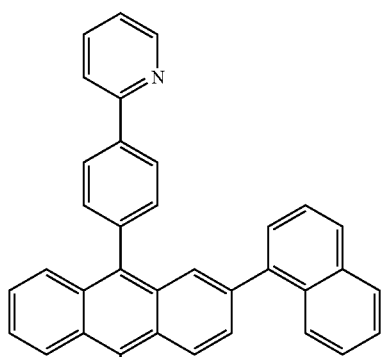

<Compound 210>

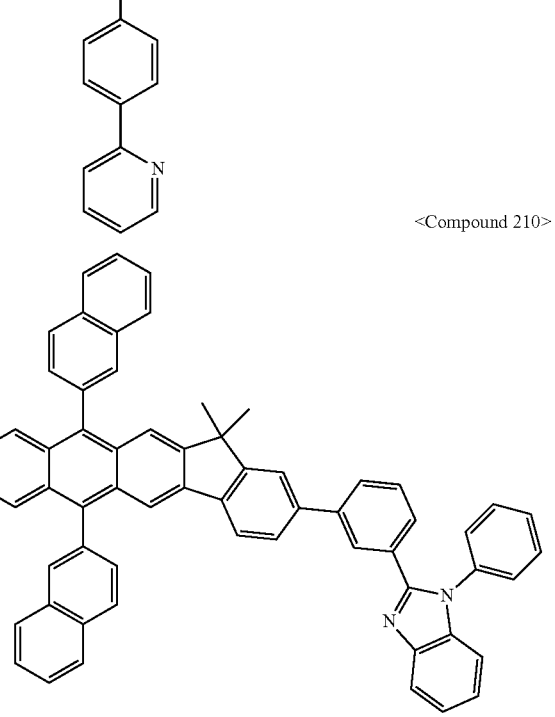

In Formula 20A, $T_1$ to $T_3$ may all be N; $T_1$ may be $C(R_{100})$, $T_2$ and $T_3$ may be N; $T_1$ to $T_3$ may all be $C(R_{100})$, but are not limited thereto.

In Formula 20A, $Ar_{201}$ to $Ar_{203}$ may be each independently, a substituted or unsubstituted $C_6$-$C_{60}$ arylene group or a substituted or unsubstituted $C_2$-$C_{60}$ heteroarylene group.

$Ar_{201}$ to $Ar_{203}$ may be each independently, a phenylene group, a naphthylene group, an anthrylene group, a pyrenylene group, a fluolenylene group, a pyridinylene group, a pyrazinylene group and a pyrimidinyl group; and a phenylene group, a naphthylene group, an anthrylene group, a pyrenylene group, a fluolenylene group, a pyridinylene group, a pyrazinylene group and a pyrimidinyl group, substituted with at least one of a phenyl group, a naphthyl group, an anthryl group, a pyrenyl group, a fluorenyl group, a pyridinyl group, a pyrazinyl group, and a pyrimidinyl group, but are not limited thereto.

In Formula 20A, p, q and r may be each independently, 0, 1 or 2. For example, in Formula 20A, p, q and r may be each independently, 0 or 1, but are not limited thereto.

In Formula 20A, $Ar_{211}$ to $Ar_{213}$ may be each independently, a substituted or unsubstituted $C_6$-$C_{60}$ aryl group or a substituted or unsubstituted $C_2$-$C_{60}$ heteroaryl group.

For example, $Ar_{211}$ to $Ar_{213}$ may be each independently, a substituted or unsubstituted benzimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group, or a substituted or unsubstituted phenanthrenyl group.

In some embodiments, $Ar_{211}$ to $Ar_{213}$ may be each independently one of Formula 11(1) to 11(26), but are not limited thereto:

Formula 11(1)

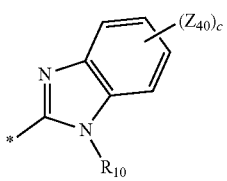

Formula 11(2)

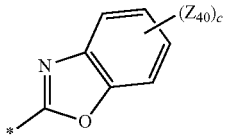

Formula 11(3)

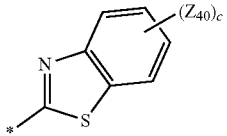

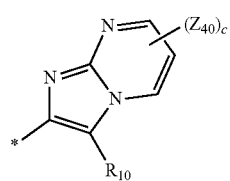
Formula 11(4)
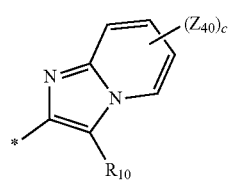
Formula 11(5)
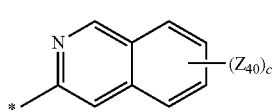
Formula 11(6)
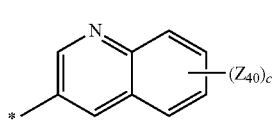
Formula 11(7)
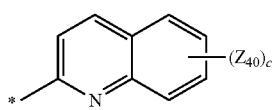
Formula 11(8)
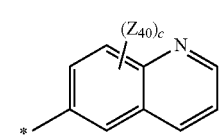
Formula 11(9)
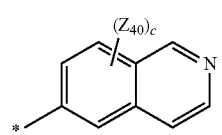
Formula 11(10)
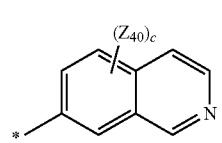
Formula 11(11)
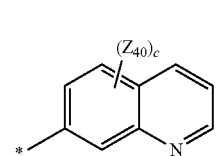
Formula 11(12)
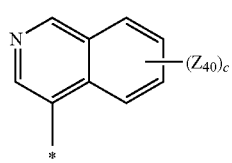
Formula 11(13)
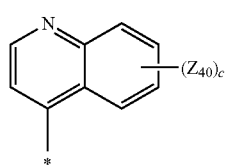
Formula 11(14)
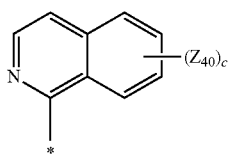
Formula 11(15)
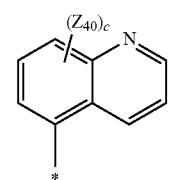
Formula 11(16)
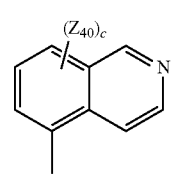
Formula 11(17)
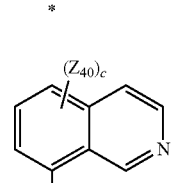
Formula 11(18)
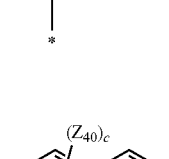
Formula 11(19)
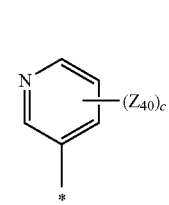
Formula 11(20)
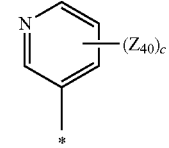
Formula 11(21)

Formula 11(22)
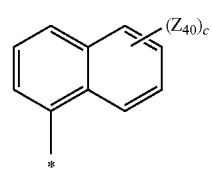

Formula 11(23)
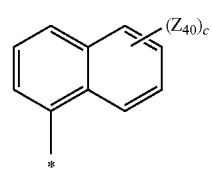

Formula 11(24)
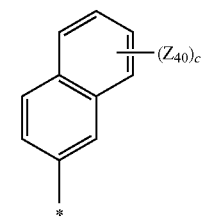

Formula 11(25)
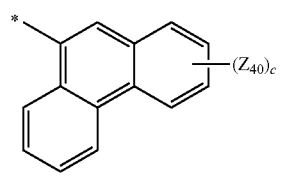

Formula 11(26)
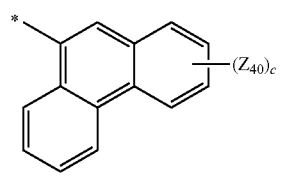

Descriptions of $R_{10}$, $Z_{40}$ and c of Formula 11(1) to 11(26) have already been given above.

For example, at least one of $Ar_{211}$ to $Ar_{213}$ of Formula 20A may be a substituted or unsubstituted phenanthrenyl group.

In some embodiments, the electron transport material may include a compound represented by at least one of Formula 20A(1) to 20A(3), but is not limited thereto:

<Formula 20A(1)>
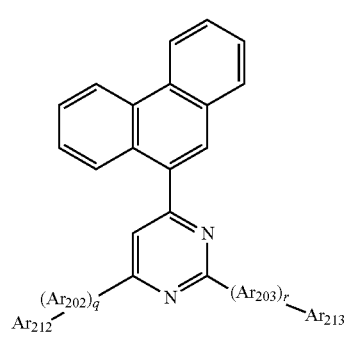

<Formula 20A(2)>

<Formula 20A(3)>

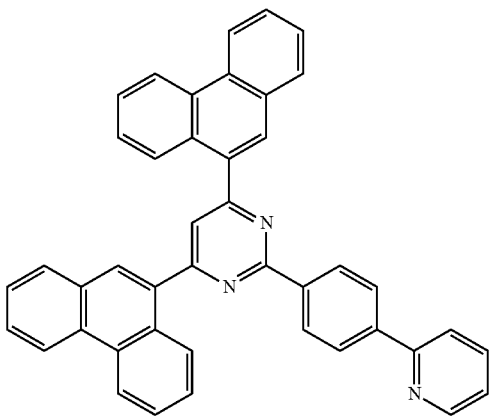

Descriptions of $Ar_{202}$, $Ar_{203}$, q, r, $Ar_{212}$ and $Ar_{213}$ of Formulae 20A(1) to 20A(3) are as follows.

In some embodiments, the electron transport material may be one of Compounds 600 to 605 below, but is not limited thereto:

<Compound 600>

<Compound 601>

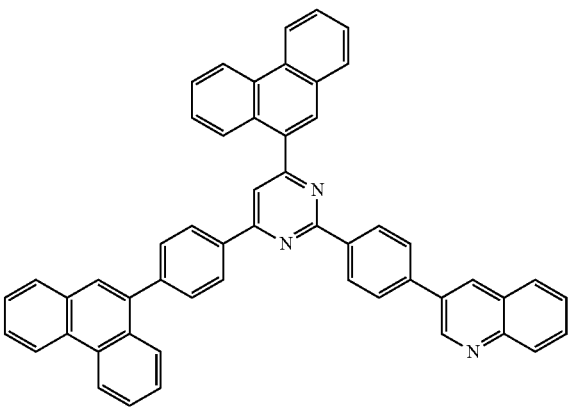

<Compound 602>

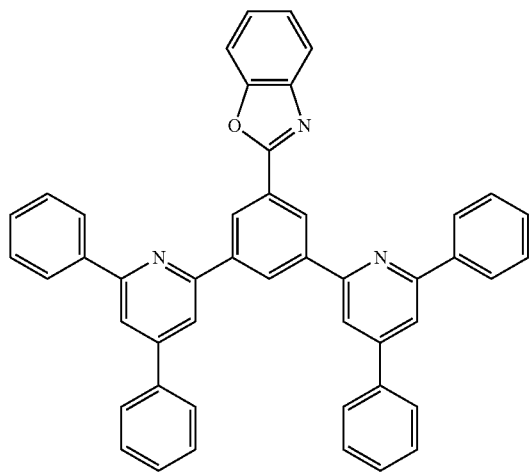

<Compound 603>

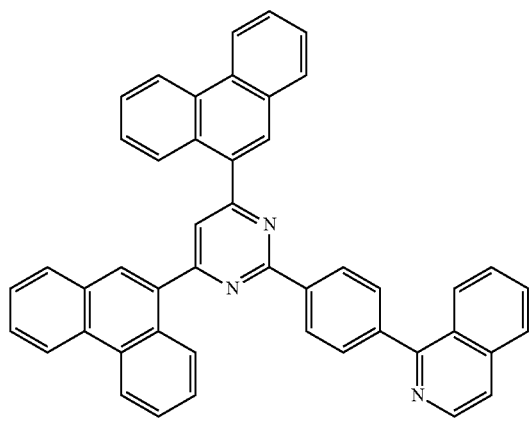

<Compound 604>

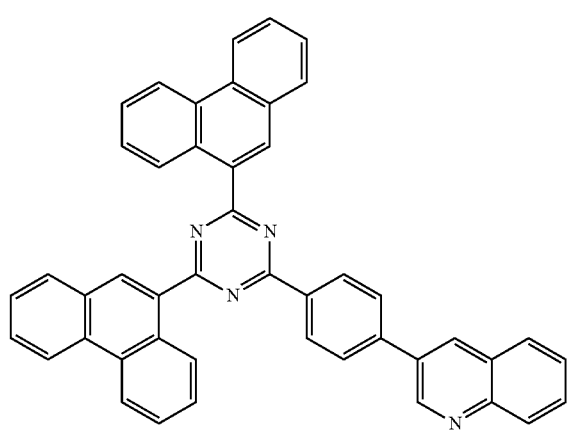

<Compound 605>

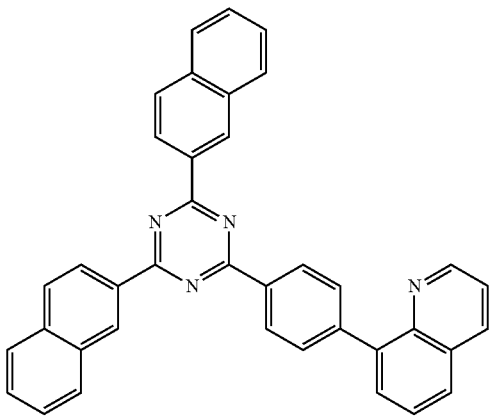

In some embodiments, the electron transport layer may further include a metal-containing material, in addition to any known electron-transporting organic compound.

The metal-containing material may include a lithium ($L_1$) complex. Non-limiting examples of the $L_1$ complex are lithium quinolate (LiQ) and Compound 203 below:

<Compound 203>

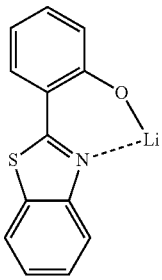

A thickness of the electron transport layer may be from about 300 Å to about 500 Å, and in some embodiments, may be from about 300 Å to about 400 Å. When the thickness of the electron transport layer is within these ranges, the electron transport layer may have a satisfactory electron transporting ability without a substantial increase in driving voltage.

In other embodiments, an electron injecting layer 117 that is a material for easily injecting electrons from the second electrode 119 may be laminated on the electron transport layer 115, and any material may be used for the electron injecting layer 117.

Any known material may be used for forming the electron injecting layer 117, such as LiF, NaCl, CsF, $Li_2O$, BaO, and the like. The vacuum deposition conditions may vary according to the compound. However, in general, a range of conditions almost identical to those for forming the hole transport layer 107 may be selected.

The thickness of the electron injecting layer 117 may be from about 1 Å to about 100 Å, and in some embodiments, may be from about 3 Å to about 90 Å. When the thickness of the electron injecting layer 117 is within these ranges, satisfactory electron injecting capabilities may be obtained without a substantial increase in driving voltage.

The second electrode 119 is formed on the electron injecting layer 117. The second electrode 119 may be a cathode that is an electron injecting electrode. In this regard, the second electrode 119 may be formed of lithium (Li), magnesium (Mg), aluminum (Al group, aluminum (Al group-lithium (Li), calcium (Ca), magnesium (Mg)-indium (In), magnesium (Mg)-silver (Ag), and the like, and may be formed as a thin film to obtain a transmission electrode. In some embodiments, to manufacture a top-emission light-emitting diode, the transmission electrode may be formed of indium tin oxide (ITO) or indium zinc oxide (IZO).

The first electrode 103 and the second electrode 119 may be selected such that the organic light emitting diode 110 may have a resonance structure. For example, when the first electrode 103 is a reflective electrode and the second electrode 119 is a semi-transmissive electrode, the organic light emitting diode 100 may become a bottom emission diode having a resonance structure.

For example, when the first electrode 103 is a reflective electrode and the second electrode 119 is a semi-transmissive electrode, the organic light emitting diode 100 may satisfy Equations 1, 2, and 3 such that the first colored light, the second colored light, and the third colored light may resonate between the first electrode 103 that is a reflective electrode and the second electrode 119 that is the semi-transmissive electrode:

$$\frac{\lambda_1}{2n_1} \cdot m_1 - \frac{\lambda_1}{10} \leq L_1 \leq \frac{\lambda_1}{2n_1} \cdot m_1 + \frac{\lambda_1}{10} \qquad \langle\text{Equation 1}\rangle$$

$$\frac{\lambda_2}{2n_2} \cdot m_2 - \frac{\lambda_2}{10} \leq L_2 \leq \frac{\lambda_2}{2n_2} \cdot m_2 + \frac{\lambda_2}{10} \qquad \langle\text{Equation 2}\rangle$$

$$\frac{\lambda_3}{2n_3} \cdot m_3 - \frac{\lambda_3}{10} \leq L_3 \leq \frac{\lambda_3}{2n_3} \cdot m_3 + \frac{\lambda_3}{10} \qquad \langle\text{Equation 3}\rangle$$

wherein, in Equations 1 to 3, $L_1$ is a distance between the first electrode and the second electrode of the first subpixel;

$L_2$ is a distance between the first electrode and the second electrode of the second subpixel;

$L_3$ is a distance between the first electrode and the second electrode of the third subpixel;

$\lambda_1$, $\lambda_2$ and $\lambda_3$ are wavelengths of the first colored light, the second colored light, and the third colored light, respectively;

$n_1$ is a refractive index of layers between the first electrode and the second electrode of the first subpixel;

$n_2$ is a refractive index of layers between the first electrode and the second electrode of the second subpixel;

$n_3$ is a refractive index of layers between the first electrode and the second electrode of the third subpixel; and $m_1$, $m_2$ and $m_3$ may be each independently, a natural number.

When the organic light emitting diode 100 satisfies the equations 1, 2, and 3, the first colored light, the second colored light, and the third colored light may be extracted to outside of the organic light emitting diode 100 through the second electrode 119 by constructive interference with a resonance between the first electrode 103 and the second electrode 119. Accordingly, efficiency of the organic light emitting diode 100 may improve.

$m_1$, $m_2$ and $m_3$ of the Equations 1, 2 and 3 may be 1.

In Equations 1, 2 and 3, when $m_1$, $m_2$ and $m_3$ are 1, a distance ($D_1$) between the first electrode of the first subpixel and the first emission layer 113-1 may be about 400 Å to about 1000 Å, and in some embodiments, about 500 Å to about 900 Å, a distance ($D_2$) between the first electrode 103 of the second subpixel and the second emission layer 113-2 may be about 300 Å to about 900 Å, and in some embodiments, may be about 400 Å to about 800 Å, and a distance ($D_3$) between the first electrode 103 of the third subpixel and the third emission layer 113-3 may be about 200 Å to about 800 Å, and in some embodiments, about 300 Å to about 700 Å, but are not limited thereto.

In some embodiments, in the Equations 1, 2 and 3, $m_1$, $m_2$ and $m_3$ may be 2.

In the Equations 1, 2 and 3, when $m_1$, $m_2$ and $m_3$ are 2, a distance ($D_1$) between the first electrode of the first subpixel and the first emission layer 113-1 may be about 1600 Å to about 2300 Å, for example, about 1700 Å to about 2100 Å, a distance ($D_2$) between the first electrode 103 of the second subpixel and the second emission layer 113-2 may be about 1300 Å to about 2000 Å, for example, about 1400 Å to about 1900 Å, and a distance ($D_3$) between the first electrode 103 of the third subpixel and the third emission layer 113-3 may be about 900 Å to about 1800 Å, for example, about 1000 Å to about 1600 Å.

When $D_1$, $D_2$ and $D_3$ satisfy the above ranges, optimal constructive interference may occur during resonance of each colored light. Furthermore, the organic light emitting diode emits light when excitons are irradiated. Irradiation of the exciton may be regarded as an electric dipole radiation. A weak microcavity phenomenon occurs when a damping rate of a dipole changes due to an effect of an image dipole induced by a strong reflective body when the electric dipole radiation is located from the strong reflective body at a shorter distance than a wavelength of light to be emitted from the electric dipole radiation and a phenomenon of a change in the strength of irradiation. When the ranges of $D_1$, $D_2$ and $D_3$ are satisfied, efficiency of the first colored light, the second colored light and the third colored light may increase due to the microcavity.

$D_1$, $D_2$ and $D_3$ may have a relationship of $D_1 > D_2 = D_3$.

Figure 2:
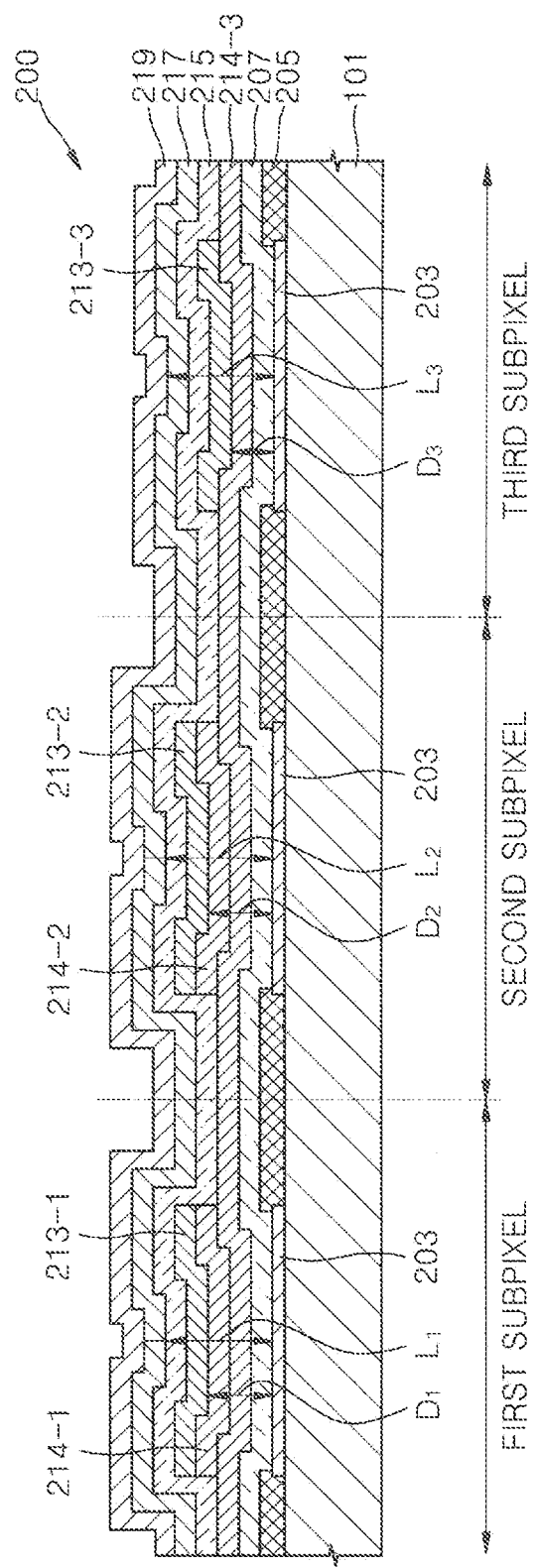
FIG. 2 schematically illustrates an organic light emitting diode according to another embodiment.

FIG. 2 schematically illustrates an organic light emitting diode according to another embodiment.

A substrate 201 of the organic light emitting diode 200 of FIG. 2 includes a first subpixel, a second subpixel, and a third subpixel.

A plurality of first electrodes 203 are disposed as separate patterns in the first subpixel, the second subpixel and the third subpixel, respectively. The hole transport layer 207 is disposed as a common layer on the plurality of first electrodes 203.

An emission layer including an emission layer 213-1, a second emission layer 213-2, and a third emission layer 213-1 is formed on the hole transport layer 207.

The emission layer including the first emission layer 213-1, the second emission layer 213-2 and the third emission layer 213-3 on the hole transport layer 207. The first emission layer 213-1 emitting the first colored light is patterned to be formed in the first subpixel, the second emission layer 213-2 emitting the second colored light is patterned to be formed in the second subpixel, and the third emission layer 213-3 emitting the third colored light is patterned to be formed in the third subpixel.

A first auxiliary layer 214-1 patterned to be formed only in the first subpixel is disposed between the first emission layer 213-1 and the hole transport layer 207, and a second auxiliary layer 214-2 patterned to be formed only in the second subpixel is disposed between the second emission layer 213-2 and the hole transport layer 207. A layer for improving third colored light efficiency is formed on the hole transport layer 207.

On the emission layer, an electron transport layer 215, an electron injecting layer 217, and a second electrode 219, each being a common layer are disposed sequentially.

The layer for improving third colored light efficiency 114-3 of the organic light emitting diode 100 of FIG. 1 is patterned to be formed only in the third subpixel, but the layer for improving third colored light efficiency 214-3 of the organic light emitting diode 100 of FIG. 2 is formed as a common layer.

Descriptions of the substrate 201, the first electrode 203, the pixel defining layer 205, the hole transport layer 207, the first auxiliary layer 214-1, the first emission layer 213-1, the second auxiliary layer 214-2, the second emission layer 213-2, the third emission layer 213-3, the electron transport layer 215, the electron injecting layer 217, and the second electrode 219, $D_1$, $D_2$, $D_3$, $L_1$, $L_2$ and $L_3$ of the organic light emitting diode 200 of FIG. 2 have already been given above in the descriptions of the substrate 101, the first electrode 103, the pixel defining layer 105, the hole transport layer 107, the first auxiliary layer 114-1, the first emission layer 113-1, the second auxiliary layer 114-2, the second emission layer 113-2, the third emission layer 113-3, the electron transport layer 215, the electron injecting layer 117, and the second electrode 119, $D_1$, $D_2$, $D_3$, $L_1$, $L_2$ and $L_3$.

The layer for improving third colored light efficiency 214-3 of the organic light emitting diode 200 of FIG. 2 is a common layer formed on all of the first subpixel, the second subpixel, and the third subpixel. The layer for improving third colored light efficiency 214-3 may include a carbazole-based compound represented by Formula 1. A description of Formula 1 has already been given above.

The organic light emitting diode 100 and 200 simultaneously includes the layer for improving third colored light efficiency 114-3 and 214-3 including a carbazole-based compound represented by Formula 1 and the electron transport layer 115 and 215 including an electron transport material represented by one of Formulas 10A, 10B, 10C, and 20 A. Accordingly, light emitting efficiency and lifespan of the third colored light being emitted from the third emission layer 113-1 and 213-1 may improve.

The organic light emitting diode has been described with reference to the organic light emitting diode 100 of FIG. 1 and the organic light emitting diode 200 of FIG. 2, but the present invention is not limited thereto. For example, the electron transport layer 117 and 217 may be omitted as necessary and the hole transport layer may be further added between the hole transport layer 107 and 207 and the first electrode 103 and 203.

The organic light emitting diode 100 and 200 may be included in a flat display diode including a thin film transistor (TFT). The TFT may include a gate electrode, and source and drain electrodes, and a gate barrier and active layer and one of the source and drain electrodes may electrically contact the first electrode of the organic light emitting diode. The active layer may include silicon, amorphous silicon, organic semiconductor, oxide semiconductor and the like, but are not limited thereto.

Hereinafter, the organic light emitting diode, according to an embodiment of the present invention, will be described in greater detail with reference to Examples.

EXAMPLES

Example 1

As an anode, an ITO glass substrate (50×50×0.7 mm, 15 $\Omega/cm^2$, 1200 Å, available from SAMSUNG-Corning) for an OLED was ultrasonically washed for 5 minutes using distilled water and then using isopropanol, followed by UV ozone cleaning for about 30 minutes and the glass substrate was deposited on a vacuum deposition device.

A hole transport layer having a thickness of 1150 Å was formed by vacuum depositing an NPB and a Compound 700 on the ITO, and depositing Compound 1 on the hole transport layer to form a layer for improving blue light efficiency having a thickness of 50 Å.

On the layer for improving the blue light efficiency, 9,10-di-naphthalene-2-yl-anthracene (AND, host) and DPAVBi (dopant) were vacuum co-deposited in a weight ratio of 98:2 to form a blue light emission layer having a thickness of 300 Å.

Thereafter, Compound 200 and lithium quinolate were vacuum deposited on the emission layer to form an electron transport layer having a thickness of 360 Å, LiF was deposited on the electron transport layer to form an electron injecting layer having a thickness of 10 Å, and Al was deposited on the electron injecting layer to form a second electrode (cathode) having a thickness of 3000 Å, to manufacture an organic light emitting diode.

Comparative Example 1

An organic light emitting diode was manufactured in the same manner as in Example 1, except that $Alq_3$, instead of Compound 200 and Liq, was used to form the electron transport layer.

Comparative Example 2

An organic light emitting diode was manufactured in the same manner as in Example 1, except that a layer for improving blue light was not formed and a thickness of the hole transport layer was changed to a thickness of 1200 Å.

TABLE 1

|  | Example 1 | Comparative Example 1 | Comparative Example 2 |
|---|---|---|---|
| Cathode | Al | Al | Al |
| Electron injecting layer | LiF (15Å) | LiF (15Å) | LiF (15Å) |
| electron transport layer | Compound 200:Liq (360Å) | $Alq_3$ (360Å) | Compound 200:Liq (360Å) |
| Blue light emission layer | ADN:DPAVBi (200Å) | ADN:DPAVBi (200Å) | ADN:DPAVBi (200Å) |
| layer for improving blue light efficiency | Compound 1 (50Å) | Compound 1 (50Å) | — |

TABLE 1-continued
|  | Example 1 | Comparative Example 1 | Comparative Example 2 |
|---|---|---|---|
| hole transport layer | NPB:Compound 700 (1150Å) | NPB:Compound 700 (1150Å) | NPB:Compound 700 (1200Å) |
| Anode | ITO | ITO | ITO |
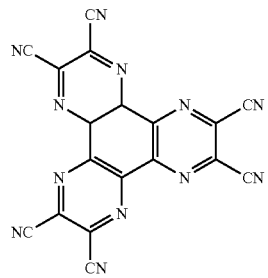
<Compound 700>
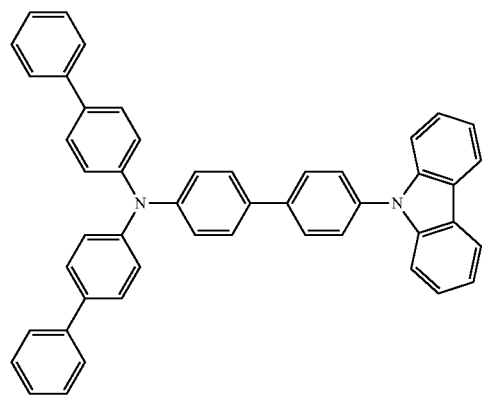
<Compound 1>
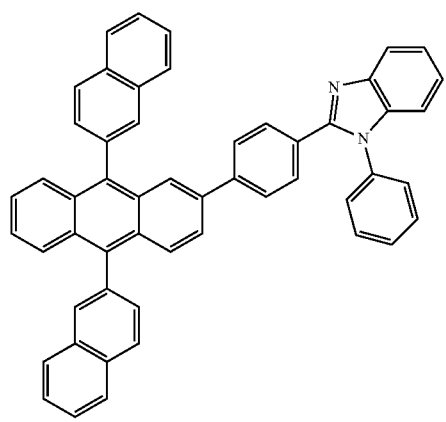
<Compound 200>

Evaluation Example 1

Driving voltage, efficiency, color coordinates and luminance of the organic light emitting diode of Example 1, Comparative Example 1 and 2 were evaluated using an IVL measuring diode (PhotoResearch PR650, Keithley 238). The results are shown in Table 2 below.

TABLE 2

|  | Driving voltage (V) | Luminance (cd/A) | CIE_x | CIE_y |
| --- | --- | --- | --- | --- |
| Example 1 | 4.2 | 5.0 | 0.141 | 0.048 |
| Comparative Example 1 | 4.5 | 5.0 | 0.141 | 0.050 |
| Comparative Example 2 | 4.2 | 4.23 | 0.141 | 0.050 |

According to Table 2, an organic light emitting diode of Example 1 has a comparatively lower driving voltage than an organic light emitting diode of Comparative Examples 1 and 2, and higher luminance and excellent color purities.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting diode comprising a substrate comprising:
   a first subpixel, a second subpixel, and a third subpixel;
   a plurality of first electrodes disposed in the first subpixel, the second subpixel, and the third subpixel;
   a second electrodes disposed opposite to the first electrodes;
   an emission layer disposed between the first electrodes and the second electrode and comprising a first emission layer, a second emission layer and a third emission layer;
   the first emission layer is disposed between the first electrode in the first subpixel and the second electrode and emits a first colored light;
   the second emission layer is disposed between the first electrode in the second subpixel and the second electrode and emits a second colored light;
   the third emission layer is disposed between the first electrode in the third subpixel and the second electrode and emits a third colored light;
   a hole transport layer disposed between the first electrode and the emission layer;
   an electron transport layer disposed between the emission layer and the second electrode; and
   a layer for improving third colored light efficiency disposed between the third emission layer and the hole transport layer;
   wherein, the first colored light is a red light, the second colored light is a green light, and the third colored light is a blue light,
   wherein the layer for improving third colored light efficiency comprises a carbazole-based compound represented by Formula 1 below;
   wherein, the electron transport layer comprises an electron transport material represented by one of Formulas 10A, 10B, 10C, and 20A:

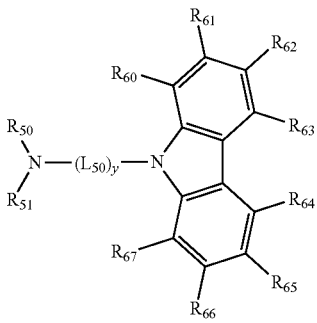
<Formula 1>

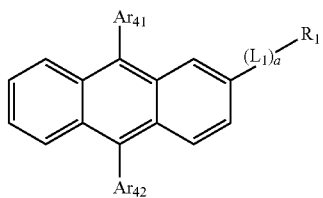
<Formula 10A>

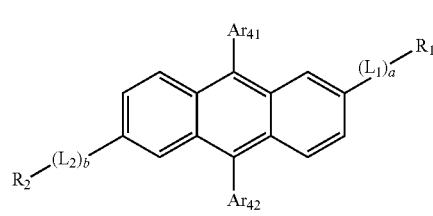
<Formula 10B>

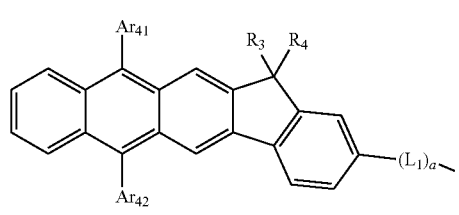
<Formula 10C>

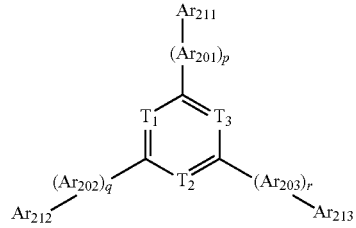
<Formula 20A> wherein, in Formula 1,
$L_{50}$ is a substituted or unsubstituted $C_6$-$C_{60}$ arylene group or a substituted or unsubstituted $C_2$-$C_{60}$ heteroarylene group;
y is an integer of 1 to 5;
$R_{50}$ and $R_{51}$ are each independently, a substituted or unsubstituted $C_6$-$C_{60}$ aryl group, or a substituted or unsubstituted $C_2$-$C_{60}$ heteroaryl group;
$R_{60}$ to $R_{67}$ are each independently, a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group;

in Formulae 10A to 10C, $Ar_{41}$ and $Ar_{42}$ are each independently, a substituted or unsubstituted $C_6$-$C_{60}$ aryl group or a substituted or unsubstituted $C_2$-$C_{60}$ heteroaryl group;

$L_1$ and $L_2$ are each independently, a substituted or unsubstituted $C_6$-$C_{60}$ arylene group or a substituted or unsubstituted $C_2$-$C_{60}$ heteroarylene group;

a and b are each independently, 0, 1 or 2;

$R_1$ and $R_2$ are each independently, a substituted or unsubstituted benzimidazolyl group, a substituted or unsubstituted benzoxazolyl group, a substituted or unsubstituted benzothiazolyl group, a substituted or unsubstituted benzopyrimidinyl group, a substituted or unsubstituted imidazopyridinyl group, a substituted or unsubstituted quinolinyl group, a substituted or unsubstituted isoquinolinyl group, a substituted or unsubstituted quinazolyl group, a substituted or unsubstituted pyridinyl group, a substituted or unsubstituted pyrimidinyl group, a substituted or unsubstituted pyrazinyl group, a substituted or unsubstituted phenyl group, a substituted or unsubstituted naphthyl group, a substituted or unsubstituted pyrenyl group, a substituted or unsubstituted chrysenyl group, a substituted or unsubstituted fluorenyl group or a substituted or unsubstituted phenanthrenyl group;

$R_3$ and $R_4$ are each independently, a $C_1$-$C_{20}$ alkyl group, a $C_6$-$C_{20}$ aryl group; a $C_1$-$C_{20}$ alkyl group, or a $C_2$-$C_{20}$ aryl group, each of which can be substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof, or a phosphoric acid group or a salt thereof; and wherein, in Formula 20A, $T_1$ to $T_3$ are each independently, an N or a $C(R_{100})$; wherein $R_{100}$ is a hydrogen atom; a deuterium atom; —F; —Cl; —Br; —I; —CN; a hydroxyl group; —NO$_2$; an amino group; an amidino group; a hydrazine group; a hydrazone; a carboxyl group or a salt thereof; a sulfonic acid group or a salt thereof; a phosphoric acid group or a salt thereof; a $C_1$-$C_{60}$ alkyl group; a $C_1$-$C_{60}$ alkoxy group; a $C_1$-$C_{60}$ alkyl group; a $C_1$-$C_{60}$ alkoxy group; each of which can be substituted with at least one of a deuterium atom, —F, —Cl, —Br, —I, —CN, a hydroxyl group, a nitro group, an amino group, an amidino group, a hydrazine group, a hydrazone, a carboxyl group or a salt thereof, a sulfonic acid group or a salt thereof, or a phosphoric acid group or a salt thereof;

$Ar_{201}$ to $Ar_{203}$ are each independently, a substituted or unsubstituted $C_6$-$C_{60}$ arylene group or a substituted or unsubstituted $C_2$-$C_{60}$ heteroarylene group;

p, q and r are each independently, 0, 1 or 2;

$Ar_{211}$ to $Ar_{213}$ are each independently, a substituted or unsubstituted $C_6$-$C_{60}$ aryl group or a substituted or unsubstituted $C_2$-$C_{60}$ heteroaryl group.

2. The organic light emitting diode of claim 1, wherein the layer for improving third colored light efficiency is disposed only in the third subpixel.

3. The organic light emitting diode of claim 1, wherein the layer for improving third colored light efficiency is a common layer disposed on all of the first subpixel, the second subpixel, and the third subpixel.

4. The organic light emitting diode of claim 1, wherein the hole transport layer contacts the layer for improving third colored light efficiency and the layer for improving third colored light efficiency contacts the third emission layer.

5. The organic light emitting diode of claim 1, wherein in Formula 1, $L_{50}$ is a phenylene group, a pentalenylene group, an indenylene group, a naphthylene group, an azulenylene group, a heptalenylene, acenaphthylene group, a fluolenylene group, a phenalenylene group, a phenanthrenyl group, an anthrylene group, a fluorantenylene group, a triphenylenylene group, a pyrenylene group, a chrysenylenylene group, a naphthasenylene group, a picenylene group, a perylenylene group and a pentacenylene group; each of which can be substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkinyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group or a $C_2$-$C_{60}$ heteroaryl group.

6. The organic light emitting diode of claim 1, wherein, in Formula 1, $R_{50}$ and $R_{51}$ are each independently a phenyl group, a naphthyl group, an anthryl group and a pyridyl group; each of which can be substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, phenyl group, a naphthyl group, an anthryl group or a pyridinyl group.

7. The organic light emitting diode of claim 1, wherein $R_{60}$ to $R_{67}$ are each independently, a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a phenyl group, a naphthyl group, an anthryl group and a pyridyl group; and wherein the phenyl group, naphthyl group, anthryl group and pyridinyl group can be substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group or a pyridinyl group.

8. The organic light emitting diode of claim 1, wherein the carbazole-based compound represented by Formula 1 is represented by one of Formulae 1A to 1N:

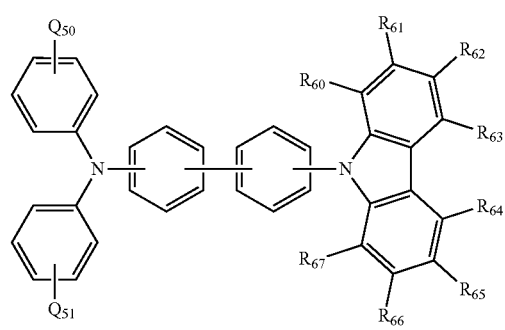
<Formula 1A>
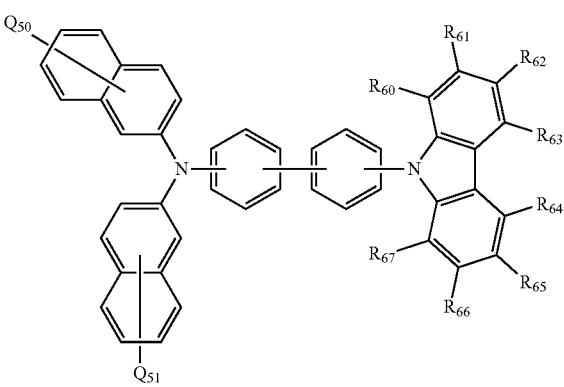
<Formula 1E>
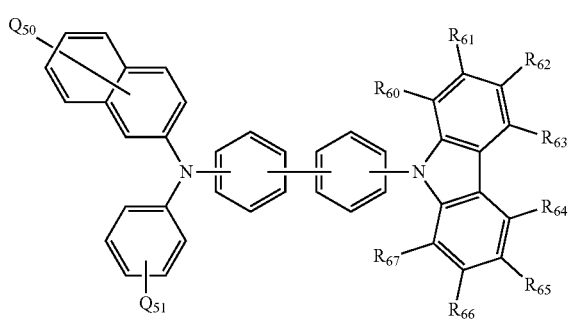
<Formula 1B>
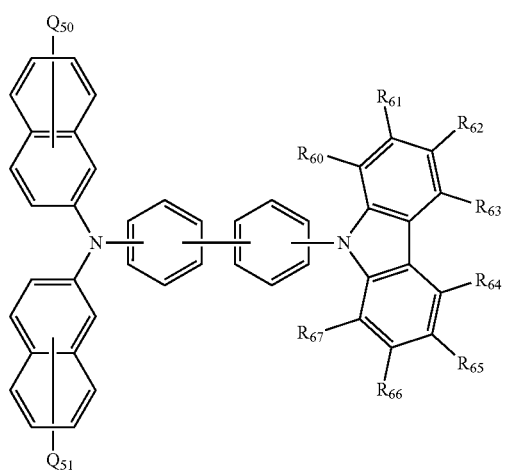
<Formula 1F>
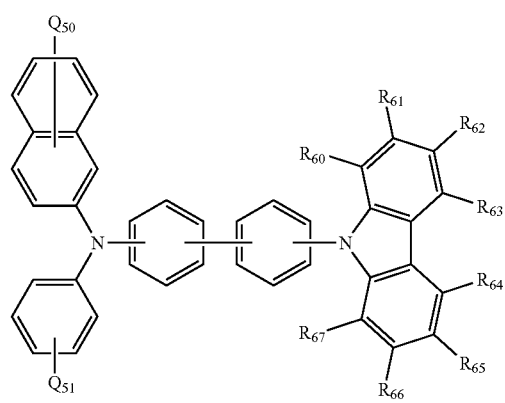
<Formula 1C>
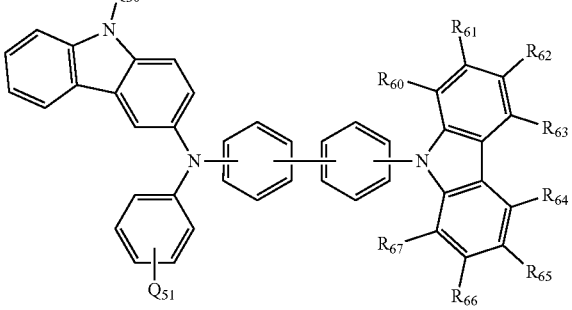
<Formula 1G>
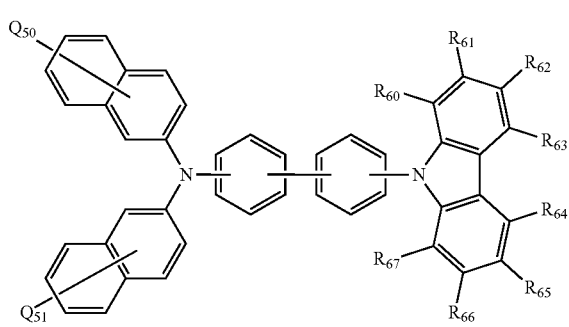
<Formula 1D>
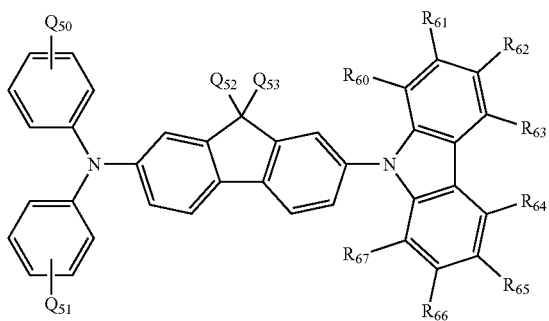
<Formula 1H>

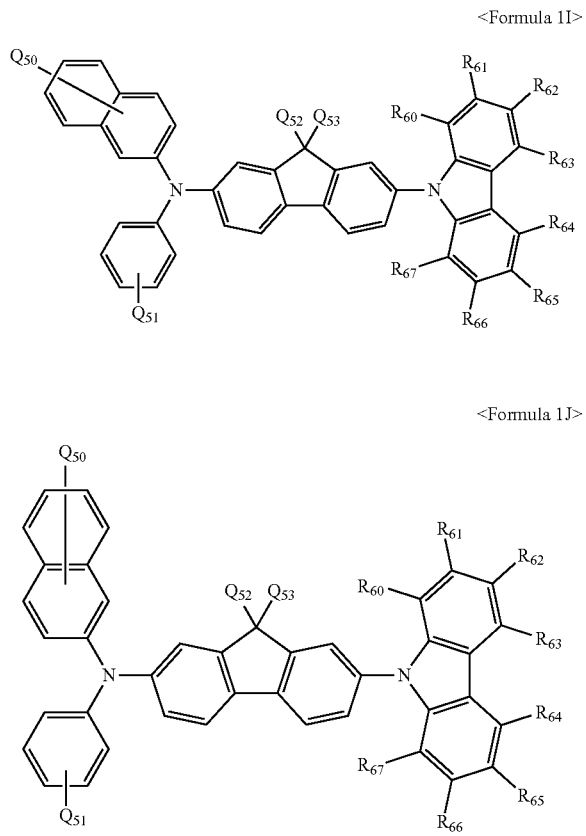

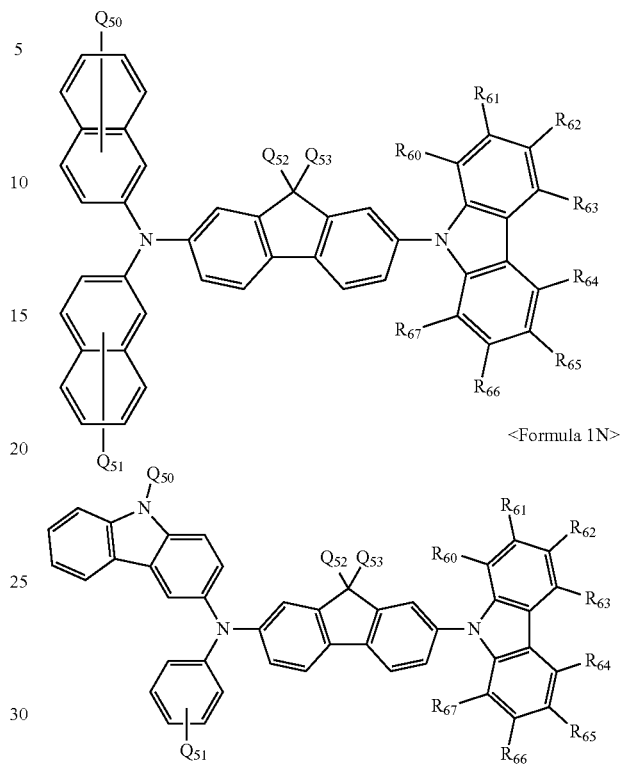

wherein, in Formula 1A to 1N, Q50 to Q53 and $R_{60}$ to $R_{67}$ are each independently selected from a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{10}$ alkyl group, a phenyl group, a naphthyl group, an anthryl group, a biphenyl group or a pyridyl group.

9. The organic light emitting diode of claim 1, wherein the carbazole-based compound represented by Formula 1 is Compound 1 below:

<Compound 1>

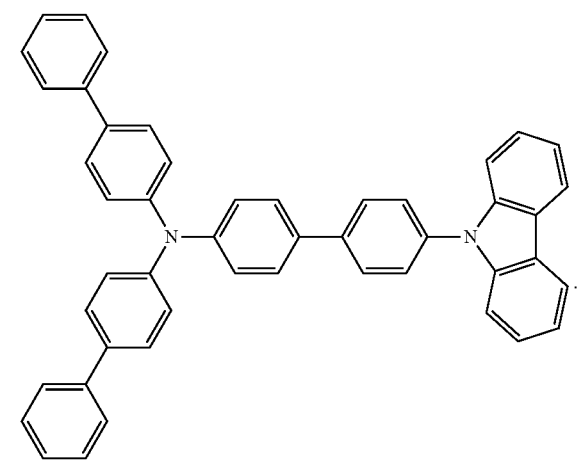

10. The organic light emitting diode of claim 1, wherein the hole transport layer further comprises a p-dopant.
11. The organic light emitting diode of claim 1, wherein the electron transport material comprises an anthracene compound represented by any one of Formulae 10A(1) to 10A(12), 10B(1) to 10B(12) or 10C(1) to 10C(6):
Formula 10A(1)
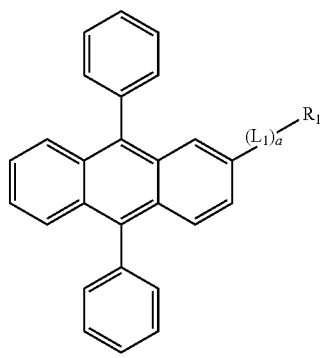
Formula 10A(2)
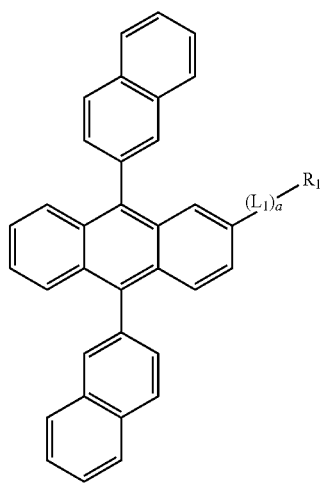
Formula 10A(3)
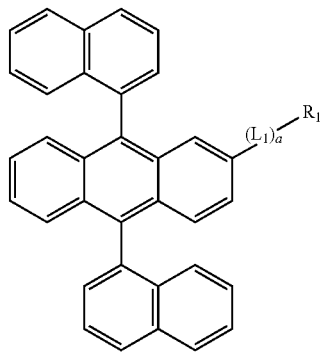
Formula 10A(4)
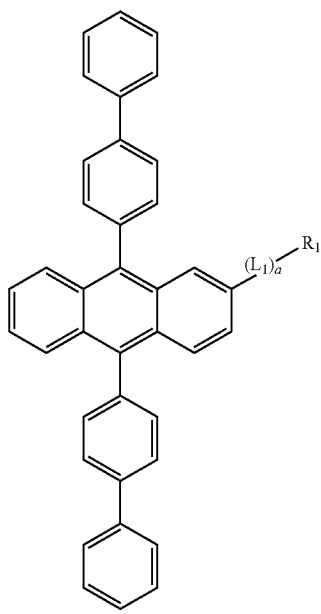
Formula 10A(5)
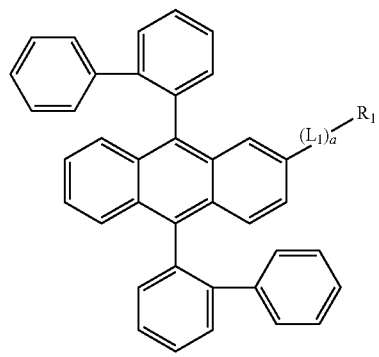
Formula 10A(6)
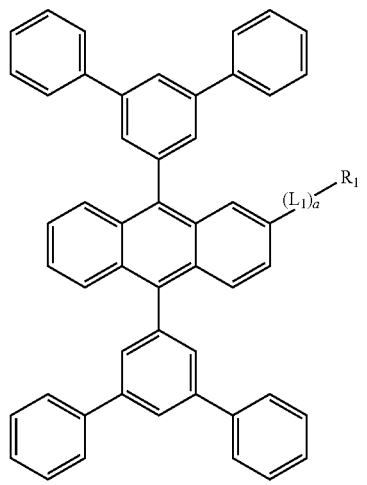

Formula 10A(7)
Formula 10A(8)
Formula 10A(9)
Formula 10A(10)
Formula 10A(11)
Formula 10A(12)
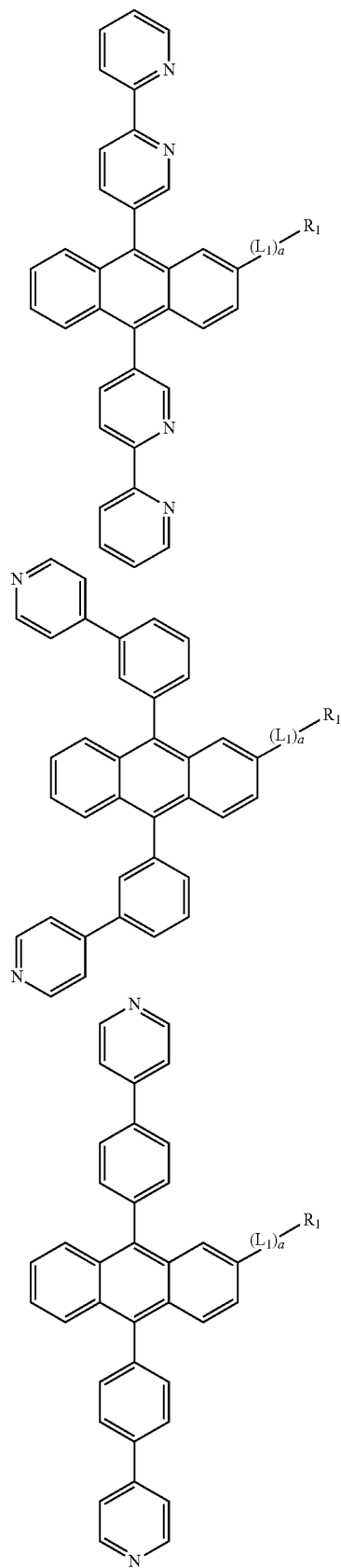
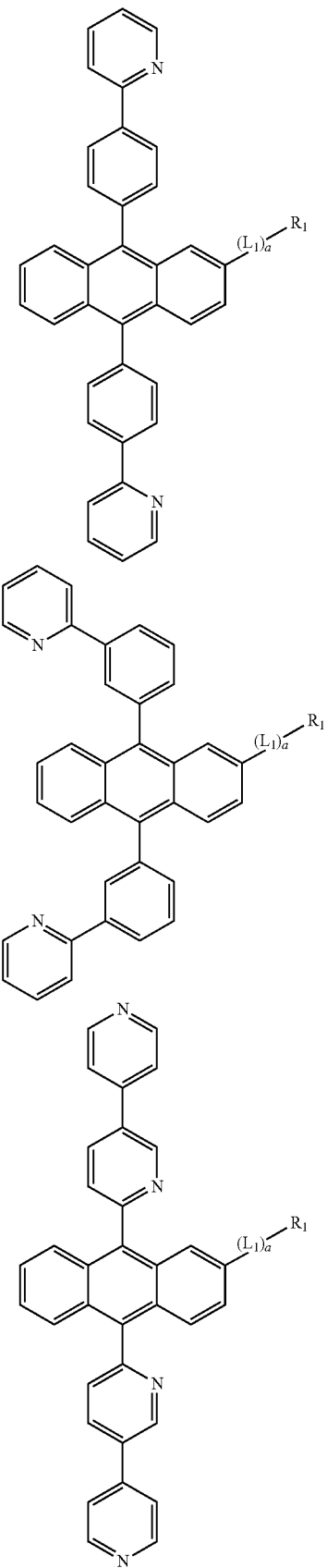

-continued
Formula 10B(1)
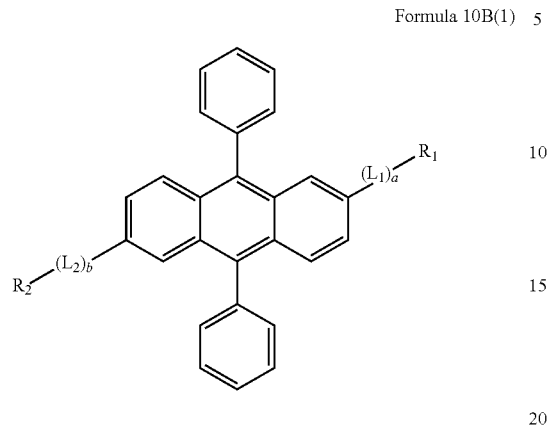
Formula 10B(2)
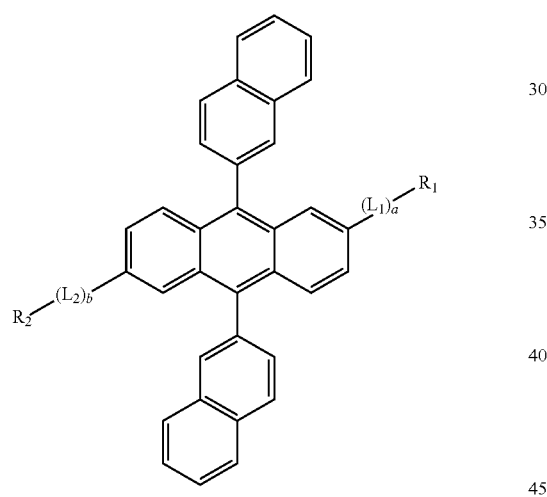
Formula 10B(3)
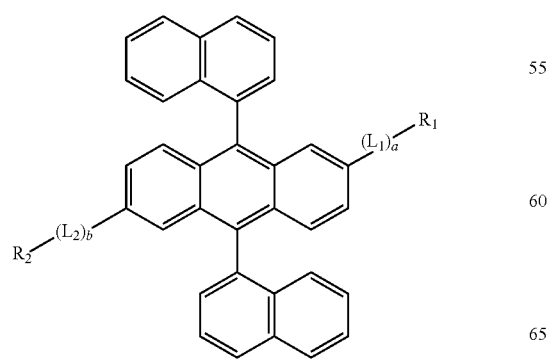
-continued
Formula 10B(4)
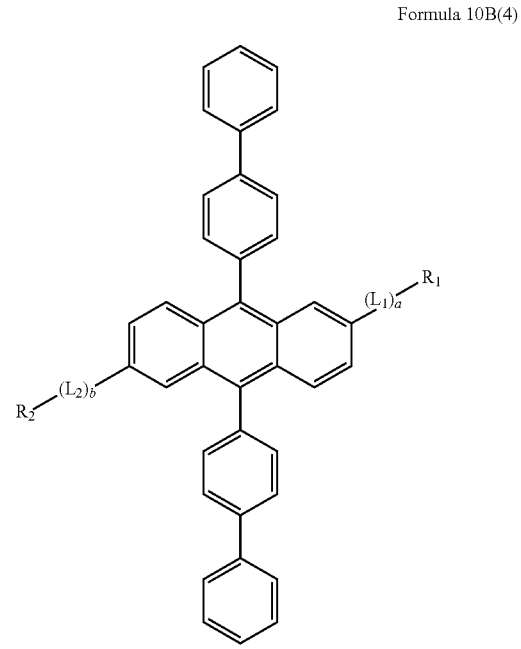
Formula 10B(5)
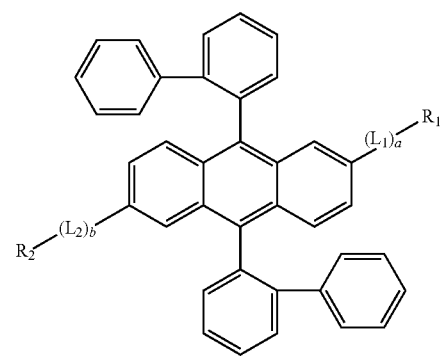
Formula 10B(6)
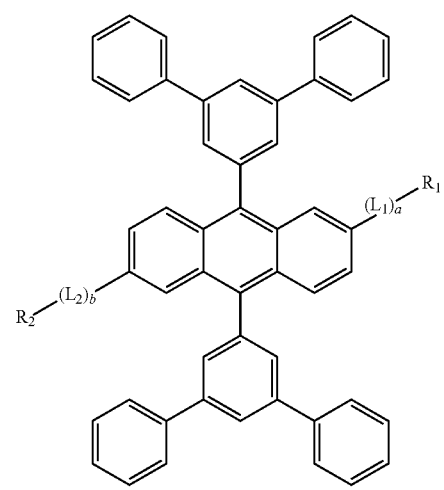

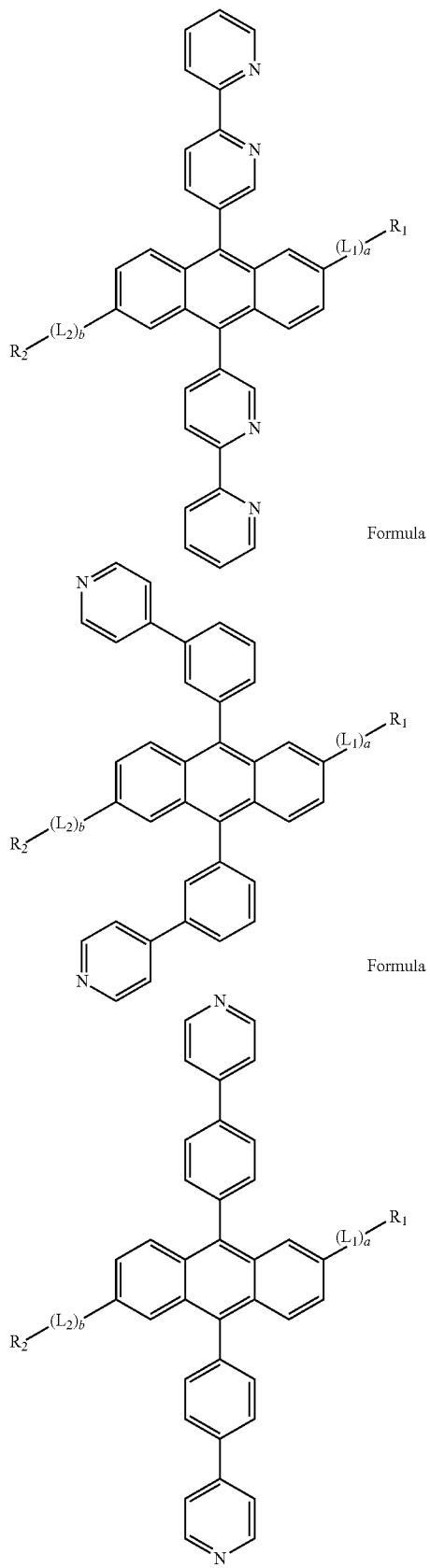
Formula 10B(7)
Formula 10B(8)
Formula 10B(9)
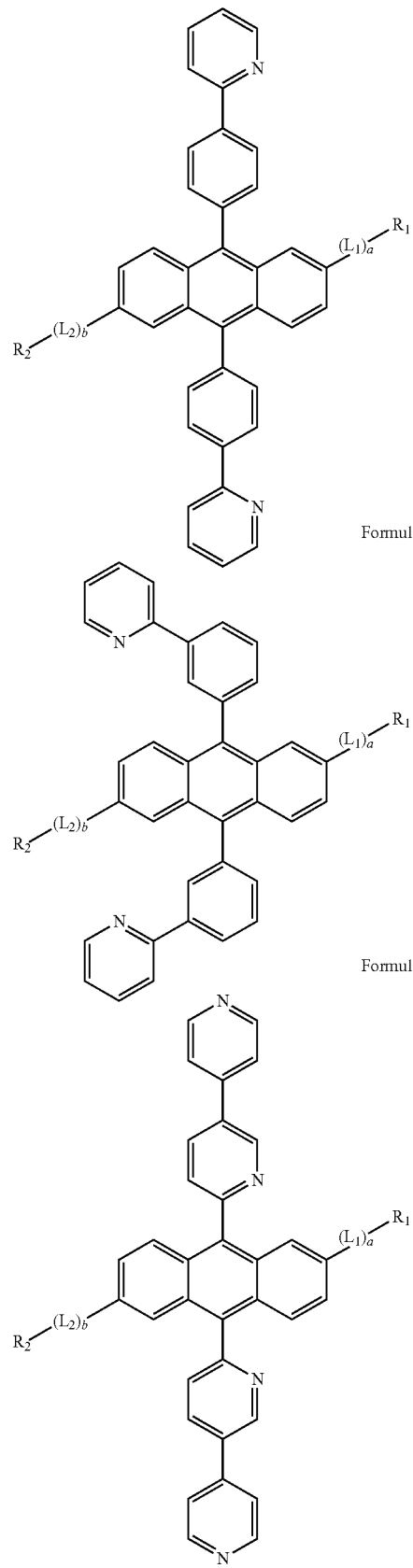
Formula 10B(10)
Formula 10B(11)
Formula 10B(12)

Formula 10C(1)
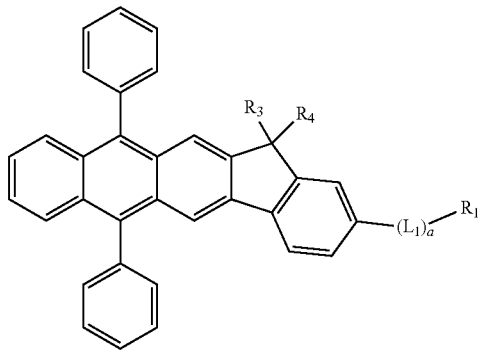
Formula 10C(2)
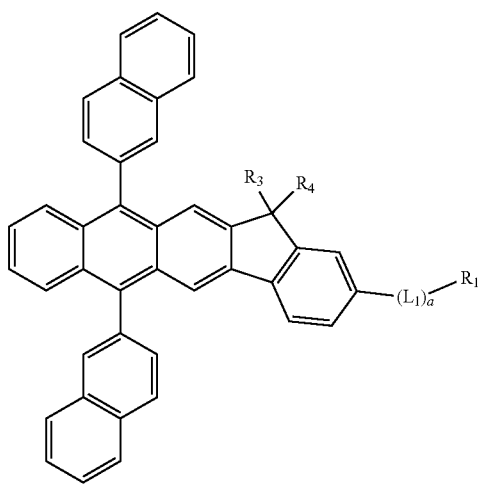
Formula 10C(3)
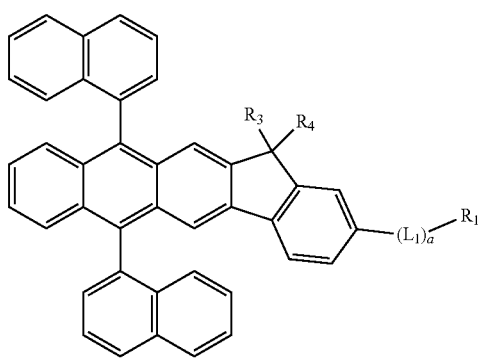
Formula 10C(4)
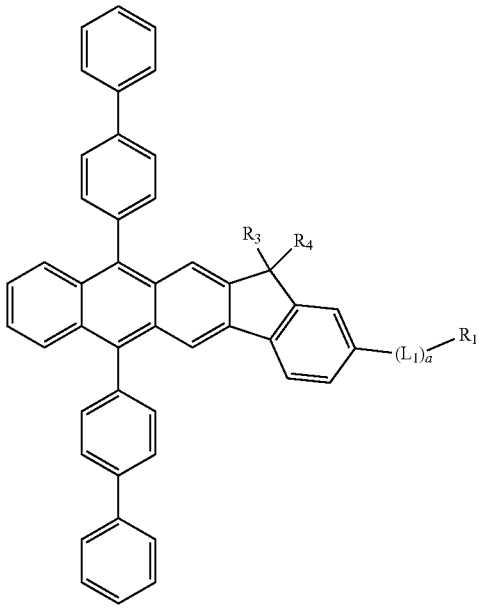
Formula 10C(5)
Formula 10C(6)
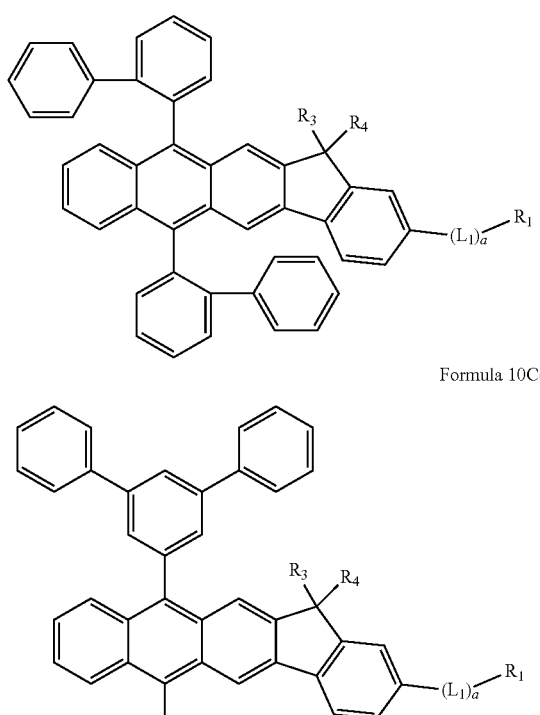
wherein, $L_1$, $L_2$, a, b, $R_1$ to $R_4$ of Formula 10A(1) to 10A(12), 10B(1) to 10B(12) and 10C(1) to 10C(6) are the same as in claim 1.
12. The organic light emitting diode of claim 1, wherein the electron transport material comprises one of Compounds 200 to 210 and Compounds 600 to 605 below:

<Compound 200>
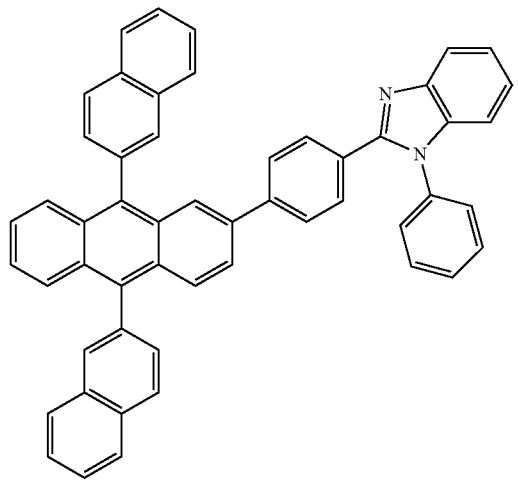
<Compound 201>
<Compound 203>
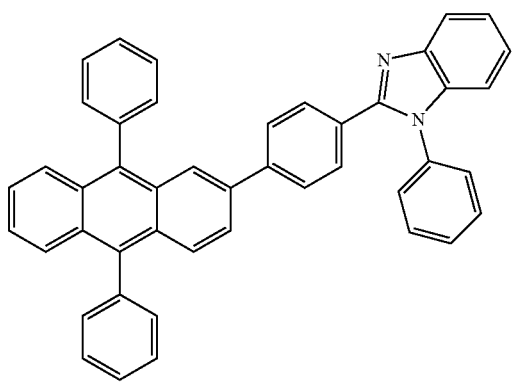
<Compound 204>
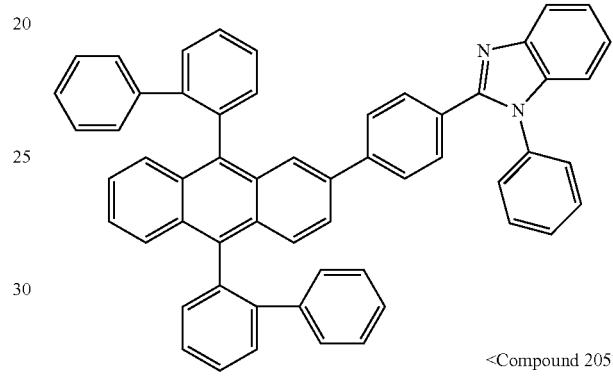
<Compound 205>
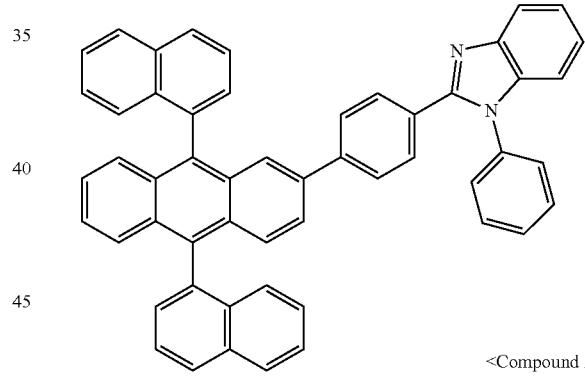
<Compound 202>
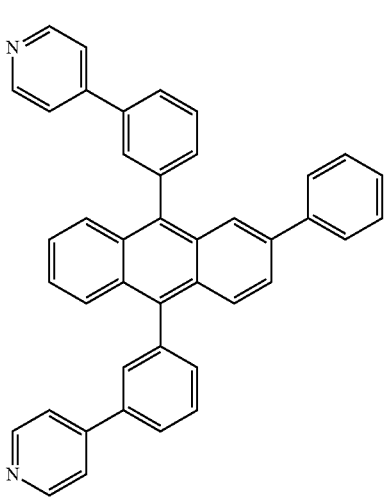
<Compound 206>
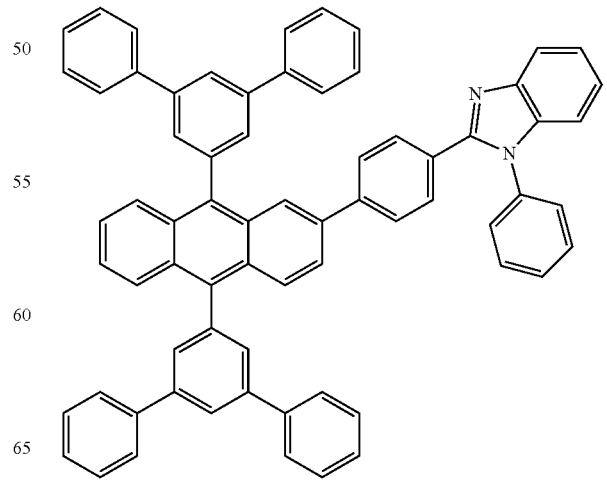

-continued
<Compound 207>
<Compound 208>
<Compound 209>
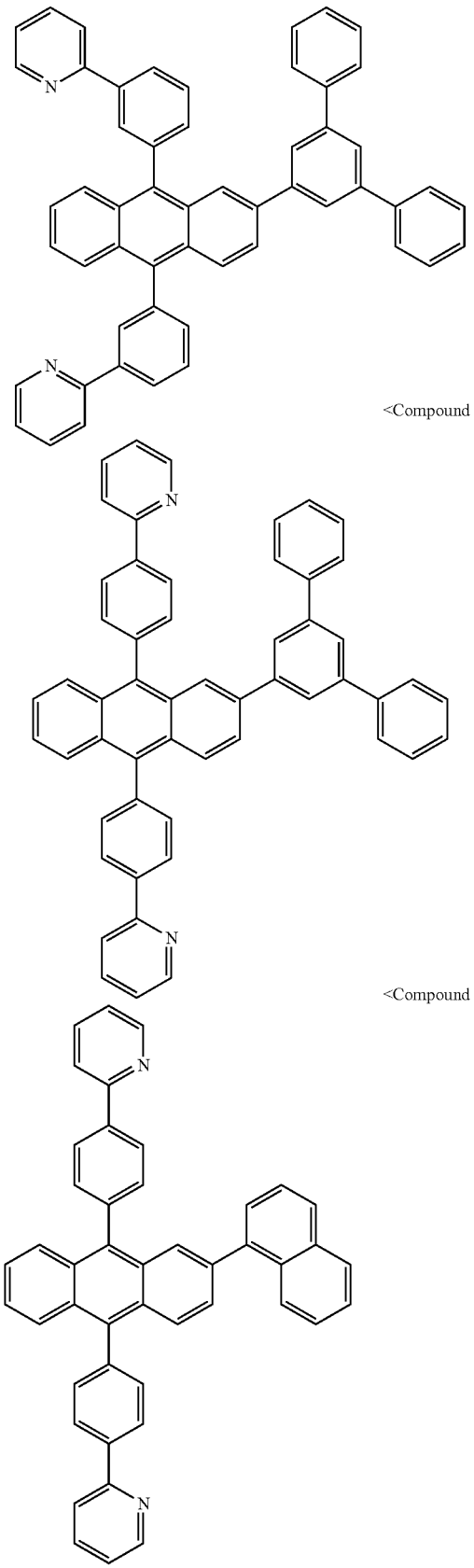
<Compound 210>
<Compound 600>
<Compound 601>
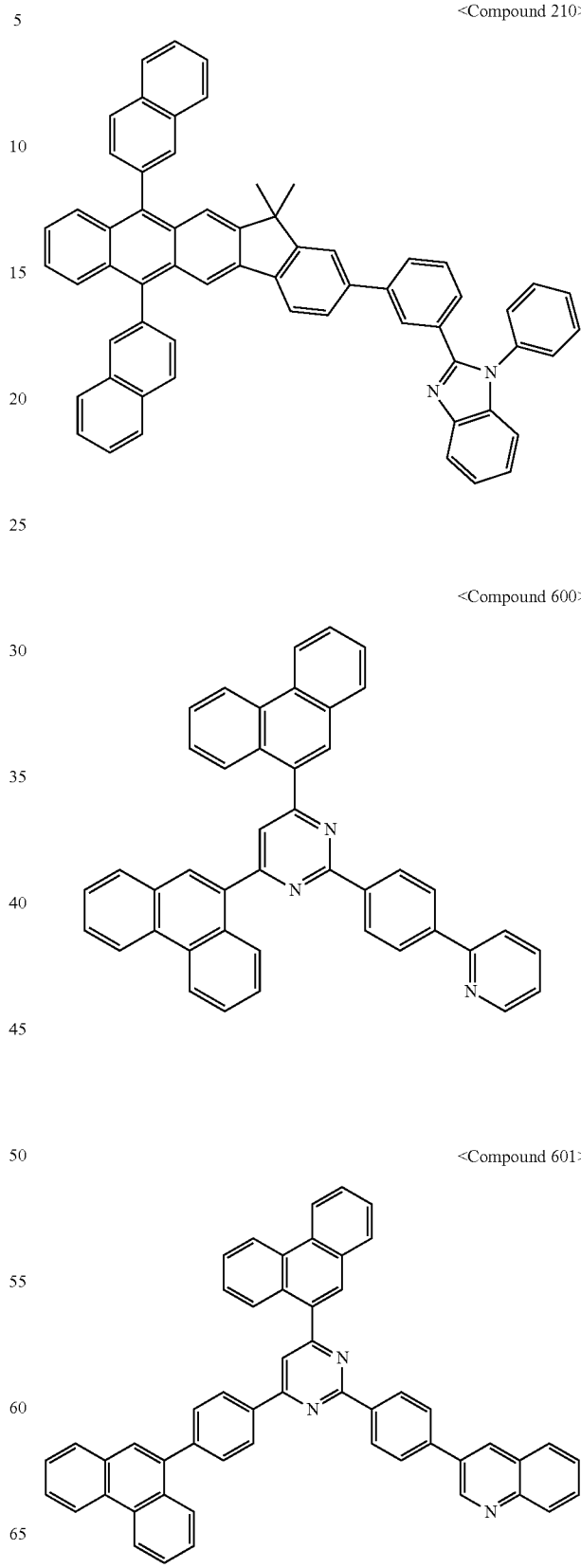

<Compound 602>
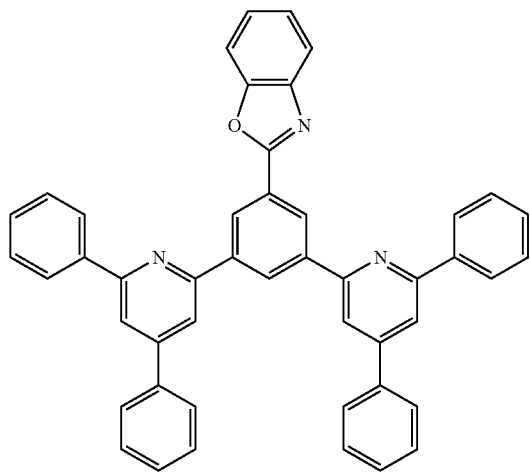
<Compound 605>
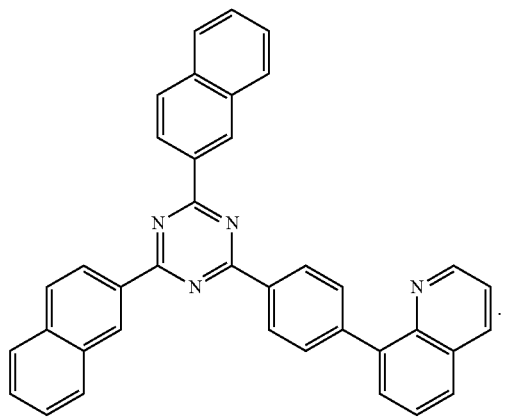
<Compound 603>
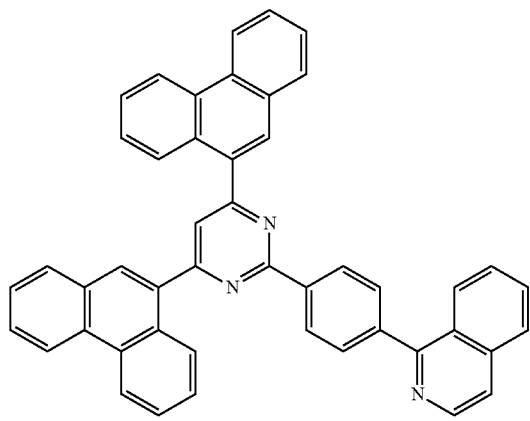
13. The organic light emitting diode of claim 1, wherein the carbazole-based compound is represented by one of Formulae 1A to 1N,
the electron transport material comprises one of Compounds 200 to 210 and Compounds 600 to 605:
<Formula 1A>
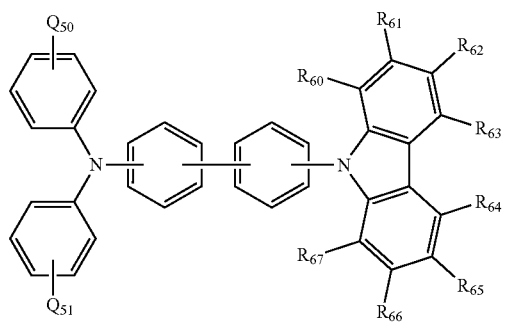
<Compound 604>
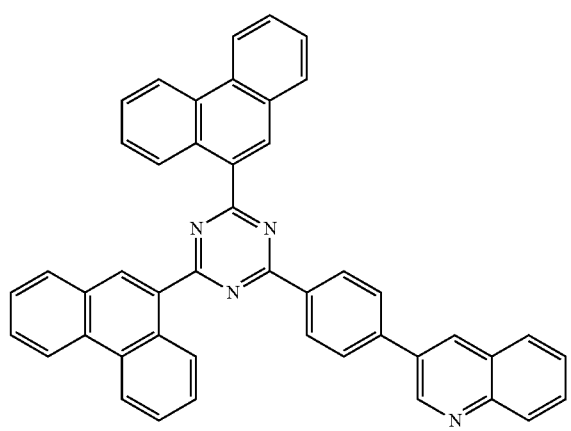
<Formula 1B>
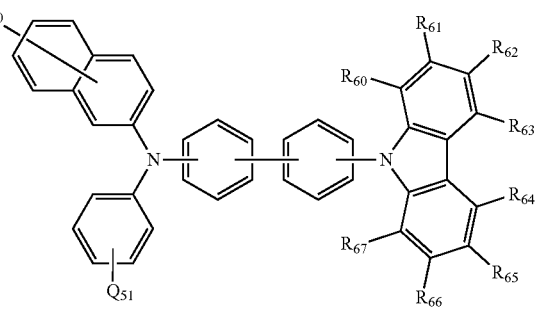

<Formula 1C>
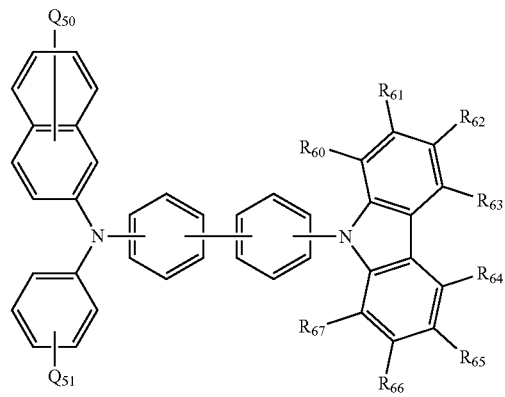
<Formula 1D>
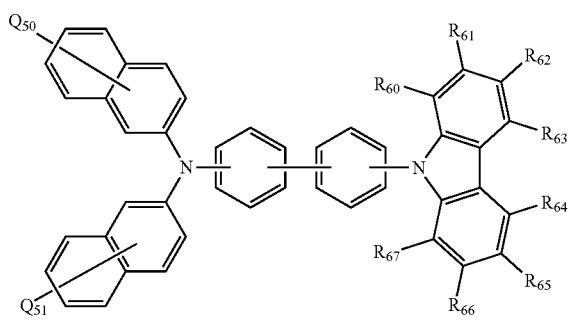
<Formula 1E>
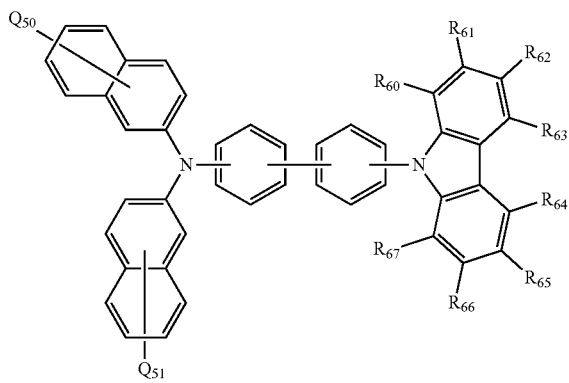
<Formula 1F>
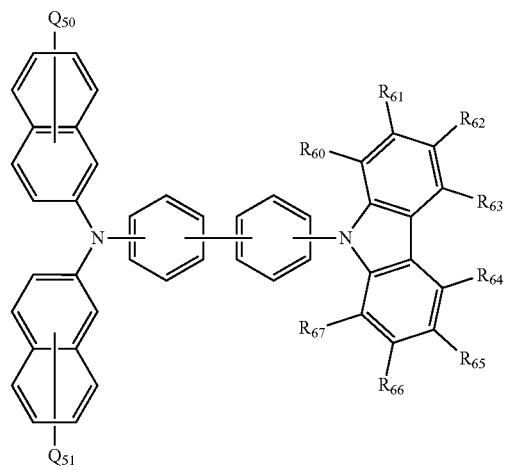
<Formula 1G>
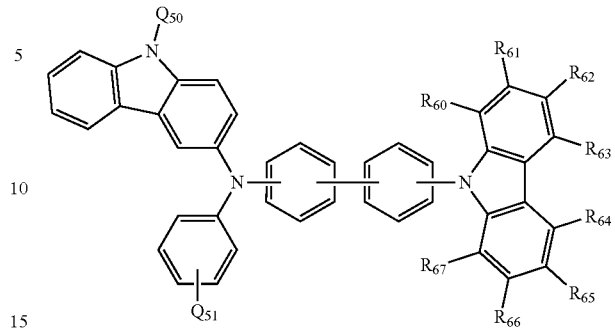
<Formula 1H>
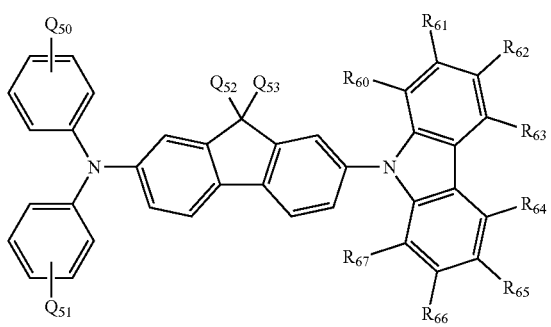
<Formula 1I>
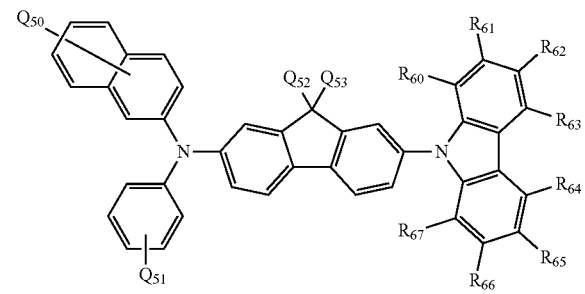
<Formula 1J>
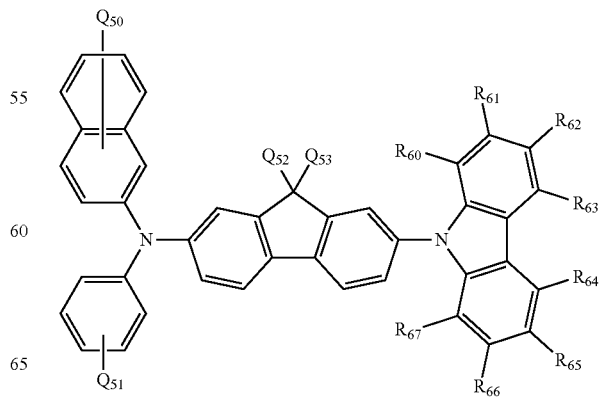

-continued

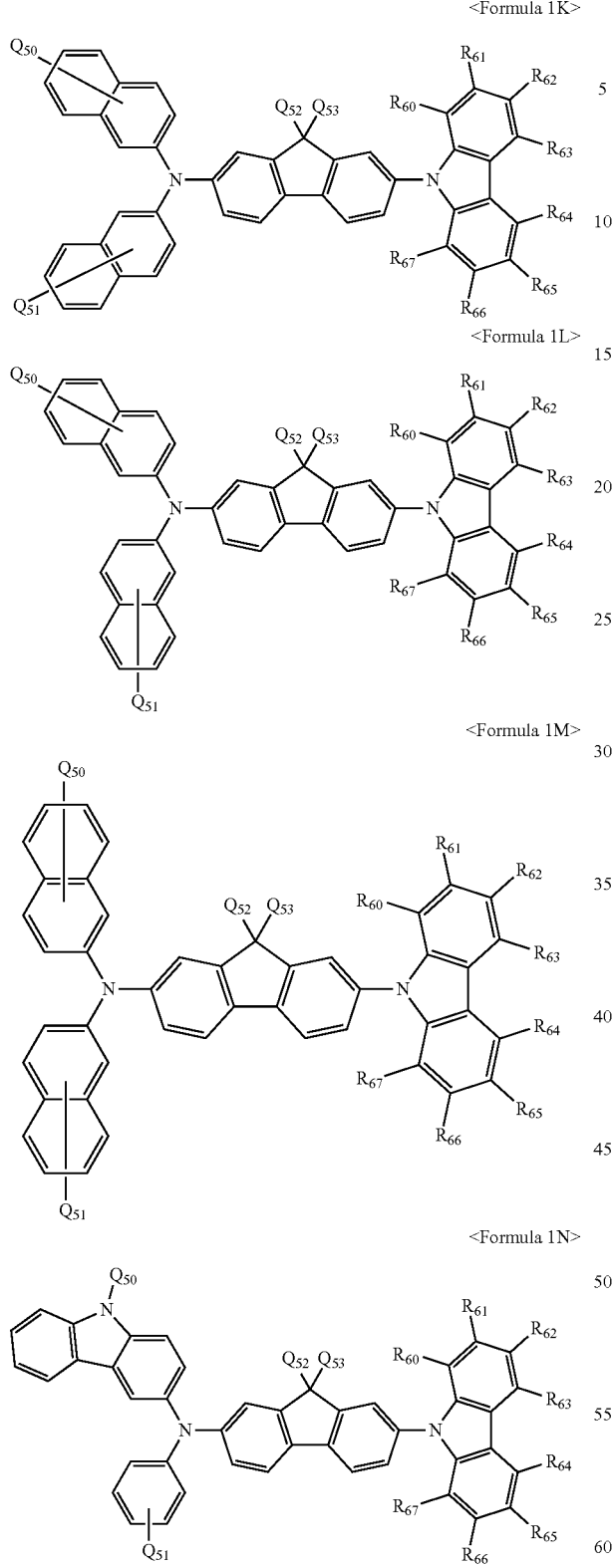

<Formula 1K>
<Formula 1L>
<Formula 1M>
<Formula 1N> wherein, in Formula 1A to 1N, $Q_{50}$ to $Q_{53}$ and $R_{60}$ to $R_{67}$ are each independently a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a $C_1$-$C_{10}$alkyl group, a phenyl group, a naphthyl group, an anthryl group, a biphenyl group or a pyridyl group <Compound 200>

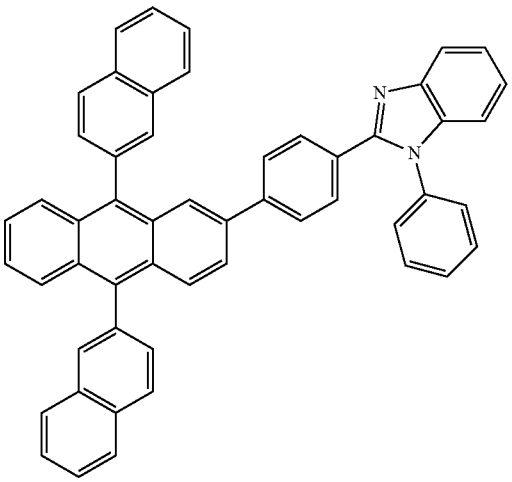

<Compound 201>

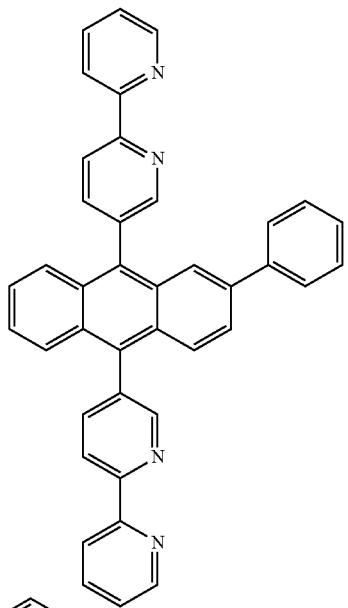

<Compound 202>

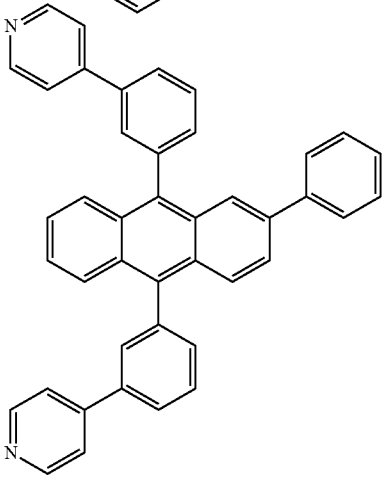

<Compound 203>
<Compound 204>
<Compound 205>
<Compound 206>
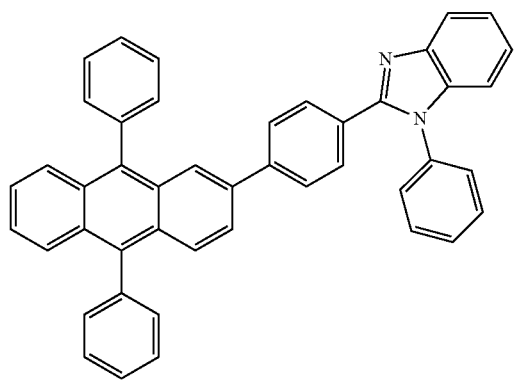
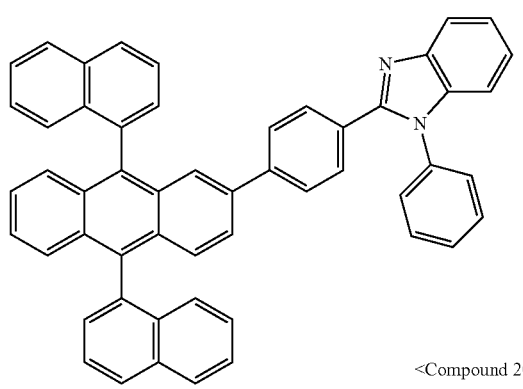
<Compound 207>
<Compound 208>
<Compound 209>
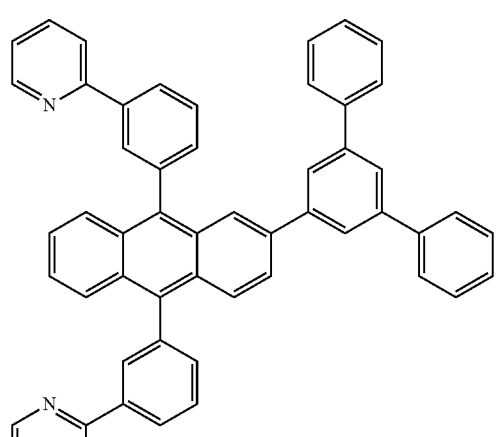
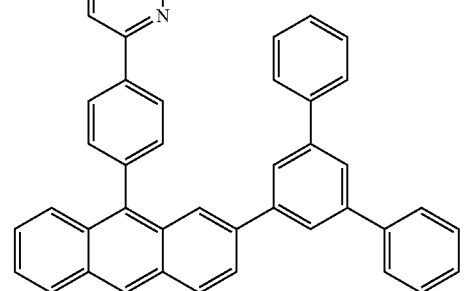

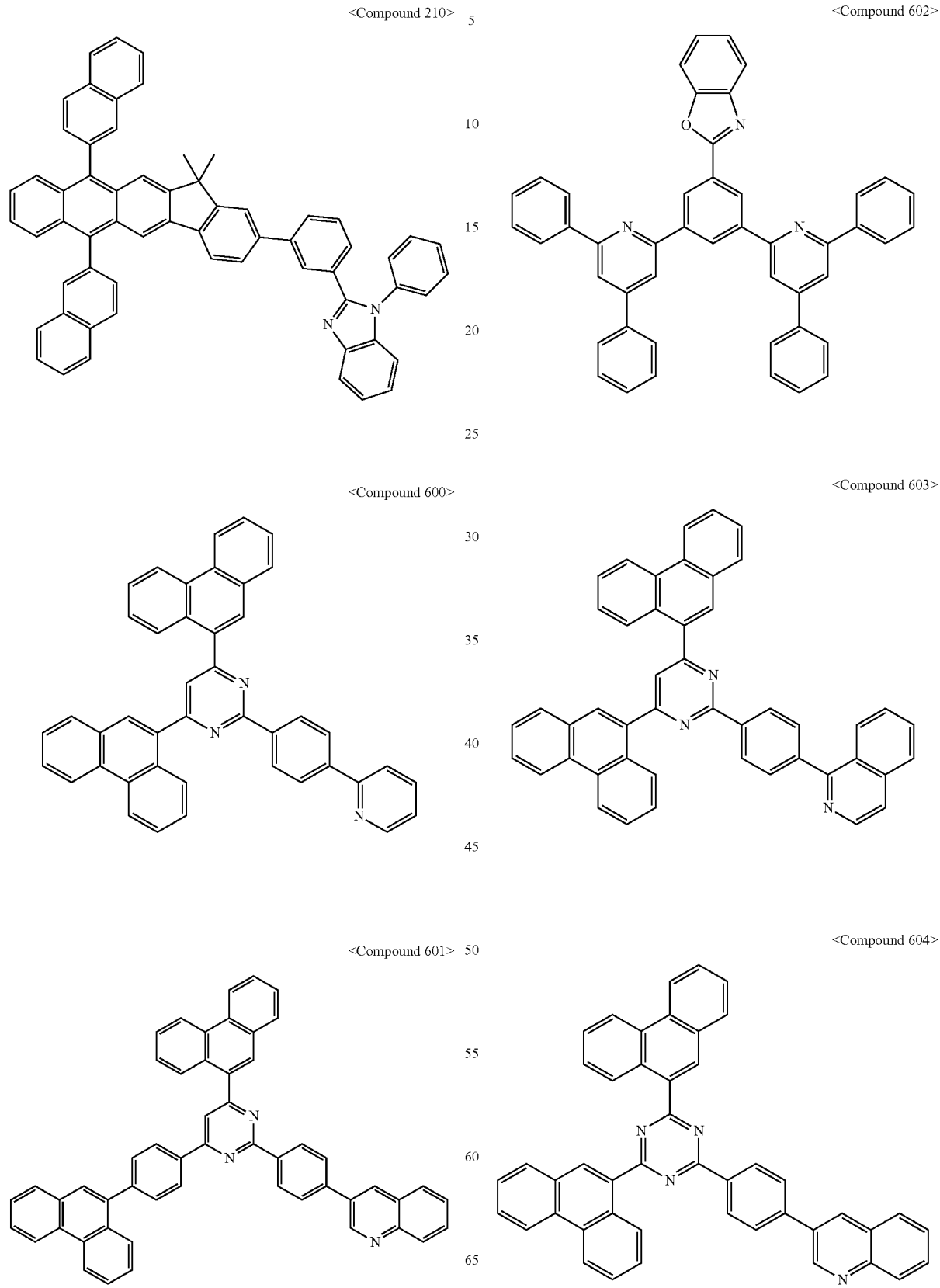

<Compound 605>

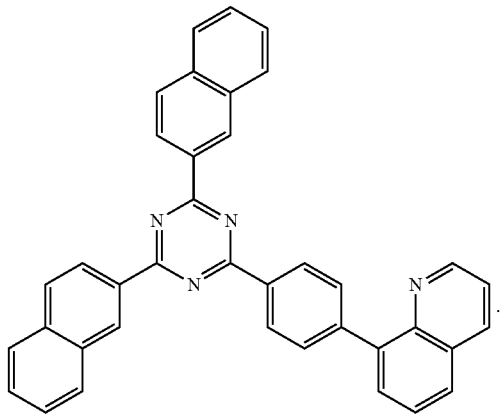

14. The organic light emitting diode of claim 1, wherein the electron transport layer further comprises a lithium complex.

15. The organic light emitting diode of claim 1, wherein the electron transport layer further comprises a lithium quinolate.

16. The organic light emitting diode of claim 1, wherein the electron transport material comprises a compound represented by Formula 20A, wherein in Formula 20A, $T_1$ to $T_3$ are all N; $T_1$ is $C(R_{100})$, $T_2$ and $T_3$ are N; and $T_1$ to $T_3$ are all $C(R_{100})$.

17. The organic light emitting diode of claim 16, wherein, in Formula 20A, $Ar_{201}$ to $Ar_{203}$ are each independently
a phenylene group, a naphthylene group, an anthrylene group, a pyrenylene group, a fluolenylene group, a pyridinylene group, a pyrazinylene group and a pyrimidinyl group; each of which can be substituted with at least one of a phenyl group, a naphthyl group, an anthryl group, a pyrenyl group, a fluorenyl group, a pyridinyl group, a pyrazinyl group or a pyrimidinyl group.

18. The organic light emitting diode of claim 1, wherein the hole transport layer comprises at least one hole transporting material represented by Formula 300 and a second hole transporting material represented by Formula 301:

<Formula 300>

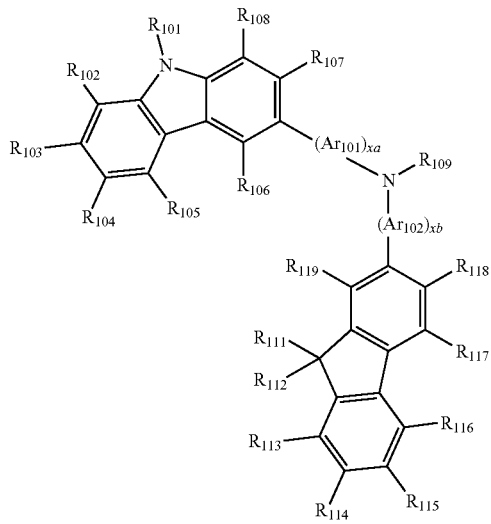

<Formula 301>

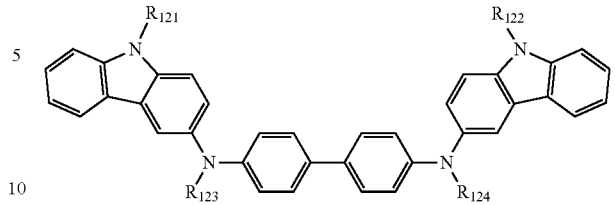

wherein, in Formulae 300 and 301,
$Ar_{101}$ and $Ar_{102}$ are each independently, a substituted or unsubstituted $C_6$-$C_{60}$ arylene group;
xa and xb are each independently an integer of 0 to 5;
$R_{101}$ to $R_{108}$, $R_{111}$ to $R_{119}$ and $R_{121}$ to $R_{124}$ are each independently, a hydrogen atom, a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, or a substituted or unsubstituted $C_6$-$C_{60}$ arylthio group; and
$R_{109}$ is a phenyl group, a naphthyl group, an anthryl group, a biphenyl group or a pyridyl group; each of which can be substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

19. The organic light emitting diode of claim 18, wherein in $Ar_{101}$ and $Ar_{102}$ are each independently,
a phenylene group, a pentalenylene group, an indenylene group, a naphthylene group, an azulenylene group, a heptalenylene, acenaphthylene group, a fluolenylene group, a phenalenylene group, a phenanthrenyl group, an anthrylene group, a fluorantenylene group, a triphenylenylene group, a pyrenylene group, a chrysenylenylene group, a naphthasenylene group, a picenylene group, a perylenylene group or a pentacenylene group; each of which can be substituted with at least one of a deuterium atom, a halogen atom, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, $C_1$-$C_{60}$ alkyl group, a $C_2$-$C_{60}$ alkenyl group, a $C_2$-$C_{60}$ alkinyl group, a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group or a $C_2$-$C_{60}$ heteroaryl group.

20. The organic light emitting diode of claim 18, wherein in Formula 300, xa is 1 and xb is 0.

* * * * *